United States Patent [19]

Kitano et al.

[11] Patent Number: 5,404,180
[45] Date of Patent: Apr. 4, 1995

[54] WAVEFORM SHAPING METHOD, WAVEFORM SHAPING APPARATUS AND APPARATUS FOR CORRECTING CONTOUR OF CARRIER CHROMINANCE SIGNAL

[75] Inventors: Tooru Kitano; Tsutomu Kawano, both of Itami, Japan

[73] Assignees: Mitsubishi Electric Engineering Company Limited; Mitsubishi Denki Kabushiki Kaisha, both of Tokyo, Japan

[21] Appl. No.: 40,300

[22] Filed: Mar. 30, 1993

[30] Foreign Application Priority Data

Apr. 9, 1992 [JP] Japan .................... 4-088762
Jun. 23, 1992 [JP] Japan .................... 4-164829
Dec. 9, 1992 [JP] Japan .................... 4-329271

[51] Int. Cl.⁶ ............ H04N 5/208; H04N 9/68; H04N 9/77
[52] U.S. Cl. .................. 348/625; 348/627; 348/630; 348/631; 348/662; 348/713
[58] Field of Search ........ 348/625, 627, 630, 631, 348/662, 713; H04N 5/208, 9/68, 9/77

[56] References Cited

U.S. PATENT DOCUMENTS

| | | | |
|---|---|---|---|
| 4,504,853 | 3/1985 | Faroudja . | |
| 4,758,891 | 7/1988 | Hitchcock et al. . | |
| 4,918,528 | 4/1990 | Oohashi | 348/627 |
| 5,070,398 | 12/1991 | Suzuki | 348/630 |
| 5,285,277 | 2/1994 | Min | 348/607 |

FOREIGN PATENT DOCUMENTS

| | | |
|---|---|---|
| 3048544 | 9/1981 | Germany . |
| 3890402 | 5/1989 | Germany . |
| 3936926 | 5/1990 | Germany . |
| 54-16923 | 2/1979 | Japan . |
| 2-5693 | 1/1990 | Japan . |

*Primary Examiner*—Howard W. Britton
*Attorney, Agent, or Firm*—Oblon, Spivak, McClelland, Maier, & Neustadt

[57] ABSTRACT

A waveform shaping apparatus in which no unrequired waveform shaping operation is performed even if its sensitivity is enhanced is provided. A signal (A) to be shaped in waveform is delayed by delay circuits (1 and 2) to produce signals (B and C). The signals (A, B and C) are applied to an original correction signal generating means (200a) and a control signal generating means (100a) to produce original correction signals (Ka and Kb), and control signals (Ha and Hb), respectively. A control circuit (13) selects the original correction signals (Ka and Kb), or a value "0" in accordance with the control signals (Ha and Hb) to generate a quasi-correction signal (L). The signal (L) is multiplied by a specified coefficient in a coefficient multiplier (14) to produce a correction signal (M), and the correction signal (M) is added to the signal (B) in an adder (5) to obtain an output signal (N) which has been shaped in waveform. The original correction signals and control signals are signals which vary for only a period when the signal (B) varies, and therefore, no unrequited waveform shaping operation is performed for a period when the signal (B) does not vary.

90 Claims, 67 Drawing Sheets (X2 IS OUT OF PHASE BY 90 DEG TO X1)

F I G. 34
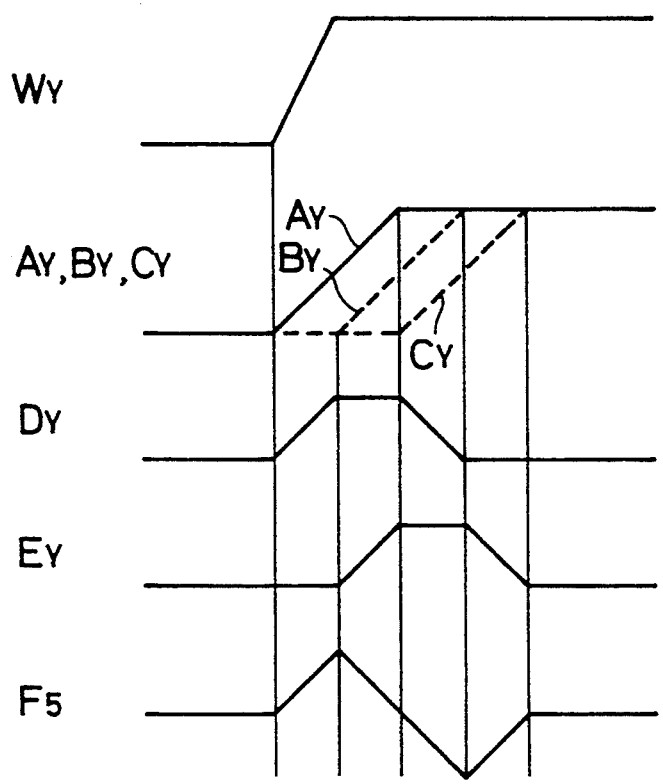

WAVEFORM SHAPING METHOD, WAVEFORM SHAPING APPARATUS AND APPARATUS FOR CORRECTING CONTOUR OF CARRIER CHROMINANCE SIGNAL

BACKGROUND OF THE INVENTION

1. Field of the Invention

The present invention relates to a signal waveform shaping technique, and more particularly, it relates to a contour correcting technique for improving sharpness, fineness, and the like of video signals in a color television receiver, video tape recorder, etc.

2. Description of the Prior Art

Japanese Patent Laying Open Gazette No. 63-292776 discloses a waveform shaping apparatus for correcting a contour in which three video signals, a video input signal and two video signals produced by delaying the video input signal in two delay circuits, are utilized so as to improve sharpness, fineness and the like of the video signals. A schematic block diagram thereof is shown in FIG. 64.

An input signal A is delayed by a specified period of time by a delay circuit 1 and by twice as much as the period by delay circuits 1 and 2 to produce signals B and C, respectively. An amplitude difference between the signals A and B is calculated by a subtractor 3 all the time, and further, its absolute value is calculated by an absolute value circuit 5. In other words, signal D output by the absolute value circuit 5 is an absolute value of the difference between the signals A and B. An amplitude difference between the signals B and C is similarly calculated by a subtractor 4 all the time, and its absolute value is further calculated by an absolute value circuit 6. In other words, a signal E output by the absolute value circuit 6 is an absolute value of the difference between the signals B and C.

A subtractor 7 finds an amplitude difference between the signals D and E, that is, signals Fa(=D−E) and Fb(=E−D) are calculated. A comparator 47 compares the signals Fa and Fb in magnitude with predetermined threshold voltage $V_{TH}$ to produce a switch signal to a switch 48. The switch 48 simultaneously receives the input signal A, the signal B delayed by the specified period, and the signal C delayed by twice as much as the specified period and switches between the signals A, B and C in accordance with the switch signal so as to produce an output signal Na.

FIG. 65 shows the relationship of the signals A, B, C, D, E, Fa, Fb and Na on time-varying basis. There provided is a case where the input signal A exhibits a waveform in which it begins to linearly rise at time t1 and reaches a specified value $V_A$ at time $t_3$, i.e., a case where a period $(t_3 - t_1)$ is required for rising.

The signal B is obtained by delaying the signal A by a period $(t_3 - t_1)/2$ in the delay circuit 1. Specifically, the signal B exhibits a waveform in which it begins to linearly rise at time $t_2 = (t_3 + t_1)/2$ and reaches the specified value $V_A$ at time $t_4 = (3t_3 - t_1)/2$.

The signal C is obtained by delaying the signal B by a period $(t_3 - t_1)/2$ in the delay circuit 2. Specifically, the signal C exhibits a waveform in which it begins to linearly rise at time $t_3$ and reaches the specified value $V_A$ at time $t_5 = 2t_3 - t_1$. Thus, waveforms of the signals $D(=ABS(A-B))$, $E(=ABS(B-C))$, $Fa(=D-E)$ and $Fb(=D-E)$ are shaped as shown in FIG. 56, respectively.

The comparator 47 compares the predetermined threshold voltage $V_{TH}$ with the signals Fa and Fb in magnitude to produce a switch signal which shows a comparison result. A switch 48 selects the signal C for the period when the comparison result satisfies $Fa > V_{TH}$, selects the signal A for the period of $Fb > V_{TH}$, or selects the signal B in any other conditions. As a result, the waveform shaped output signal Na which requires only a short period of time close to the time $t_3$ for rising can be obtained.

Since a conventional waveform shaping apparatus is configured as previously mentioned, the output signal Na cannot be obtained when the input signal A which remains stationary for a short period compared with delay times caused by the delay circuits 1 and 2 is to be shaped in waveform, as shown in FIG. 66.

Ideally, it is desirable to obtain the output signal Na which sharply rises close to the time $t_3$, takes a constant value $V_A$ until the time $t_5$, and sharply falls close to the time $t_5$.

However, when a signal (A−B) (shown by broken line in the waveform expressing the signal D) and a signal (B−C) (shown by broken line in the waveform expressing the signal E) are different in polarity from each other, that is, from time $t_{30}$ till time $t_{40}$, undesirable signal processing is performed, and there arises the problem that the signal Na exhibits a waveform considerably different from that of the input signal A.

Especially, as shown in FIG. 67, this problem becomes more serious as a sensitivity of the comparator 47 is enhanced to make the output signal Na sharply rise close to the time $t_3$ and sharply fall close to the time $t_5$. This means a restriction is imposed on the delay times of the delay circuits 1 and 2 and the sensitivity of the comparator 47 in the conventional waveform shaping apparatus.

Moreover, the switch 48 switches between the signals A, B and C to produce an output signal in the conventional waveform shaping apparatus, and hence, there also arises a problem that an amount of waveform shaping cannot be freely determined.

SUMMARY OF THE INVENTION

According to the present invention, a method of shaping a waveform comprises the steps of (a) inputting a signal to be shaped in waveform; (b) delaying the signal to be shaped by a first delay time to produce a shaping base signal; (c) delaying the shaping base signal by a second delay time to produce a delay base signal; (d) processing the signal to be shaped, the shaping base signal, and the delay base signal to produce a pair of control signals which vary for only a period when the shaping base signal varies, which are identical in reference value to each other, and which are symmetrical in relation to the reference value thereof; (e) processing the signal to be shaped, the shaping base signal, and the delay base signal to produce a pair of original correction signal which vary for only a period when the shaping base signal varies, which are identical in reference value to each other, and which are symmetrical in relation to the reference value thereof; (f) selecting the reference value of the pair of original correction signals or either of the pair of original correction signals in accordance with values of the pair of control signals to produce a quasi-correction signal; (g) multiplying the quasi-correction signal by a specified coefficient to produce a correction signal; and (h) operating the correction signal along with the shaping base signal to produce an output signal.

Preferably, the first delay time is a half of a period spent from the beginning of variation in the signal to be shaped till the end of the variation therein.

Yet preferably, the second delay time is a half of the period spent from the beginning of the variation in the signal to be shaped till the end of the variation therein.

Yet preferably, the step (f) includes the steps of (f-1) selecting a first one of the pair of original correction signals when a first one of the pair of control signals is more than a specified threshold value; (f-2) selecting a second one of the pair of original correction signals when a second one of the pair of control signals is mope than the specified threshold value; and (f-3) selecting the reference value of the pair of original correction signals when neither of the pair of control signals is more than the specified threshold value.

Yet preferably, the specified threshold value is equal to the reference value of the pair of control signals.

Yet preferably, the pair of original correction signals have their respective polarities remaining the same despite of a polarity of variation in the shaping base signal.

Yet preferably, the pair of control signals have their respective polarities depending upon the polarity of the variation in the shaping base signal.

Yet preferably, the step (e) includes the steps of (e-1) finding the absolute value of the difference between the signal to be shaped and the shaping base signal to produce a first differential signal; (e-2) finding an absolute value of a difference between the shaping base signal and the delay base signal to produce a second differential signal; (e-3) subtracting the second differential signal from the first differential signal to find a third differential signal; (e-4) subtracting the delay base signal from the signal to be shaped to find a fourth differential signal; and (e-5) finding a difference between absolute values of the third and fourth differential signals to produce the pair of original correction signals.

Yet preferably, the step (d) includes the step of (d-1) multiplying the third differential signal by the fourth differential signal to produce the pair of control signals.

Yet preferably, the specified coefficient is $\frac{1}{2}$.

Yet preferably, the pair of original correction signals have their respective polarities depending upon a polarity of the variation in the shaping base signal.

Yet preferably, the pair of control signals have their respective polarities remaining the same despite of the polarity of the variation in the shaping base signal.

Yet preferably, the step (e) includes the steps of (e-1) subtracting the shaping base signal from the signal to be shaped to produce a first differential signal; (e-2) subtracting the delay base signal from the shaping base signal to produce a second differential signal; (e-3) subtracting the second differential signal from the first differential signal to produce a third differential signal; (e-4) subtracting the delay base signal from the signal to be shaped to produce a fourth differential signal; (e-5) subtracting the signal to be shaped from the shaping base signal to produce a fifth differential signal; (e-6) subtracting the shaping base signal from the delay base signal to produce a sixth differential signal; (e-7) half-wave rectifying the first and second differential signals to produce seventh and eighth differential signals, respectively; (e-8) half-wave rectifying the fifth and sixth differential signals to produce ninth and tenth differential signals, respectively; (e-9) finding smaller one of the seventh and eighth differential signals to produce an eleventh differential signal; (e-10) finding smaller one of the ninth and tenth differential signals to produce a twelfth differential signal; and (e-11) finding the difference between the eleventh and twelfth differential signals to produce the pair of original correction signals.

Yet preferably, the step (d) includes the step of (d-1) multiplying the third differential signal by the fourth differential signal to produce the pair of control signals.

Yet preferably, the specified coefficient is 1.

In another aspect of the present invention, a waveform shaping apparatus comprises an input terminal for receiving a signal to be shaped in waveform; first delay means for delaying the signal to be shaped by a first delay time to produce a shaping base signal; second delay means for delaying the shaping base signal by a second delay time to produce a delay base signal; control signal generating means for processing the signal to be shaped, the shaping base signal, and the delay base signal to produce a pair of control signals which very for only a period when the shaping base signal varies, which are identical in reference value to each other, and which are symmetrical in relation to the reference value thereof; original correction signal generating means for processing the signal to be shaped, the shaping base signal, and the delay base signal to produce a pair of original correction signals which vary for only a period when the shaping base signal varies, which are identical in reference value to each other, and which are symmetrical in relation to the reference value thereof; a control circuit for selecting the reference value of the pair of original correction signals or either one of the pair of original correction signals in accordance with values of the pair of control signals to produce a quasi-correction signal; a coefficient multiplier for multiplying the quasi-correction signal by a specified coefficient to produce a correction signal; and an adder for adding the correction signal to the shaping base signal to produce an output signal.

Preferably, the first delay time is a half of a period spent from the beginning of variation in the signal to be shaped till the end of the variation therein.

Yet preferably, the second delay time is a half of the period spent from the beginning of variation in the signal to be shaped till the end of the variation therein.

Yet preferably, the control circuit selects a first one of the pair of original correction signals when a first one of the pair of control signals is more than a specified threshold value, selects a second one of the pair of original correction signals when a second one of the pair of control signals is more than the specified threshold value, and selects the reference value of the pair of original correction signals when neither of the pair of control signals is more than the specified threshold value.

Yet preferably, the specified threshold value is equal to the reference value of the pair of control signals.

Yet preferably, the pair of original correction signals have their respective polarities remaining the same despite of a polarity of variation in the shaping base signal.

Yet preferably, the pair of control signals have their respective polarities depending upon the polarity of the variation in the shaping base signal.

Yet preferably, each of the original correction signal generating means and the control signal generating means includes first operating means for finding an absolute value of a difference between the signal to be shaped and the shaping base signal to produce a first differential signal; second operating means for finding an absolute value of a difference between the shaping base signal and the delay base signal to produce a second differential signal; third operating means for subtracting the second differential signal from the first differential signal to find a third differential signal; and fourth operating means for subtracting the delay base signal from the signal to be shaped to find a fourth differential signal; and the original correction signal generating means includes fifth operating means for finding a difference between absolute values of the third and fourth differential signals to produce the pair of original correction signals.

Yet preferably, the control signal generating means further includes sixth operating means for multiplying the third differential signal by the fourth differential signal to produce the pair of control signals.

Yet preferably, the original correction signal generating means and the control signal generating means share the first through fourth operating means.

Yet preferably, the specified coefficient is $\frac{1}{2}$.

Yet preferably, the pair of original correction signals have their respective polarities depending upon a polarity of variation in the shaping base signal.

Yet preferably, the pair of control signals have their respective polarities remaining the same despite of the polarity of variation in the shaping base signal.

Yet preferably, each of the original correction signal generating means and the control signal generating means includes first operating means for subtracting the shaping base signal from the signal to be shaped to produce a first differential signal, second operating means for subtracting the delay base signal from the shaping base signal to produce a second differential signal, third operating means for subtracting the second differential signal from the first differential signal to produce a third differential signal, and fourth operating means for subtracting the delay base signal from the signal to be shaped to produce a fourth differential signal. In the original correction signal generating means, the first operating means subtracts the signal to be shaped from the shaping base signal to further produce a fifth differential signal; the second operating means subtracts the shaping base signal from the delay base signal to further produce a sixth differential signal. The original correction signal generating means further includes; a first half-wave rectifier circuit for half-wave rectifying the first and second differential signals to produce seventh and eighth differential signals, a second half-wave rectifier circuit for half-wave rectifying the fifth and sixth differential signals to produce ninth and tenth differential signals, fifth operating means for finding smaller one of the seventh and eighth differential signals to produce an eleventh differential signal, sixth operating means for finding smaller one of the ninth and tenth differential signals to produce a twelfth differential signal, and seventh operating means for finding the difference between the eleventh and twelfth differential signals to produce the pair of original correction signals.

Yet preferably, the control signal generating means further includes eighth operating means for multiplying the third differential signal by the fourth differential signal to produce the pair of control signals.

Yet preferably, the original correction signal generating means and the control signal generating means share the first through fourth operating means.

Yet preferably, the specified coefficient is 1.

The present invention is also directed to an apparatus for correcting a contour of a carrier chrominance signal comprising first and second sub-carrier input terminals for receiving first and second chrominance sub-carriers; a chrominance signal input terminal for receiving a carrier chrominance signal to be corrected in contour; first and second demodulators for demodulating the carrier chrominance signal with the first and second chrominance sub-carriers to output first and second demodulated chrominance signals, respectively; first and second waveform shaping apparatuses connected to the first and second demodulators, respectively; first and second modulators connected to the first and second waveform shaping apparatuses, respectively; and synthesizing means for synthesizing outputs from the first and second modulators to produce a correction chrominance signal. Each of the first and second waveform shaping apparatuses includes first delay means for delaying a signal to be shaped in waveform by a first delay time to produce a shaping base signal; second delay means for delaying the shaping base signal by a second delay time to produce a delay base signal; original correction signal generating means for processing the signal to be shaped, the shaping base signal, and the delay base signal to produce a pair of original correction signals which vary for only a period when the shaping base signal varies, which are identical in reference value to each other, and which are symmetrical in relation to the reference value thereof; a control circuit receiving a pair of control signals which vary for only a period when the shaping base signal varies, which are identical in reference value to each other, and which are symmetrical in relation to the reference value thereof, and selecting the reference value of the pair of original correction signals or either of the pair of original correction signals in accordance with values of the pair of control signals to produce a quasi-correction signal; a coefficient multiplier for multiplying the quasi-correction signal by a specified coefficient; and an adder for adding the correction signal to the shaping base signal to produce an output signal. In respective the first and second waveform shaping apparatuses, the signal to be shaped corresponds to the first and second demodulated chrominance signals.

Preferably, each of the first and second waveform shaping apparatuses further includes control signal generating means for processing the signal to be shaped, the shaping base signal, and the delay base signal to produce the pair of control signals. In each of the first and second waveform shaping apparatuses, the control circuit selects a first one of the pair of original correction signals when a first one of the pair of control signals is more than a specified value, selects a second one of the pair of original correction signals when a second one of the pair of control signals is more than the specified threshold value, and selects a reference value of the pair of original correction signals when neither of the pair of control signals is more than the specified threshold value.

Yet preferably, the specified threshold value is equal to the reference value of the pair of control signals.

Yet preferably, each of the first and second waveform shaping apparatuses further includes original control signal generating means for processing the signal to be shaped, the shaping base signal, and the delay base signal to find first and second original control signals. The apparatus for correcting a contour further includes first synthesizing means for synthesizing the first original control signals obtained in the first and second waveform shaping apparatuses to find a third original control signal, second synthesizing means for synthesizing the second original control signals obtained in the first and second waveform shaping apparatuses to find a fourth original control signal, and third synthesizing means for synthesizing the third and fourth original control signals to apply the pair of control signals to both of the control circuits in the first and second waveform shaping apparatuses.

Yet preferably, the pair of original correction signals have their respective polarities depending upon a polarity of variation in the shaping base signal, and the pair of control signals have their respective polarities remaining the same despite of the polarity of variation in the shaping base signal.

Yet preferably, each of the original correction signal generating means and the original control signal generating means includes first operating means for finding an absolute value of the difference between the signal to be shaped and the shaping base signal to produce a first differential signal, second operating means for finding an absolute value of the difference between the shaping base signal and the delay base signal to find a second differential signal, third operating means for subtracting the second differential signal from the first differential signal to produce a third differential signal, fourth operating means for subtracting the delay base signal from the signal to be shaped to find a fourth differential signal, and an absolute value circuit for finding an absolute value of the fourth differential signal. The third differential signal corresponds to the first original control signal; the absolute value of the fourth differential signal corresponds to the second original control signal. The original correction signal generating means further includes fifth operating means for finding a pair of fifth differential signals which are the differences between absolute values of the third and fourth differential signals, and a multiplier for multiplying the pair of fifth differential signals by the fourth differential signal to find the original correction signal.

Yet preferably, the original correction signal generating means and the original control signal generating means share the first through fourth operating means and the absolute value circuit.

Yet preferably, the specified coefficient is ½.

Yet preferably, each of the original correction signal generating means and the original control signal generating means includes first operating means for subtracting the shaping base signal from the signal to be shaped to produce a first differential signal, and second operating means for subtracting the delay base signal from the shaping base signal to produce a second differential signal. The original control signal generating means further includes third operating means for finding an absolute value of the difference between the signal to be shaped and the delay base signal to produce the second original control signal, and fourth operating means for subtracting an absolute value of the second differential signal from an absolute value of the first differential signal to find the first original control signal. In the original correction signal generating means, the first operating means subtracts the signal to be shaped from the shaping base signal to further produce a third differential signal, and the second operating means subtracts the shaping base signal from the delay base signal to produce a fourth differential signal. The original correction signal generating means further includes a first half-wave rectifier circuit for half-wave rectifying the first and second differential signals to produce fifth and sixth differential signals, a second half-wave rectifier circuit for half-wave rectifying the third and fourth differential signals to produce seventh and eighth differential signals, fifth operating means for finding a smaller one of the fifth and sixth differential signals to produce a ninth differential signal, sixth operating means for finding a smaller one of the seventh and eighth differential signals to produce a tenth differential signals, and seventh operating means for finding the difference between the ninth and tenth differential signals to produce the pair of original correction signals.

Yet preferably, the original correction signal generating means and the original control signal generating means share the first and second operating means.

Yet preferably, the specified coefficient is 1.

Yet preferably, each of the first and second waveform shaping apparatuses further includes original control signal generating means for processing the signal to be shaped, the shaping base signal, the delay base signal to find first and second original control signals; the apparatus for correcting a contour further includes contour signal generating means receiving a luminance signal for generating a luminance contour signal, first synthesizing means for synthesizing the first original control signals obtained in the first and second waveform shaping apparatuses to find a third original control signal, second synthesizing means for synthesizing the second original control signals obtained in the first and second waveform shaping apparatuses to find a fourth original control signal, third synthesizing means for synthesizing the third original control signal and the luminance contour signal to find a fifth original control signal, and fourth synthesizing means for synthesizing the fourth and fifth original control signals to apply the pair of control signals to both of the control circuits in the first and second waveform shaping apparatuses.

Yet preferably, the third synthesizing means includes a limiter for limiting values of the third original control signal and the luminance contour signal.

Yet preferably, the contour signal generating means includes third delay means for delaying the luminance signal by a third delay time to produce a first delay signal, and the luminance contour signal has polarities remaining the same despite of a polarity of variation in the first delay signal.

Yet preferably, the contour signal generating means further includes fourth delay means for delaying the luminance signal by a fourth delay time to produce a second delay signal; first operating means for finding an absolute value of the difference between the luminance signal and the first delay signal; second operating means for finding an absolute value of the difference between the first delay signal and the second delay signal; and third operating means for subtracting output of the second operating means from output of the first operating means to find the luminance contour signal.

Yet preferably, the contour signal generating means further includes first operating means for finding an absolute value of the difference between the luminance signal and the first delay signal, and second operating means for differentiating output of the first operating means and delaying it by a fourth delay time to find the luminance contour signal. The fourth delay time is arranged so that a variation in the luminance contour signal is caused about the center of variation in the first delay signal.

Yet preferably, the contour signal generating means finds an absolute value of differentiated the luminance signal, further differentiates it, and then delays it by a third delay time to find the luminance contour signal.

The present invention is also directed to an apparatus for correcting a contour of a carrier chrominance signal comprising first and second sub-carrier input terminals for receiving first and second chrominance sub-carriers, respectively; chrominance signal input terminal for receiving a carrier chrominance signal to be corrected in contour; first delay means for delaying the carrier chrominance signal by a first delay time to produce a delay chrominance signal; first and second demodulators for demodulating the carrier chrominance signal with the first and second chrominance sub-carriers to output first and second demodulated chrominance signals, respectively; first and second contour correction extractors connected to the first and second demodulators, respectively, for outputting first and second chrominance contour correction signals, respectively; a first modulator utilizing the first chrominance sub-carrier for modulating the first chrominance contour correction signal; a second modulator utilizing the second chrominance sub-carrier for modulating the second chrominance contour correction signal; and synthesizing means having a first synthesizing unit for synthesizing outputs from the first and second modulators and a second synthesizing unit for synthesizing output from the first synthesizing unit and the delay chrominance signal to output a correction chrominance signal. Each of the first and second contour correction extractors includes second delay means for delaying a signal to be shaped in waveform by a second delay time to produce a shaping base signal, third delay means for delaying the shaping base signal by a third delay time to produce a delay base signal, control signal generating means for processing the signal to be shaped, the shaping base signal, and the delay base signal to produce a pair of control signals which vary for only a period when the shaping base signal varies, which are identical in reference value to each other, and which are symmetrical in relation to the reference value thereof, original correction signal generating means for processing the signal to be shaped, the shaping base signal, and the delay base signal to produce a pair of original correction signals which vary for only the period when the shaping base signal varies, which are identical in reference value to each other, and which are symmetrical in relation to the reference value thereof, a control circuit receiving the pair of control signals for selecting the reference value of the pair of original correction signals or either of the pair of original correction signals in accordance with values of the pair of control signals to produce a quasi-correction signal, and a coefficient multiplier for multiplying the quasi-correction signal by a specified coefficient to produce a correction signal. The signal to be shaped corresponds to the first and second demodulated chrominance signals in each of the first and second contour correction extractors; the correction signal corresponds to the first and second chrominance contour correction signals in each of the first and second contour correction extractors; and the first delay time is equal to a time required for a procedure from input of the carrier chrominance signal to the first and second demodulators till production of output from the first synthesizing unit.

Preferably, the apparatus for correcting a contour further comprises a 90 deg. phase shifter which inputs the first chrominance sub-carrier and outputs the second chrominance sub-carrier.

Yet preferably, the first demodulator further receives an inversion signal of the first chrominance sub-carrier, the second demodulator further receives an inversion signal of the second chrominance sub-carrier, and the first and second contour correction extractors are variable in DC bias.

Yet preferably, the second delay time is a half of a period spent from the beginning of variation in the signal to be shaped till the end of the variation.

Yet preferably, the third delay time is a half of a period spent from the beginning of variation in the signal to be shaped till the end of the variation.

Yet preferably, each of the first and second waveform shaping appratuses further includes control signal generating means for processing the signal to be shaped, the shaping base signal, and the delay base signal to produce the pair of control signals. In each of the first and second waveform shaping appratuses, the control circuit selects a first one of the pair of original correction signals when a first one of the pair of control signals is more than a specified threshold value, selects a second one of the pair of original correction signals when a second one of the pair of control signals is more than the specified threshold value, and selects the reference value of the pair of original correction signals when neither of the control signals is more than the specified threshold value.

Yet preferably, the specified threshold value is equal to the reference value of the pair of control signals.

Yet preferably, the pair of original correction signals have their respective polarities remaining the same despite of a polarity of variation in the shaping base signal.

Yet preferably, the pair of control signals have their respective polarities depending upon the polarity of the variation in the shaping base signal.

Yet preferably, each of the original correction signal generating means and the control signal generating means includes first operating means for finding an absolute value of the difference between the signal to be shaped and the shaping base signal to produce a first differential signal, second operating means for finding an absolute value of the difference between the shaping base signal and the delay base signal to produce a second differential signal, third operating means for subtracting the second differential signal from the first differential signal to find a third differential signal, and fourth operating means for subtracting the delay base signal from the signal to be shaped to find a fourth differential signal. The original correction signal generating means further includes fifth operating means for finding the difference between absolute values of the third and fourth differential signals to produce the pair of original correction signals.

Yet preferably, the control signal generating means further comprises sixth operating means for multiplying the third differential signal by the fourth differential signal to produce the pair of control signals.

Yet preferably, the original correction signal generating means and the control signal generating means share the first through fourth operating means.

Yet preferably, the synthesizing means further includes a switch controlled in accordance with an absolute value of the fourth differential signal to apply one of output of the first synthesizing unit and specified direct current voltage to the second synthesizing unit.

Yet preferably, the pair of original correction signals have their respective polarities depending upon a polarity of variation in the shaping base signal.

Yet preferably, the pair of control signals have their respective polarities remaining the same despite of the polarity of the variation in the shaping base signal.

Yet preferably, each of the original correction signal generating means and the control signal generating means includes first operating means for subtracting the shaping base signal from the signal to be shaped to produce a first differential signal, second operating means for subtracting the delay base signal from the shaping base signal to produce a second differential signal, third operating means for subtracting the second differential signal from the first differential signal to find a third differential signal, and fourth operating means for subtracting the delay base signal from the signal to be shaped to find a fourth differential signal. In the original correction signal generating means, the first operating means subtracts the signal to be shaped from the shaping base signal to further produce a fifth differential signal, and the second operating means subtracts the shaping base signal from the delay base signal to further produce a sixth differential signal. The original correction signal generating means further includes a first half-wave rectifier circuit for half-wave rectifying the first and second differential signals to produce seventh and eighth differential signals, a second half-wave rectifier circuit for half-wave rectifying the fifth and sixth differential signals to produce ninth and tenth differential signals, fifth operating means for finding a smaller one of the seventh and eighth differential signals to produce an eleventh differential signal, sixth operating means for dinding a smaller one of the ninth and tenth differential signals to produce a twelfth differential signal, and seventh operating means for finding the difference between the eleventh and twelfth differential signals to produce the pair of original correction signals.

Yet preferably, the control signal generating means further includes eighth operating means for multiplying the third differential signal by the fourth differential signal to produce the pair of control signals.

Yet preferably, the original correction signal generating means and the control signal generating means share the first through fourth operating means.

Yet preferably, the synthesizing means further includes a cleaning circuit interposing between the first and second synthesizing units.

Yet preferably, the synthesizing means includes a switch for switching between output of the first synthesizing unit and specified direct current voltage in accordance with a specified signal identical in width to a signal component of the output of the first synthesizing unit to apply an output of the switch to the second synthesizing unit.

Yet preferably, the first and second modulators receive the first and second chrominance sub-carriers through first and second variable phase shifters which cooperate with each other keeping an amount of phase shift identical to each other.

Preferably, the apparatus for correcting a contour further comprises: first saturation degree control means connected between the chrominance signal input terminal and the first and second demodulators for controlling the degree of saturation of the carrier chrominance signal; and second saturation degree control means for controlling the degree of saturation of the correction chrominance signal.

Yet preferably, the first and second saturation degree control means amplify inputted signals with first and second amplification degrees, respectively, and the second amplification degree is in predetermined relation with the first amplification degree.

Yet preferably, the first saturation degree control means includes: first saturation degree control signal producing means for eliminating a burst signal of the carrier chrominance signal applied to the chrominance signal input terminal to produce a first saturation degree control signal; and first amplitude control means for detecting the degree of saturation of the first saturation degree control signal to control the magnitude of the amplitude of the carrier chrominance signal applied to the chrominance signal input terminal.

Yet preferably, the first amplitude control means includes: a power supply for supplying a reference potential; rectifying means for rectifying the first saturation degree control signal; a comparator for comparing a potential of an output of the rectifying means with the reference potential to output a comparison result; and a voltage control amplifier controlled by the comparison result, and the first amplification degree is in negative correlation with the comparison result.

Yet preferably, the rectifying means includes an integrating circuit.

Yet preferably, the second saturation degree control means includes: second saturation degree control signal producing means for selecting a burst signal of the correction chrominance signal given as an output of the synthesizing means to produce a second saturation degree control signal; and second amplitude control means for detecting the degree of saturation of the second saturation degree control signal to control the magnitude of the amplitude of the correction chrominance signal given as the output of the synthesizing means, and the second saturation degree control means outputs the correction chrominance signal including a burst signal corresponding to the amplitude of a burst signal of the carrier chrominance signal applied to the chrominance signal input terminal.

Yet preferably, the second amplitude control means includes: a power supply for supplying a reference potential; rectifying means for rectifying the second saturation degree control signal; a comparator for comparing a potential of an output of the rectifying means with the reference potential to output a comparison result; and a voltage control amplifier controlled by the comparison result, and the second amplification degree is in negative correlation with the comparison result.

Yet preferably, the comparator includes a capacitor for smoothing the output of the comparator.

Yet preferably, the first saturation degree control means includes: first saturation degree control signal producing means for eliminating a burst signal of the carrier chrominance signal applied to the chrominance signal input terminal to produce a first saturation degree control signal; saturation degree detecting means for detecting the degree of saturation of the first saturation degree control signal to output a saturation degree detection signal; and first amplitude control means controlled by the saturation degree detection signal for controlling the magnitude of the amplitude of the carrier chrominance signal applied to the chrominance signal input terminal, and the second saturation degree control means includes: second amplitude control means controlled by the saturation degree detection signal for outputting the correction chrominance signal including a burst signal corresponding to the amplitude of a burst signal of the carrier chrominance signal applied to the chrominance signal input terminal.

Yet preferably, the saturation degree detecting means includes: a power supply for supplying a reference potential; rectifying means for rectifying the first saturation degree control signal; and a comparator for comparing a potential of an output of the rectifying means with the reference potential to output a comparison result, and the first amplitude control means includes a first voltage control amplifier controlled by the comparison result, and the first amplification degree is in negative correlation with the comparison result.

Yet preferably, the rectifying means includes an integrating circuit.

Yet preferably, the second amplitude control means includes a second voltage control amplifier controlled by the comparison result, and the first and second voltage control amplifiers operate complementarily to each other.

Yet preferably, the second amplification degree is the reciprocal of the first amplification degree.

Yet preferably, the first voltage control amplifier includes: a first voltage-to-current converter for converting an inputted voltage into a current; a first separator for separating the output of the first voltage-to-current converter into two in accordance with the comparison result to provide a pair of first separated currents; and a first current-to-voltage converter for converting one of the first separated currents into a voltage to output the voltage, and the second voltage control amplifier includes: a second voltage-to-current converter for converting an inputted voltage into a current; a second separator for separating the output of the second voltage-to-current converter into two in accordance with the comparison result to provide a pair of second separated currents; and a second current-to-voltage converter for converting one of the second separated currents into a voltage to output the voltage.

Yet preferably, the comparison result includes first and second comparison potentials; the first comparison potential controls the one first separated current and the other second separated current; and the second comparison potential controls the one second separated current and the other first separated current.

Yet preferably, the first voltage-to-current converter includes a first resistance for determining a ratio of conversion to be performed therein; the second voltage-to-current converter includes a second resistance for determining a ratio of conversion to be performed therein; the first current-to-voltage converter includes a third resistance for determining a ratio of conversion to be performed therein; the second current-to-voltage converter includes a fourth resistance for determining a ratio of conversion to be performed therein; the first amplification degree is determined by the ratio of the first resistance to the third resistance; and the second amplification degree is determined by the ratio of the second resistance to the fourth resistance.

Preferably, the first and second waveform shaping apparatuses are connected to the chrominance signal input terminal; each of the first and second waveform shaping apparatuses further includes a coefficient multiplier control apparatus; the coefficient multiplier control apparatus detects the degree of saturation of the carrier chrominance signal to apply a saturation degree detection signal to the coefficient multiplier; and the specified coefficient is in negative correlation with the saturation degree detection signal.

Yet preferably, the coefficient multiplier control apparatus includes: saturation degree control signal producing means for eliminating a burst signal of the carrier chrominance signal applied to the chrominance signal input terminal to produce a saturation degree control signal; and saturation degree detecting means for detecting the degree of saturation of the saturation degree control signal to output the saturation degree detection signal.

Yet preferably, the saturation degree detecting means includes: a power supply for supplying a reference potential; rectifying means for rectifying the saturation degree control signal; and a comparator for comparing a potential of an output of the rectifying means with the reference potential to output a comparison result, and the comparison result is equivalent to the saturation degree detection signal.

Yet preferably, the rectifying means includes an integrating circuit.

According to the present invention, a signal A to be shaped, a shaping base signal B, and a delay base signal C are combined to find a correction signal M, and the correction signal M is added to the shaping base signal B to find an output signal N. In this case, regarding the correction signal M, (i) when $A-B \geq 0$ and $B-C \leq 0$, $M=0$; or (ii) when $A-B \leq 0$ and $B-C \geq 0$, $M=0$.

Thus, the shaping base signal B itself becomes the output signal N during a period of an unrequited signal processing.

In the first through third aspects of the apparatus for correcting a contour of a carrier chrominance signal according to the present invention, the first and second demodulated chrominance signals are shaped in waveform by the waveform shaping apparatuses, respectively.

Especially, in the second and third aspects, the same control signal is utilized to operate the control circuits of the first and second waveform shaping apparatuses which work in shaping waveforms of the first and second demodulated chrominance signals.

Especially, in the third aspect, by assessing the luminance contour signal which is a contour obtained by detecting a luminance signal.

In a fourth aspect of the apparatus for correcting a contour of a carrier chrominance signal according to the present invention, chrominance contour correction signals M1 and M2 are demodulated to produce correction demodulated signals M3 and M4, which are utilized to shape a signal W0 in waveform, where the signal W0 is a result of delaying a carrier chrominance signal W. In other words, the relationship between the correction demodulated signals M3 and M4 and the signal W0 in the fourth aspect of the apparatus for correcting a contour of a carrier chrominance signal according to the present invention is similar to the relationship between the correction signal M and the shaping base signal B in the waveform shaping apparatus according to the present invention.

In a fifth aspect of the apparatus for correcting a contour of a carrier chrominance signal according to the present invention, the first saturation degree control means amplifies the carrier chrominance signal such that the degree of saturation (amplitude) of the carrier chrominance signal is of a predetermined magnitude.

The second saturation degree control means amplifies the correction chrominance signal such that the degree of saturation (amplitude) of the correction chrominance signal is of a predetermined magnitude.

In a sixth aspect of the apparatus for correcting a contour of a carrier chrominance signal according to the present invention, the coefficient multiplier controller controls the specified coefficient in accordance with the degree of saturation of the carrier chrominance signal to control the magnitude of the correction signal M.

The term "polarity" of a signal in the present invention means not only an ordinary positive or negative polarity where a state more than a reference value "0" is positive while a state less than the reference value is negative, but also a way of judgment whether a state is more or less than a certain reference value of the related signal.

The term "contour" is used for representing not the contour of a signal itself, but the contour of a video image which is based on the signal.

In the waveform shaping apparatuses and waveform shaping methods according to the present invention, a signal to be shaped is delayed to find a shaping base signal, a correction signal is found which varies for only a period when the shaping base signal varies, and the correction signal is added to the shaping base signal. Hence, an unrequired waveform shaping is not performed for a period when the shaping base signal does not vary, and consequently, a sensitivity of waveform shaping can be enhanced.

In the first through third aspects of the apparatus for correcting a contour of a carrier chrominance signal according to the present invention, since first and second demodulated chrominance signal are shaped in waveform with the above-mentioned waveform shaping apparatuses and waveform shaping methods, waveform shaping can be performed in demodulation of a carrier chrominance signal.

Especially in the second and third aspects, control circuits of first and second waveform shaping appratuses which operate in waveform shaping of the first and second demodulated chrominance signals work based upon the same control signal, and consequently, an evil influence of change in hue can be avoided.

Moreover, especially in the third aspect, since a control signal is produced referring to a luminance contour signal which is produced as a result of detection of a contour of the luminance signal, the chrominance signal can be shaped in waveform without deviating from the contour of the luminance signal.

In a fourth aspect of the apparatus for correcting a contour of a carrier chrominance signal according to the present invention, a chrominance contour correction signal is produced base upon a carrier chrominance signal, and the chrominance contour correction signal is added to a delayed carrier chrominance signal. Hence, even if linearity of demodulators and modulators are insufficient, the carrier chrominance signal can be shaped in waveform.

In the fifth aspect of the apparatus for correcting a contour of a carrier chrominance signal according to the present invention, the degree of saturation of the carrier chrominance signal is increased to a predetermined magnitude and, thereafter, a series of signal processings of demodulation, contour correction and modulation are carried out. This provides for an improved S/N ratio and the contour correction of the chrominance signal for the light-colored image.

In the sixth aspect of the apparatus for correcting a contour of a carrier chrominance signal according to the present invention, the specified coefficient is made higher such that the magnitude of the correction signal is increased when the carrier chrominance signal has a low degree of saturation. This provides for the contour correction of the chrominance signal for the light-colored image.

Accordingly, the principal object of the present invention is to achieve waveform shaping by which a sensitivity of a waveform shaping apparatus can be enhanced without any unrequired signal processing and effects of waveform shaping can be optionally predetermined.

These and other objects, features, aspects and advantages of the present invention become more apparent from the following detailed description of the present invention when taken in conjunction with the accompanying drawings.

BRIEF DESCRIPTION OF THE DRAWINGS

FIG. 34 is a waveform chart showing an operation of the first exemplary configuration of the third application;

DETAILED DESCRIPTION OF THE PREFERRED EMBODIMENT

A. Basic Embodiments

(A-0) Basic Procedure

Figure 1:
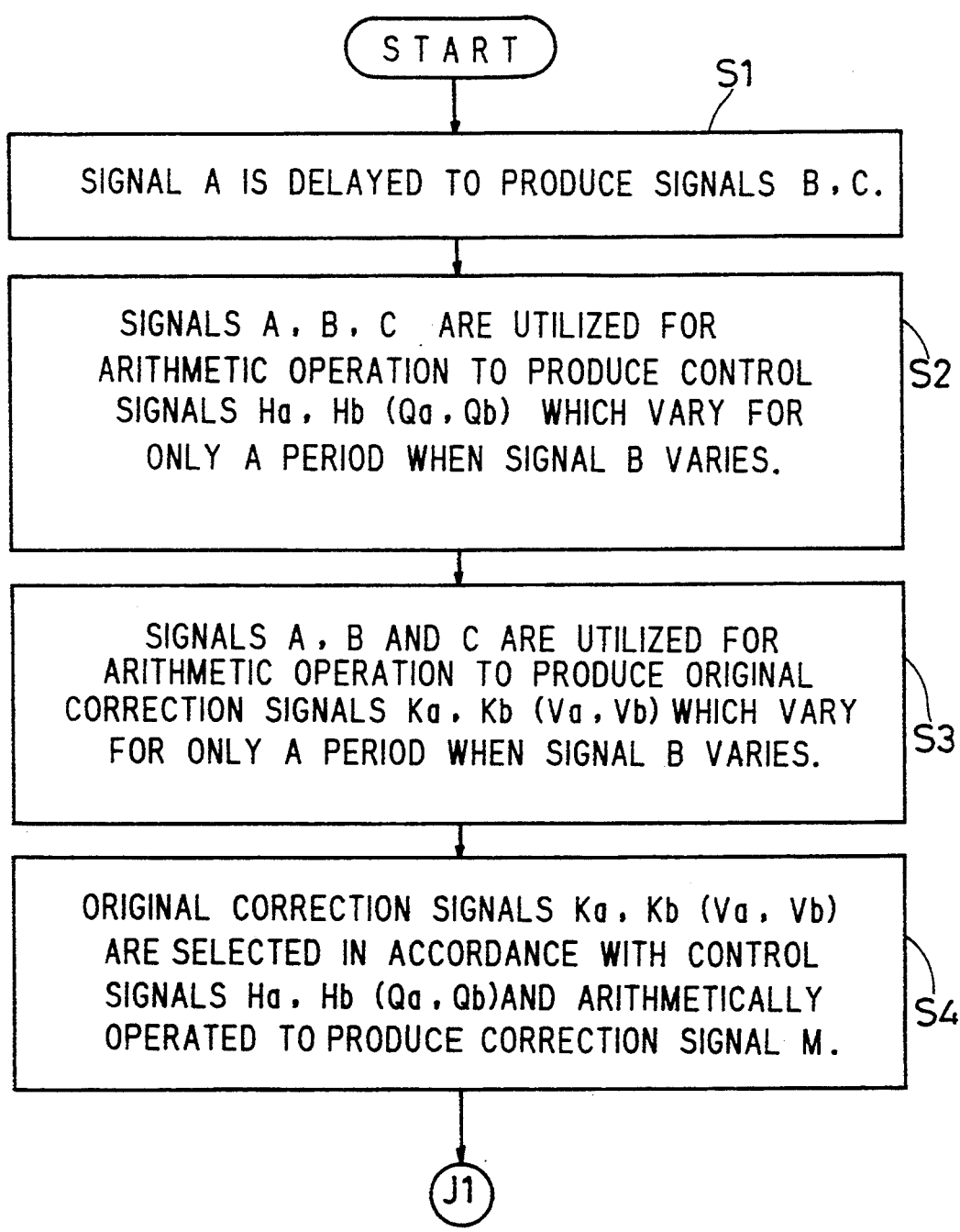
FIG. 1 is a flow chart showing a basic procedure of the present invention.
Figure 2:
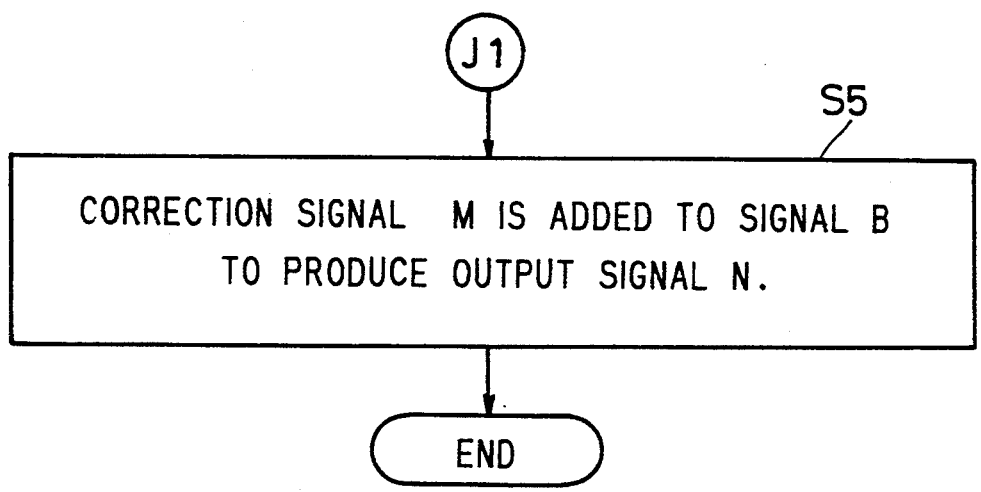
FIG. 2 is a flow chart showing a basic procedure of the present invention.

FIGS. 1 and 2 are flow charts showing a basic procedure of the present invention.

Although the following sections (A-1) and (A-2) will explain more specifically, a simplified explanation is given. An input signal A to be shaped in waveform a is delayed by a specified period of time to produce a signal B which is a base signal of an output signal, and the signal B is delayed by a specified period of time to produce a signal C (step S1).

Then, an arithmetic operation is performed with regard to the signals A, B and C to obtain control signals Ha and Hb (Qa, Qb) which vary for only a period when the signal B varies (step S2). An arithmetic operation is further performed with regard to the signals A, B and C to obtain original correction signals Ka and Kb (Va, Vb) which vary for only a period when the signal B varies (step S3).

After that, the original correction signals Ka and Kb (Va, Vb) are selected in accordance with values of the control signals Ha and Hb (Qa, Qb), and an arithmetic operation is performed with regard to them to obtain a correction signal M (step S4). Moreover, the correction signal M is added to the signal B to produce an output signal N which has been shaped in waveform (step S5).

(A-1) First Preferred Embodiment

Figure 3:
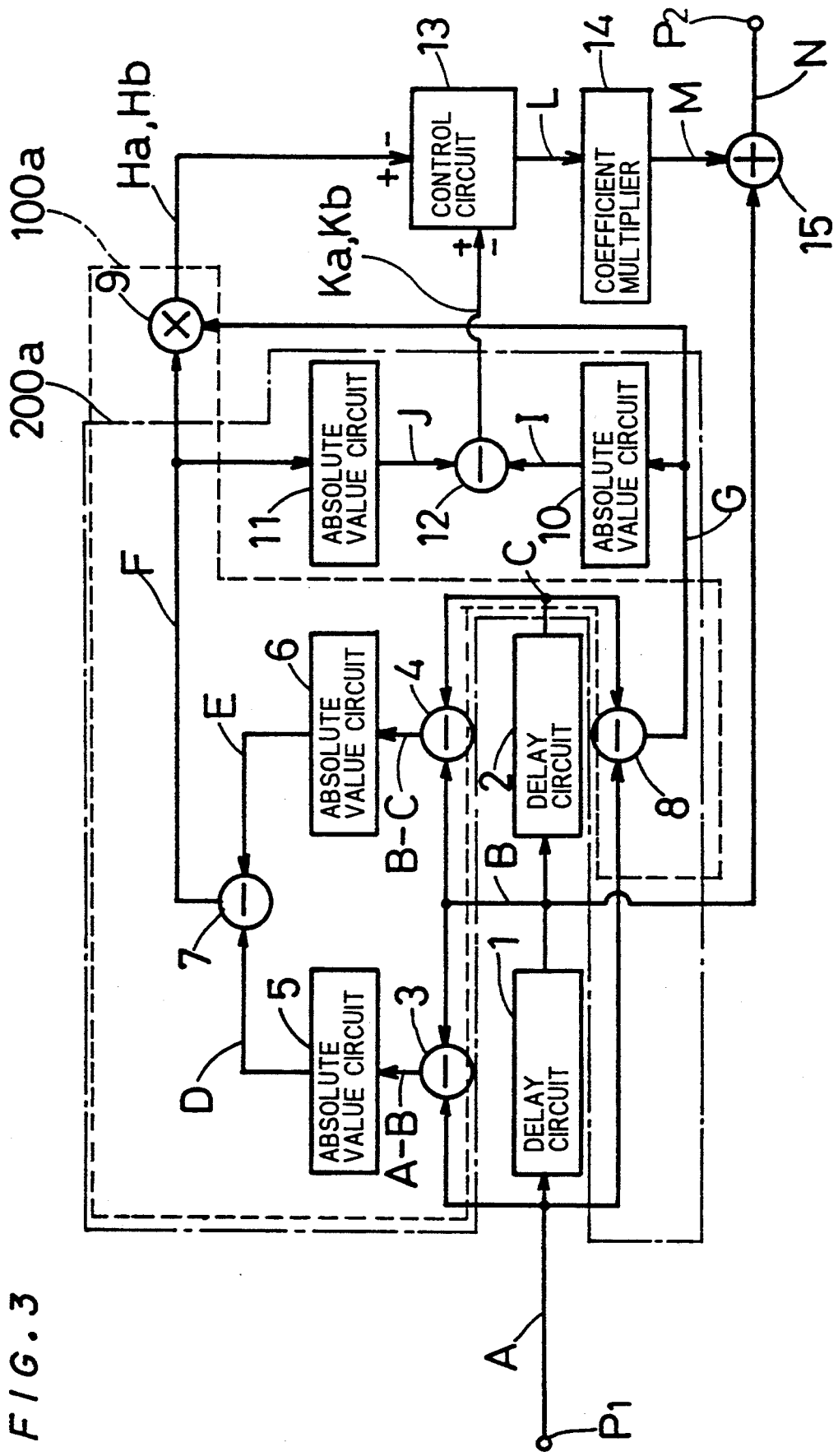
FIG. 3 is a block diagram showing a first preferred embodiment of the present invention.
Figure 4:
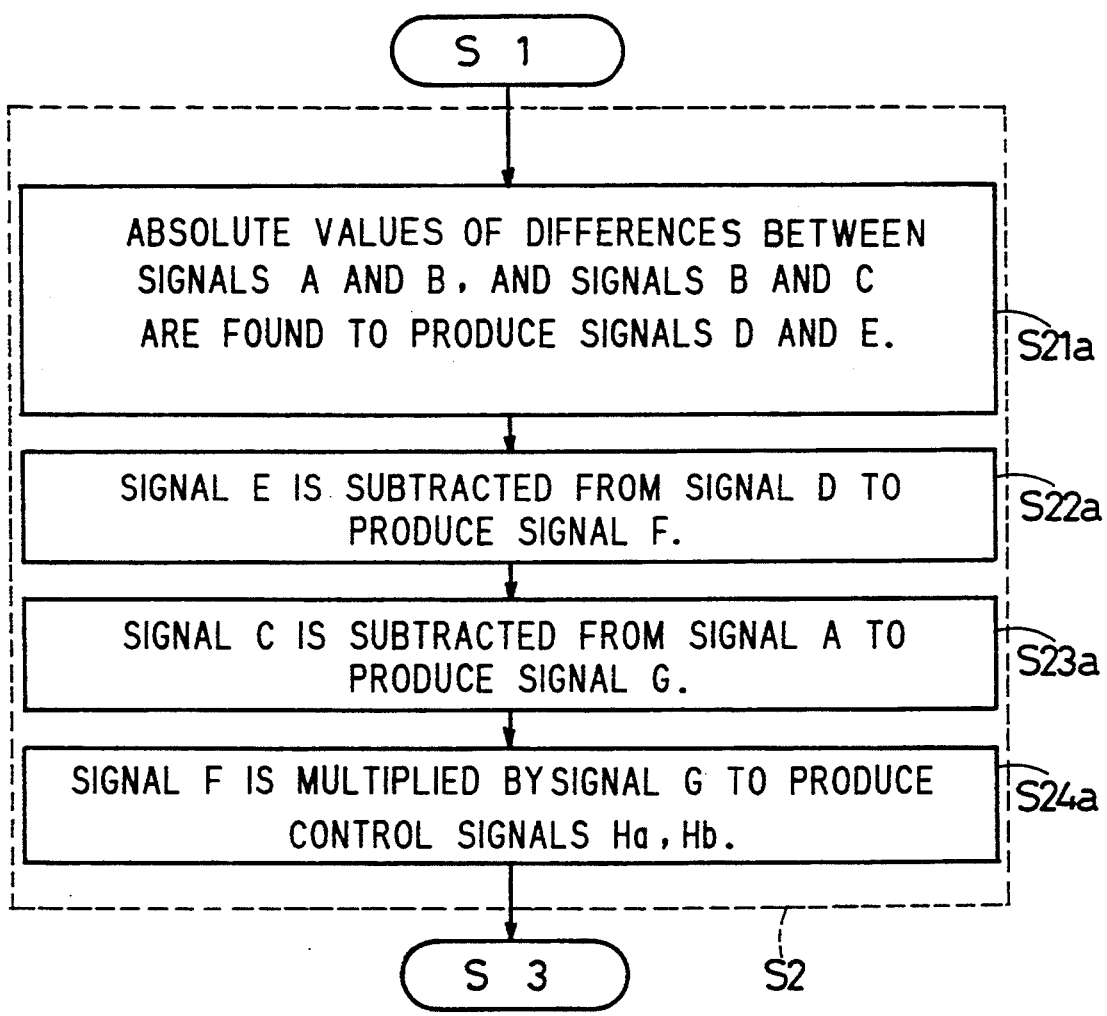
FIG. 4 is a flow chart showing a procedure of the first preferred embodiment.
Figure 5:
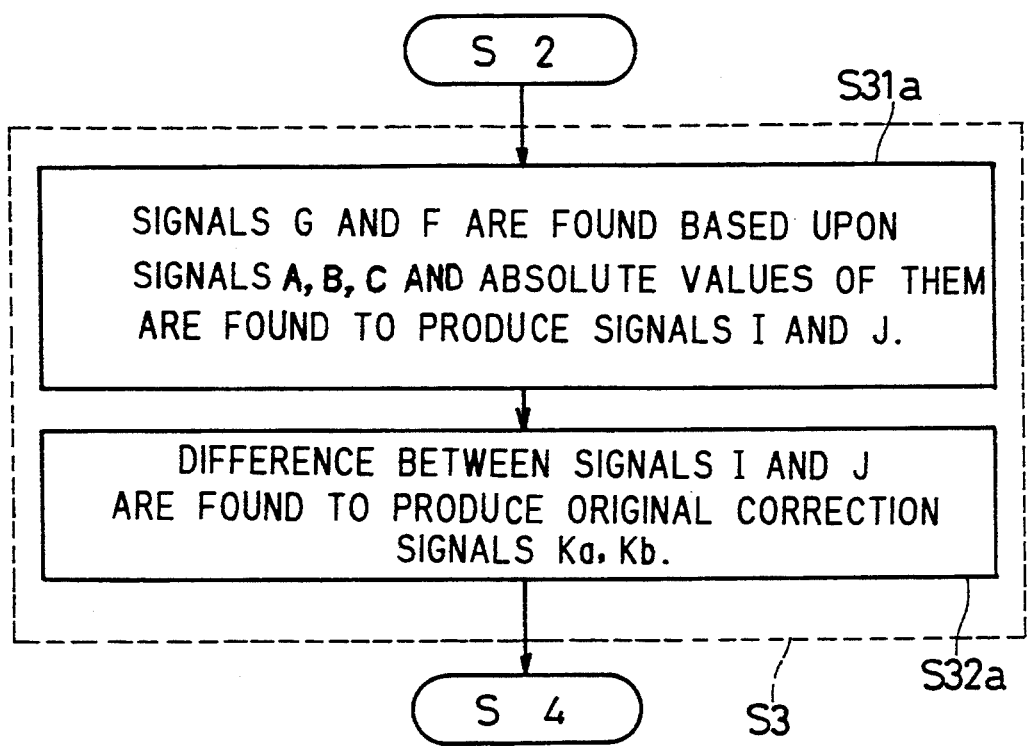
FIG. 5 is a flow chart showing the procedure of the first preferred embodiment.
Figure 6:
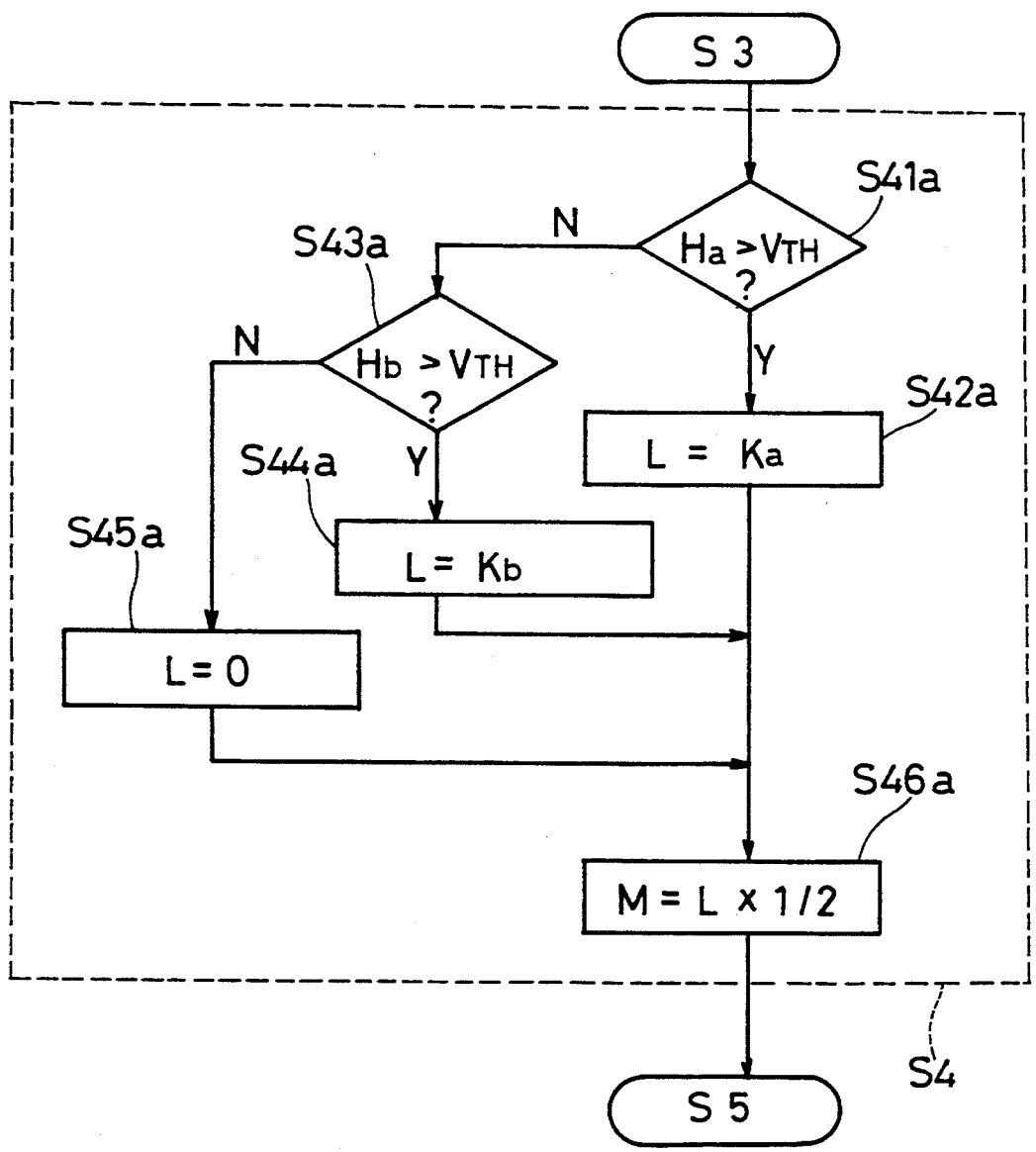
FIG. 6 is a flow chart showing the procedure of the first preferred embodiment.

FIG. 3 is a block diagram of the first preferred embodiment according to the present invention while FIGS. 4 through 6 are flow charts thereof. An input terminal P1 is connected to a delay circuit 1 and subtractors 3 and 8 while a delay circuit 2 is connected to the delay circuit 1 and subtractors 4 and 8. The subtractor 3 is connected to an absolute value circuit 5, the subtractor 4 is connected to an absolute value circuit 6, and a subtractor 7 is connected to both of the absolute value circuits 5 and 6. A multiplier 9 is connected to the subtractors 7 and 8.

An input signal A input to the input terminal P1 is delayed by the delay circuit 1 by a specified period of time to produce a signal B while it is also delayed by the delay circuits 1 and 2 by a period twice as long as the specified period to produce a signal C. The subtractor 3 calculates a signal $(A-B)$, and the absolute value circuit 5 further finds a signal D $(=ABS(A-B))$. In the same way, the subtractor 4 calculates a signal $(B-C)$, and the absolute value circuit 6 further finds a signal E $(=ABS(B-C))$ (step S21a). The subtractor 7 produces a signal F $(=D-E)$ (step S22a).

On the other hand, the subtractor 8 produces a signal G $(=A-C)$ (step S23a), and the multiplier 9 multiplies the signal G by a signal F to find a control signals Ha $(=-F\times G$; however, partially saturated) and Hb $(=-Ha)$ (step S24a). In FIG. 3, a block 100a is a control signal generating unit where the control signals Ha and Hb are generated.

The subtractor 8 is connected to an absolute value circuit 10 while the subtractor 7 is connected to an absolute value circuit 11, and a subtractor 12 is connected to both of the absolute value circuits 10 and 11.

The absolute value circuits 10 and 11 are utilized to find signals I and J, respectively, which are absolute values of the signals G and F (step S31a), and the subtractor 12 is utilized to find the original correction signals Ka $(=I-J)$ and Kb $(=J-I)$ (step S32a). In FIG. 3, a block 200a is an original correction signal generating unit where the original correction signals Ka and Kb are generated.

A control circuit 13 is connected to the multiplier 9 and the subtractor 12 to produce either of the original correction signals Ka and Kb or "0" as the signal L based upon the control signals Ha and Hb.

The control circuit 13 outputs the original correction signal L; i.e., it outputs the original correction signal Ka when the control signal Ha is more than a specified threshold voltage $V_{TH}$ (steps S41a and S42a), the original correction signal Kb when the control signal Hb is more than the specified threshold voltage $V_{TH}$ (steps S43a and S44a), or the value "0" when any other conditions are satisfied (step S45a), respectively. The control circuit 13 is further connected to a coefficient multiplier 14 where the original correction signal L is multiplied by a specified coefficient to produce a correction signal M (step S46a).

Figure 7:
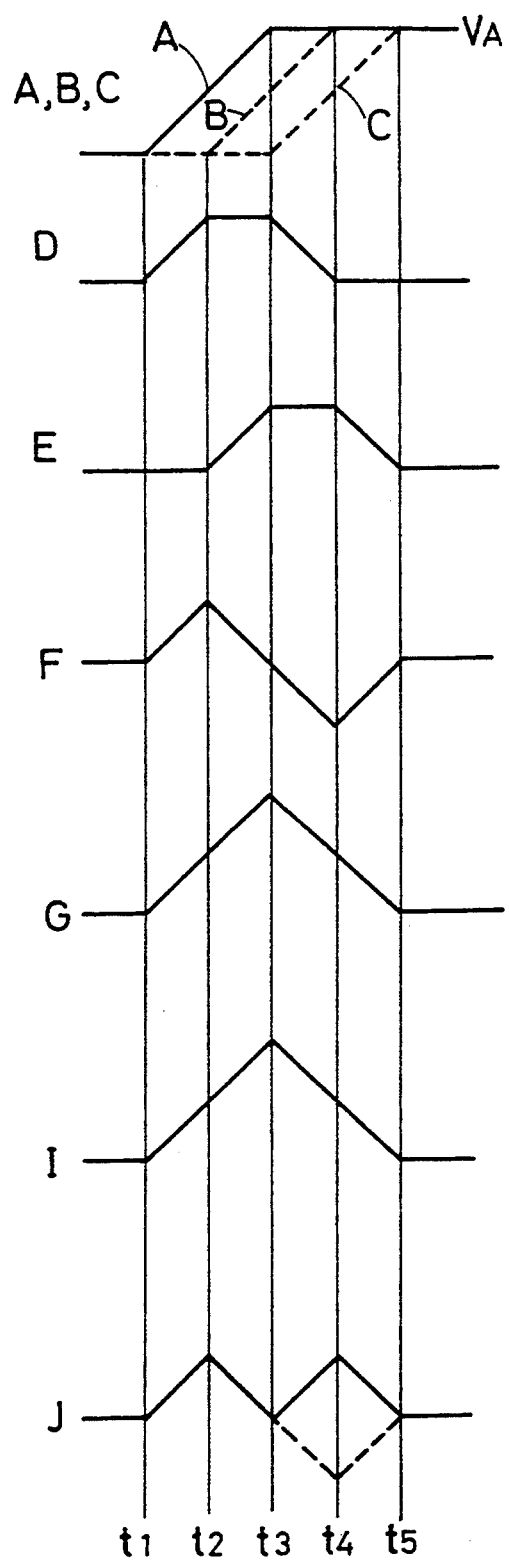
FIG. 7 is a waveform chart showing an operation of the first preferred embodiment.

FIG. 7 shows waveforms of signals A, B, C, D, E, F, G, I and J in the case where the input signal A exhibits a waveform in which it begins to linearly rise from time $t_1$ and reaches a specified value $V_A$ at time $t_3$, that is, the input signal A requires a period $(t_3-t_1)$ for rising. To facilitate comprehension, a waveform of the signal F is shown together with a waveform of the signal J.

The signal B is a signal obtained by delaying the signal A by a period $(t_3-t_1)/2$ by the delay circuit 1. Thus, the signal B exhibits a waveform in which it begins to linearly rise from time $t_2=(t_3+t_1)/2$ and reaches the specified value $V_A$ at time $t_4=(3t_3-t_1)/2$. In the present invention, an output signal which has been shaped in waveform is obtained by adding a correction signal mentioned later to the basic signal B. Hereinafter, the explanation is focused on the waveform of the signal B.

The signal C is a signal obtained by delaying the signal B by a period $(t_3-t_1)/2$ by the delay circuit 2. Thus, the signal C exhibits a waveform in which it begins to linearly rise from the time $t_3$ and reaches the specified value $V_A$ at time $t_5=2t_3-t_1$.

The signal F is the difference between the signals D and E, neither of which is negative, and its polarity does not depend upon whether variation in the signal B is rising or falling. Specifically, the signal F exhibits the maximum value at the time $t_2$ when the signal B begins to vary and exhibits the minimum value at the time $t_4$ when the signal B stops varying.

On the other hand, the signal G exhibits the maximum value close to the middle of the variation in the signal B, and its polarity varies depending upon whether the variation in the signal B is rising or falling.

Figure 8:
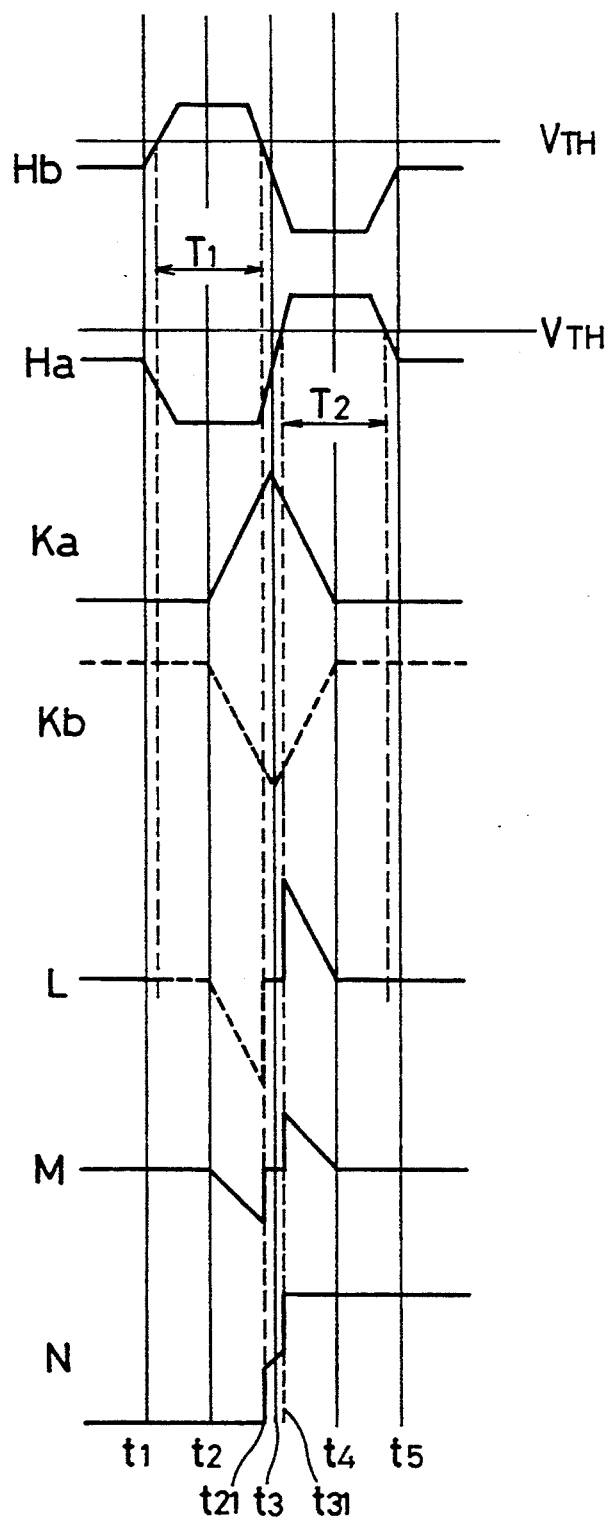
FIG. 8 is a waveform chart showing the operation of the first preferred embodiment.

Either of the signals F and G takes the value "0" at a time sufficiently far form the variation in the signal B. Thus, the control signals Ha and Hb which are the products of the signal F multiplied by the signal G assume a signal width which is the sum of a width of the delay time of the delay circuit 1 (period $t_1$ through $t_2$), a period for the variation in the signal B (period $t_2$ through $t_4$), and a width of the delay time of the delay circuit 2 (period $t_4$ through $t_5$), as shown in FIG. 8, and they also assume respective zero cross points close to the middle of the variation in the signal B (the middle of its contour). The control signals Ha and Hb found in this way are shown in FIG. 8.

On the other hand, the original correction signals Ka and Kb are basic signals of quasi-correction signals, and, as shown in FIG. 8, they do not depend upon whether the variation in the signal B is rising or falling. The original correction signals Ka and Kb assume extreme values close to the middle of the variation in the signal B, and they assume the value "0" in any point where the signal $(A-B)$ and the signal $(B-C)$ are different in polarity from each other (positive and negative, or vice versa). Thus, as far as a correction signal is selected based upon the original correction signals Ka and Kb, an unrequited operation which is the disadvantage in prior art waveform shaping apparatuses can be prevented.

The control circuit 13 selectively outputs the original correction signals Ka and Kb in accordance with the control signals Ha and Hb so as to produce the quasi-correction signal L. Ideally, the original correction signal Kb is output to suppress the variation in the signal B for a period when the control signal Hb is positive, that is, close to the beginning of the variation of the signal B, while the original correction signal Ka is output to accelerate the variation in the signal B for a period when the control signal Ha is positive, that is, close to the end of the variation in the signal B.

However, since the control signals Ha and Hb are sufficiently large in width compared with the original correction signals Ka and Kb, the original correction signals Ka and Kb can be controled in safety even if it is judged the polarities of control signals Ha and Hb on the basis of the positive threshold voltage $V_{TH}$. In FIG.

8, there explained is the case where the threshold voltage $V_{TH}$ is predetermined to set a period $T_1$ for which the original correction signal Kb is to be output and a period $T_2$ for which the original correction signal Ka is to be output.

Even though the original correction signals Ka and Kb do not assume the value "0", the control circuit 13 outputs the value "0" as the quasi-correction signal L for a period when neither of the control signals Ha nor Hb is more than the threshold voltage $V_{TH}$ (period $t_{22}$ through $t_{31}$). A waveform of the quasi-correction signal L is shown in FIG. 8. Reducing a potential of the threshold voltage $V_{TH}$ and enhancing a sensitivity of the control circuit 13, that period of time can be shortened.

The coefficient multiplier 14 amplifies (multiplies) the quasi-correction signal L with an appropriate gain (coefficient) to produce the correction signal M. An adder 15 adds the correction signal M to the signal B to produce the output signal N which has been shaped in a waveform.

Optionally setting the gain of the coefficient multiplier 14, amounts of overshoot and preshoot regarding the signal B can be adjusted. As to waveforms shown in FIGS. 7 and 8, setting the gain of the coefficient multiplier 14 to ½, the output signal N which has been shaped in waveform without overshoot nor preshoot can be obtained, as shown in FIG. 8.

Figure 65:
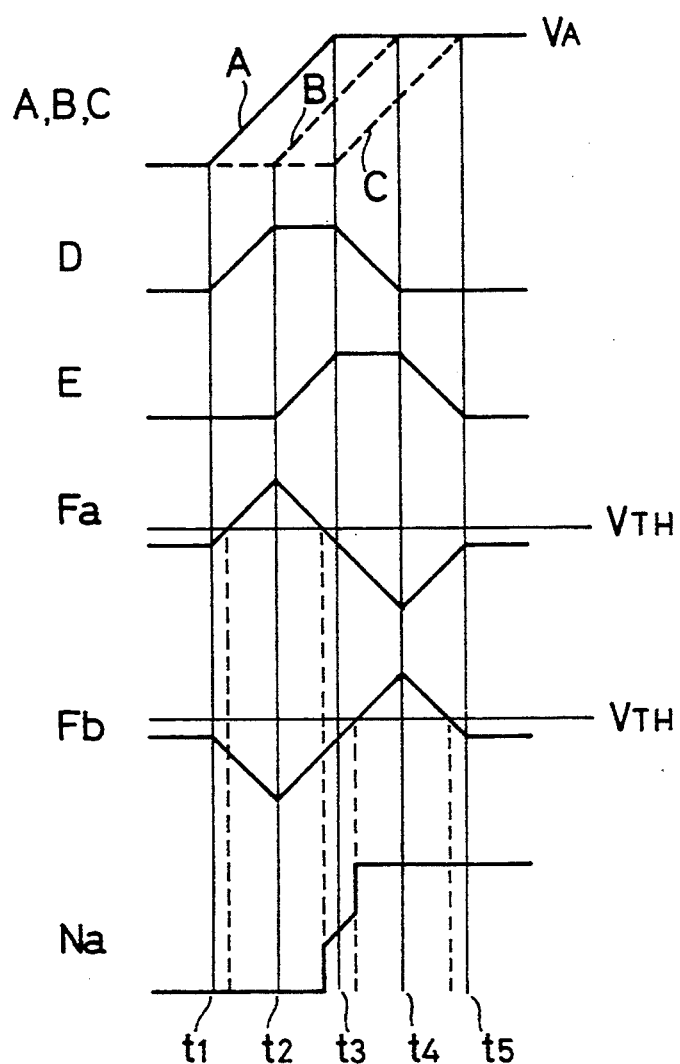
FIG. 65 is a waveform chart showing the prior art technology.

When the input signal A exhibits a waveform of which variation is not so dense as that shown in FIG. 7, a conventional waveform shaping apparatus is useful enough to produce the output signal N which has been shaped in waveform as shown in FIG. 8 (FIG. 65). However, in the case where an input signal exhibiting a waveform of which variation is dense is to be shaped in waveform and a sensitivity of a comparator circuit is to be raised, the present invention provides a significant effect compared with the conventional waveform shaping apparatus.

Figure 9:
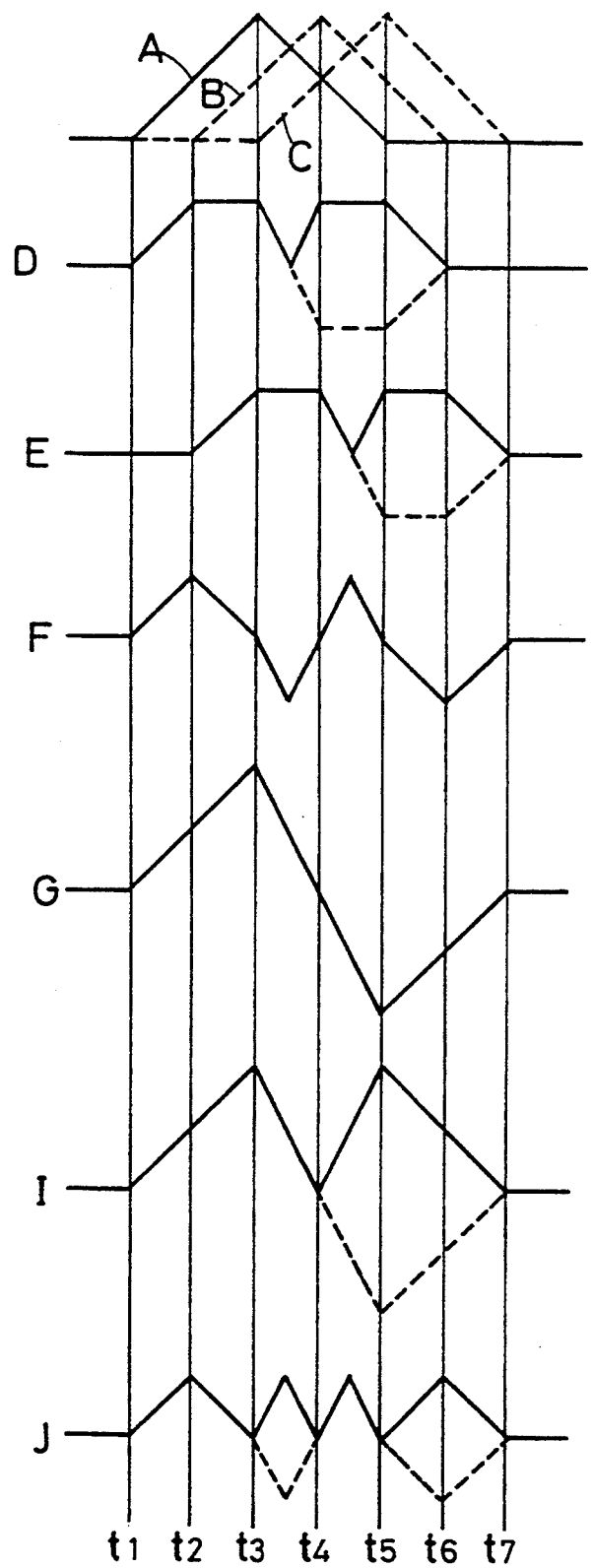
FIG. 9 is a waveform chart showing the operation of the first preferred embodiment.

For example, explained in the following will be the case where the input signal A exhibits a waveform in which it begins to rise at time $t_1$, continuously linearly rises until time $t_3$, linearly falls from the time $t_3$ to time $t_5$, and stops falling at the time $t_5$, as shown in FIG. 9.

In this case, the signal B exhibits a waveform in which it begins to rise at time $t_2$, continuously linearly rises until time $t_4$, linearly falls from the time $t_4$ to time $t_6$, and stops falling at the time $t_6$. Also, the signal C exhibits a waveform in which it begins to rise at the time $t_3$, continuously linearly rises until the time $t_5$, linearly falls from the time $t_5$ to time $t_7$, and stops falling at the time $t_7$.

The signals D and E exhibit waveforms shown in FIG. 9. For aiding comprehension, the signal (A−B) and the signal (B−C) are shown together by broken line. Waveforms of the signals F, G, I and J are also shown in FIG. 9. For aiding comprehension, the signals I and J are shown accompanied by the signals G and F of broken line.

Figure 10:
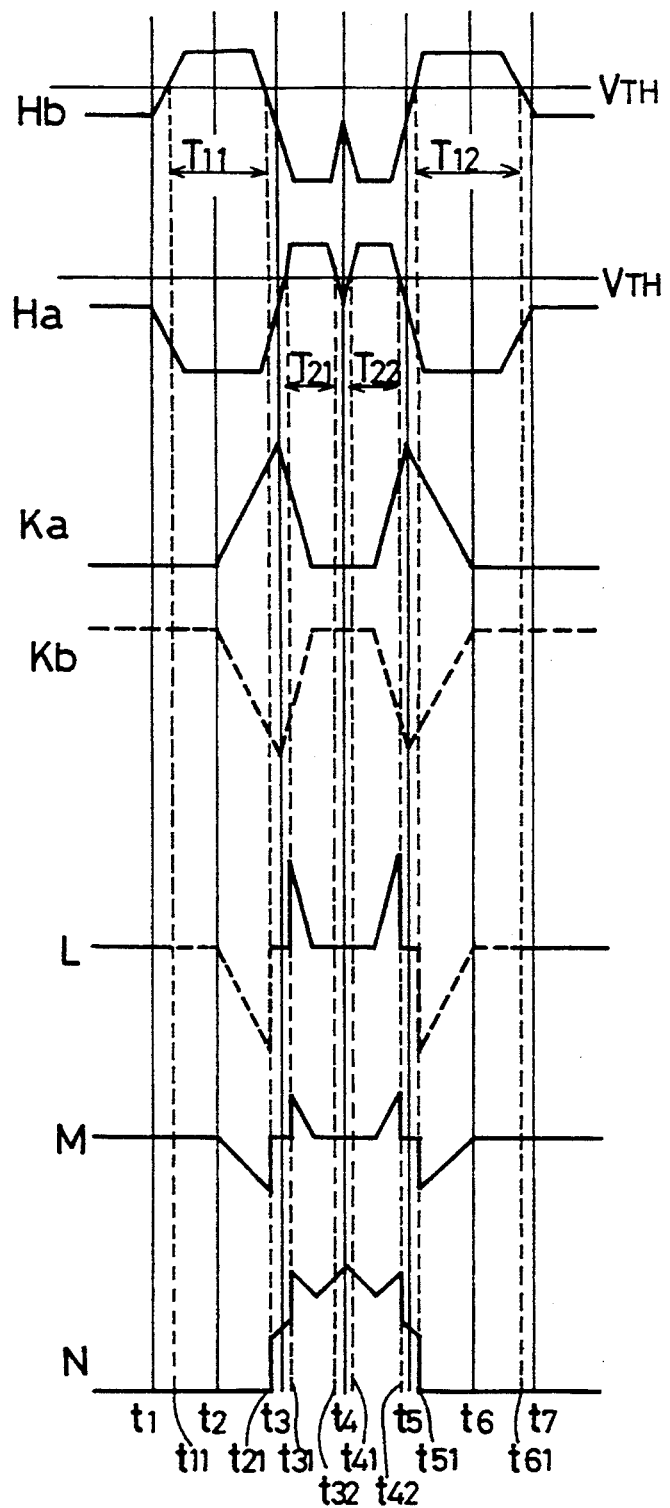
FIG. 10 is a waveform chart showing the operation of the first preferred embodiment.

Waveforms of the original correction signals Ka and Kb are shown in FIG. 10. For aiding comprehension, the original correction signal Kb is shown by broken line. Absolute values of both the signals Ka and Kb become large close to the middle of the variation in the signal B (at times $t_3$ and $t_5$) where and when waveform shaping of the signal B is performed hard. On the contrary, they become small close to ends of variation in the signal B (at times $t_2$, $t_4$, and $t_6$) where and when the waveform shaping of the signal B is not performed so hard. The signals Ka and Kb take the value "0" from time $t_1$ to the time $t_2$, and from the time $t_6$ to time $t_7$ when the signal B does not vary. Thus, as previously mentioned, no unrequited signal processing is performed.

FIG. 10 shows waveforms of the control signals Ha and Hb. The control circuit 13 outputs the original correction signal Kb for a period $T_{11}$ (from time $t_{11}$ to time $t_{21}$) and a period $T_{12}$ (from time $t_{51}$ to time $t_{61}$) when the control signal Hb is more than the threshold voltage $V_{TH}$, or the original correction signal Ka for a period $T_{21}$ (from time $t_{31}$ to time $t_{32}$) and a period $T_{22}$ (from time $t_{41}$ to time $t_{42}$) when the control signal Ha is more than the threshold voltage $V_{TH}$), as a quasi-correction signal L in any case. For aiding comprehension, the waveform corresponding to the periods when the original correction signal Kb is selected is drawn by broken line.

The correction signal M varies hard close to the middle of the variation in the signal B (at times $t_3$ and $t_5$) but not vary close to an extreme value of the signal B, as shown in FIG. 10. Thus, a waveform of the output signal N for the periods $T_{21}$ and $T_{22}$ exhibits a shape more improved than a shape of a waveform the output signal Na shown in FIG. 66 exhibits from time $t_{30}$ to time $t_{40}$.

Figure 11:
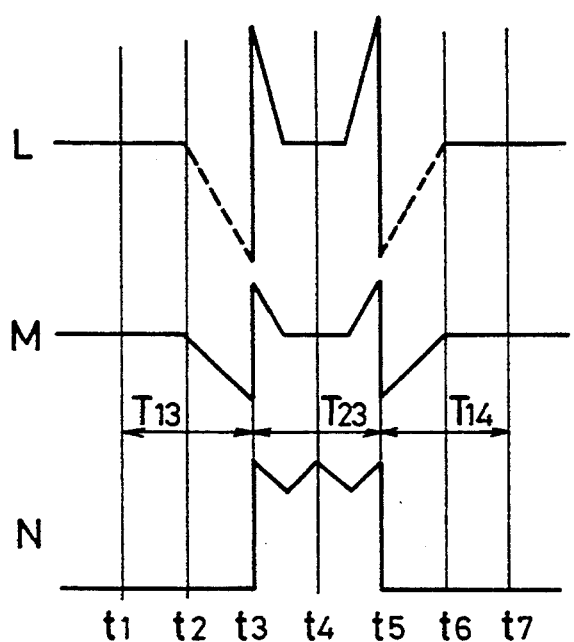
FIG. 11 is a waveform chart showing the operation of the first preferred embodiment.

FIG. 11 shows the case where the threshold voltage $V_{TH}$ is further reduced while the sensitivity of the control circuit 13 is raised in order to improve rising of the output signal N from the time $t_{21}$ to the time $t_{31}$ and falling of the output signal N from the time $t_{42}$ to the time $t_{51}$. For aiding comprehension, a waveform of the quasi-correction signal L is drawn by broken lines corresponding to the periods when the original correction signal Kb is selected.

Periods $T_{13}$ and $T_{14}$ when the control signal Hb is more than the threshold voltage $V_{TH}$ extend from time $t_1$ to time $t_3$, and from time $t_5$ to time $t_7$, respectively. A period $T_{23}$ when the control signal Hb is more than the threshold voltage $V_{TH}$ extends from the time $t_3$ to the time $t_5$. In this case, no unrequited signal processing is performed close to the extreme value of the signal B (at time $t_4$).

Figure 66:
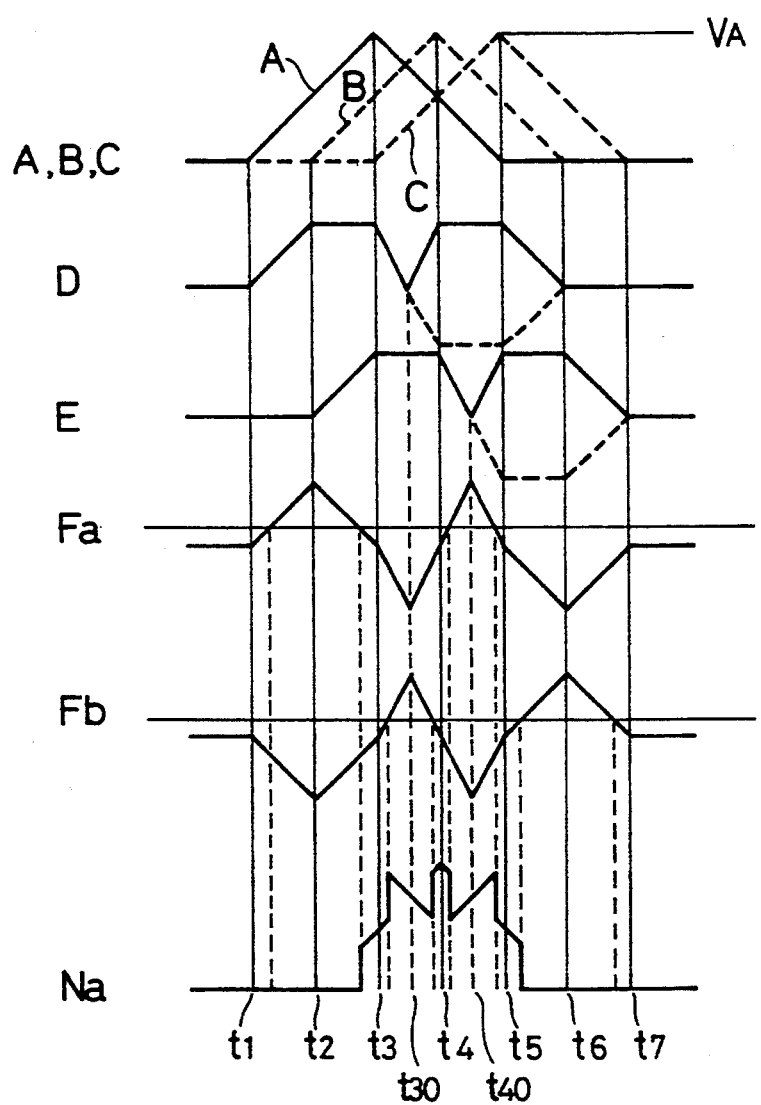
FIG. 66 is a waveform chart showing the prior art technology.

Thus, the output signal N exhibits a waveform more improved than the waveform the output signal Na shown in FIG. 66 exhibits from the time $t_{31}$ to the time $t_{41}$. Thus, while an unrequited signal processing is avoided for a period when the variation in the signal B is small, the output signal N can be obtained which is shaped in waveforms by improving rising and falling thereof.

(A-2) Second Preferred Embodiment

Figure 12:
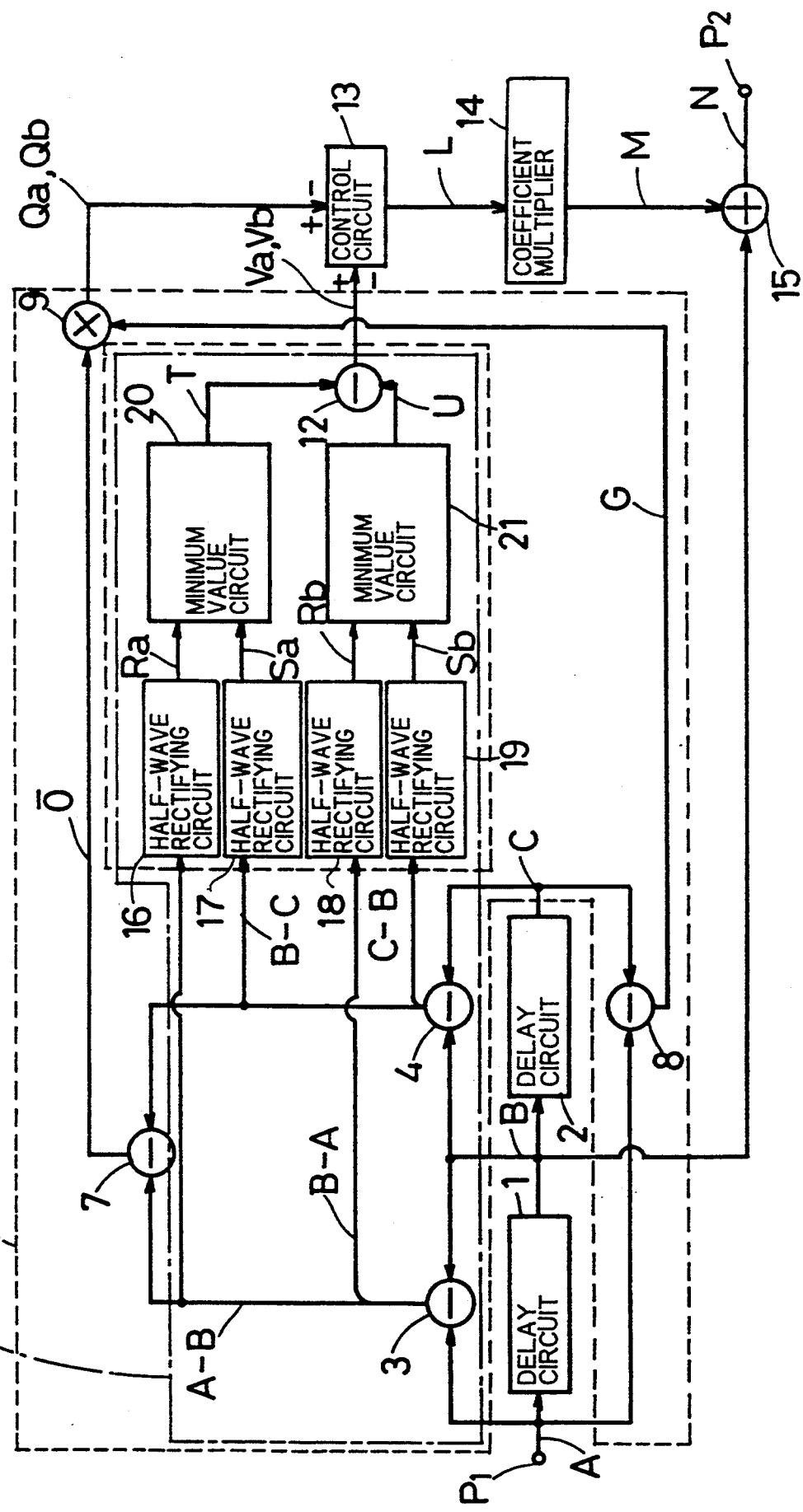
FIG. 12 is a block diagram showing a second preferred embodiment of the present invention.
Figure 13:
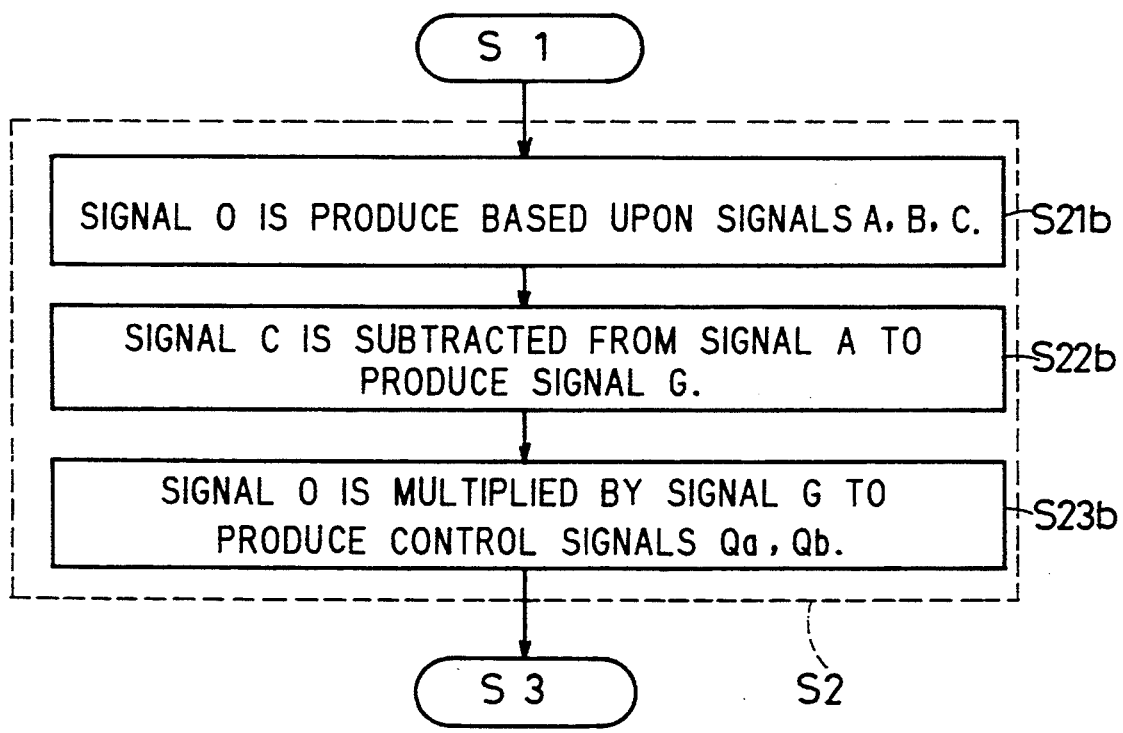
FIG. 13 is a flow chart showing a procedure of the second preferred embodiment.
Figure 14:
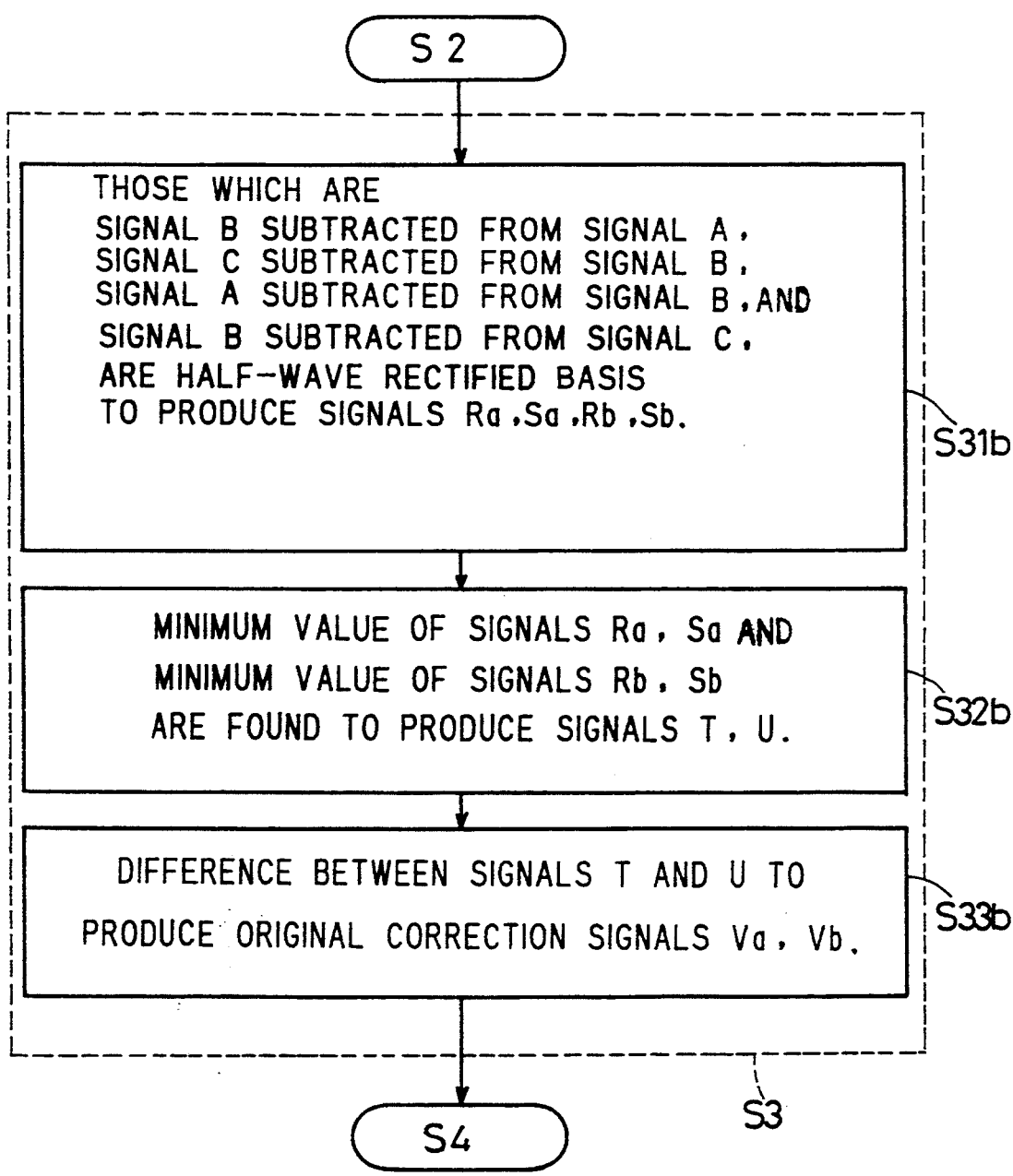
FIG. 14 is a flow chart showing the procedure of the second preferred embodiment.
Figure 15:
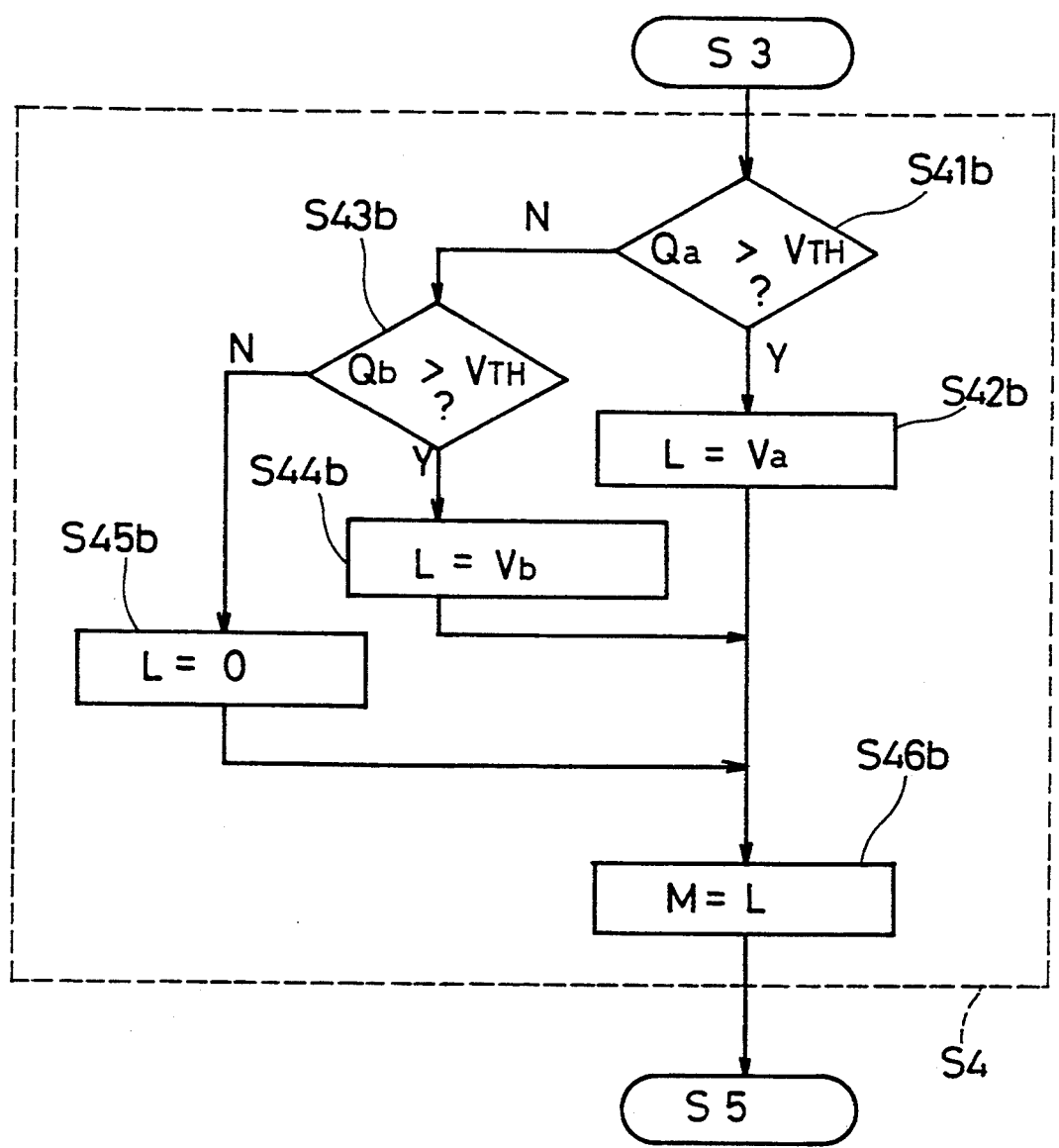
FIG. 15 is a flow chart showing the procedure of the second preferred embodiment.

FIG. 12 shows a block diagram of a second preferred embodiment of the present invention, and FIGS. 13 through 15 show flow charts thereof, respectively. The second preferred embodiment utilizes a different way of arithmetic operation from the first preferred embodiment to get similar effects. Half-wave rectifier circuits 16, 17, 18 and 19 are connected to subtractors 3, 4, 3, 4 in this order, respectively, and convert signals (A−B), (B−C), (B−A) and (C−B) to positive components alone, that is, rectify those signals to output signals Ra, Sa, Rb and Sb, respectively (step S31b).

A minimum value circuit 20 outputs a minimum value of a pair of signals, Ra and Sa, as a signal T while a minimum value circuit 21 outputs a minimum value of a pair of signals, Rb and Sb, as a signal U (step S32b).

Figure 16:
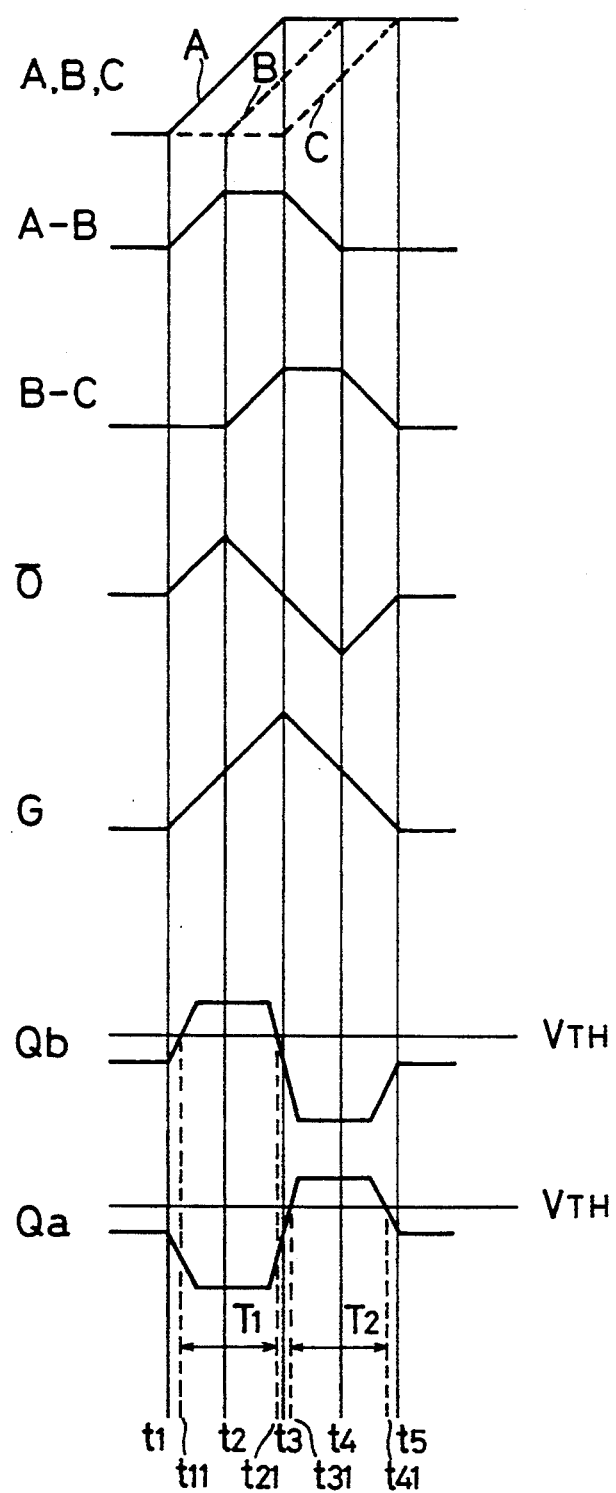
FIG. 16 is a waveform chart showing an operation of the second preferred embodiment.

Then, an operation of this embodiment will be described. FIG. 16 shows, similar to the first preferred embodiment, an input video signal A, a signal B which is obtained through a delay circuit 1, and a signal C which is obtained through the delay circuit 1 and a delay circuit 2. It also shows a signal (A−B) produced by the subtractor 3 and a signal (B−C) produced by the subtractor 4. A subtractor 7 produces a signal 0 (=A−2B+C) which is the difference between the signals from the subtractors 3 and 4 (step S21b), and a multiplier 9 multiplies it by a signal G (=A−C) (step S22b). As a result, control signals Qb (=O×G; however, partially saturated) and Qa (=−Qb) are found as shown in FIG. 16 (step S23b). The control signals Qa and Qb are input to a control circuit 13.

A subtractor 12 calculates original correction signals Va (=T−U) and Vb (=U−T) which are the differences between the signals T and U (step S33b). The original correction signals Va and Vb are the bases of a correction signal. In FIG. 12, a block 200b is an original correction signal generating unit where the original correction signals Va and Vb are generated.

Figure 17:
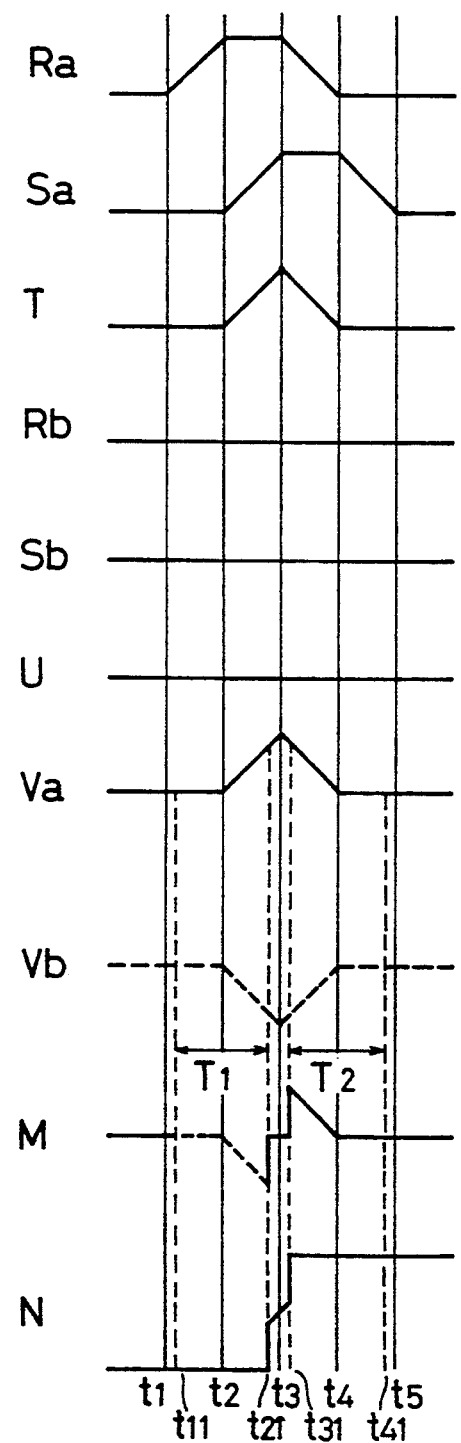
FIG. 17 is a waveform chart showing the operation of the second preferred embodiment.

Similar to the original correction signals Ka and Kb in the first preferred embodiment, the original correction signals Va and Vb take a value "0" when and where the signal (A−B) and the signal (B−C) are different in polarity (positive and negative, or vice versa) from each other, and hence, an unrequited signal processing never be performed. FIG. 17 shows waveforms of the signals Ra, Sa, T, Rb, Sb, U, Va and Vb. For aiding comprehension, the original correction signal Vb is shown by broken lines.

Similar to the control signals He and Hb in the first preferred embodiment, the control signals Qa and Qb are compared with threshold voltage $V_{TH}$ in the control circuit 13. The control circuit 13 outputs the original correction signal Vb for a period $T_1$ (from time $t_{11}$ to time $t_{21}$) when the control signal Qb is more than the threshold voltage $V_{TH}$ (steps S41b and S42b), the original correction signal Va for a period $T_2$ (from time $t_{31}$ to time $t_{41}$) when the control signal Qa is more than the threshold voltage $V_{TH}$ (steps S43b and S44b), or the value "0" when any other conditions are satisfied (step S45b), as a quasi-correction signal L in any case (step S46b).

The control circuit 13 is further connected to a coefficient multiplier 14 where the quasi-correction signal L is multiplied by a specified coefficient to be a correction signal M. For aiding comprehension, the correction signal M is partially shown by broken line in a part based upon the original correction signal Vb.

A point significantly different from the first preferred embodiment is that polarities of the original correction signals Va and Vb depend upon a direction of variation in the signal B, that is, whether the variation is rising or falling. Thus, unlike the case in the first preferred embodiment where the polarities of the control signals Ha and Hb depend upon the direction of the variation in the signal B, the control signals Qa and Qb should not depend upon the direction of the variation in the signal B.

Since the signals (A−B) and (B−C) are applied to the subtractor 7 without passing in the absolute value circuits, both of the signals O and G depend upon the direction of the variation in the signal B. Thus, the control signal Qb which is the product of those signals do not depend upon the direction of the variation in the signal B. The same may be said of the control signal Qb.

In this embodiment, an ideal waveform shaping can be practiced when a gain of the coefficient multiplier 14 is set to 1.

Also, the same effects can be attained even if the half-wave rectifier circuits 16, 17, 18 and 19 are circuits for rectifying signals to get only negative components of them when the minimum value circuits 20 and 21 are superseded by maximum circuits.

Now explained will be an operation in the case where a signal which exhibits a dense variation in the second preferred embodiment. Signals A, B and C shown in FIG. 18 are the same signals as those shown in FIGS. 66 and 9.

Figure 18:
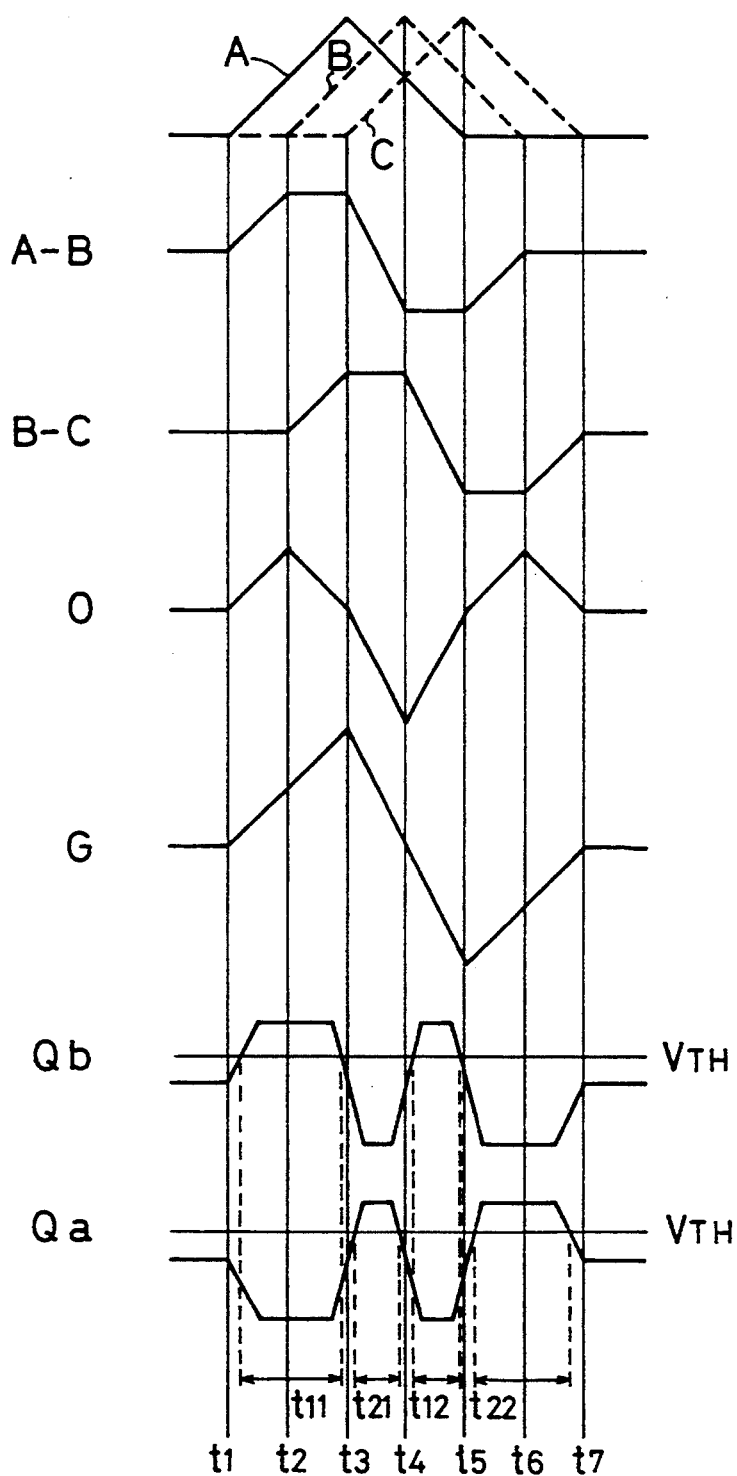
FIG. 18 is a waveform chart showing the operation of the second preferred embodiment.

As has been described, the control signals Qa and Qb have their respective polarities which do not depend upon the direction of the variation in the signal B, and they exhibit waveforms as shown in FIG. 18. The control signal Qb is more than the threshold voltage $V_{TH}$ for periods $T_{11}$ and $T_{12}$ while the control signal Qa is more than that for periods $T_{21}$ and $T_{22}$.

Figure 19:
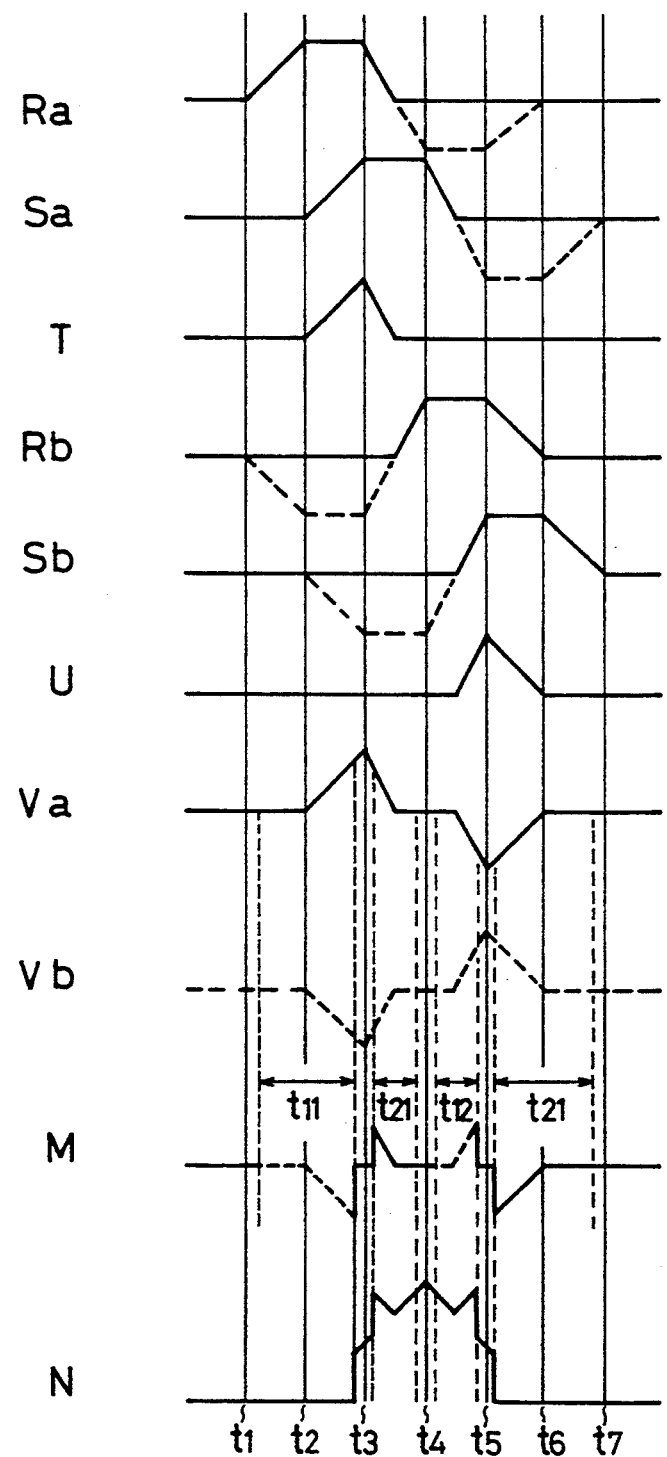
FIG. 19 is a waveform chart showing the operation of the second preferred embodiment.

Waveforms of signals Ra, Sa, T, Rb, Sb, U, Va, Vb, M, N are shown in FIG. 19. For aiding comprehension, the signals Ra, Sa, Rb and Sb are accompanied by waveforms of signals of broken line input to half-wave rectifier circuits 16, 17, 18 and 19.

Similar to FIG. 1, the original correction signals Va and Vb are large in absolute value close to the middle of the variation in the signal B (close to times $t_3$ and $t_5$) and take a value "0" close to an extreme value of the signal B (close to time $t_4$). Thus, an output signal N exhibits a waveform similar to that in the first preferred embodiment.

Figure 20:
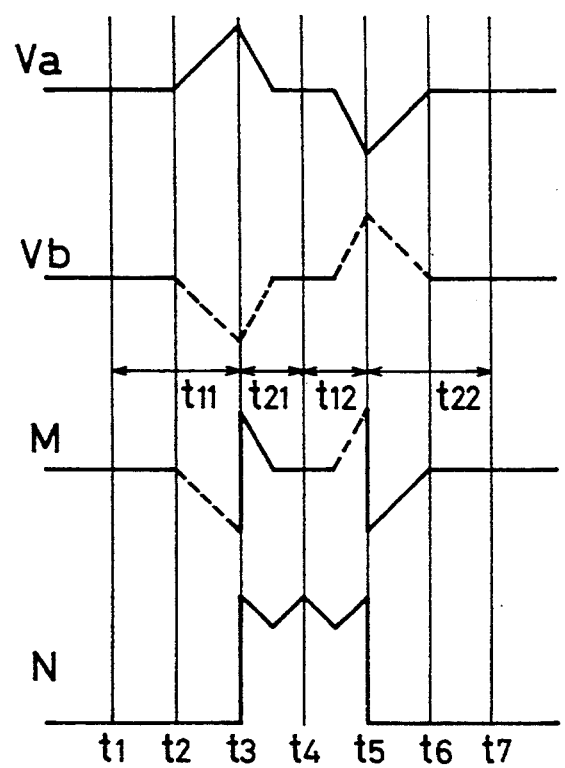
FIG. 20 is a waveform chart showing the operation of the second preferred embodiment.
Figure 67:
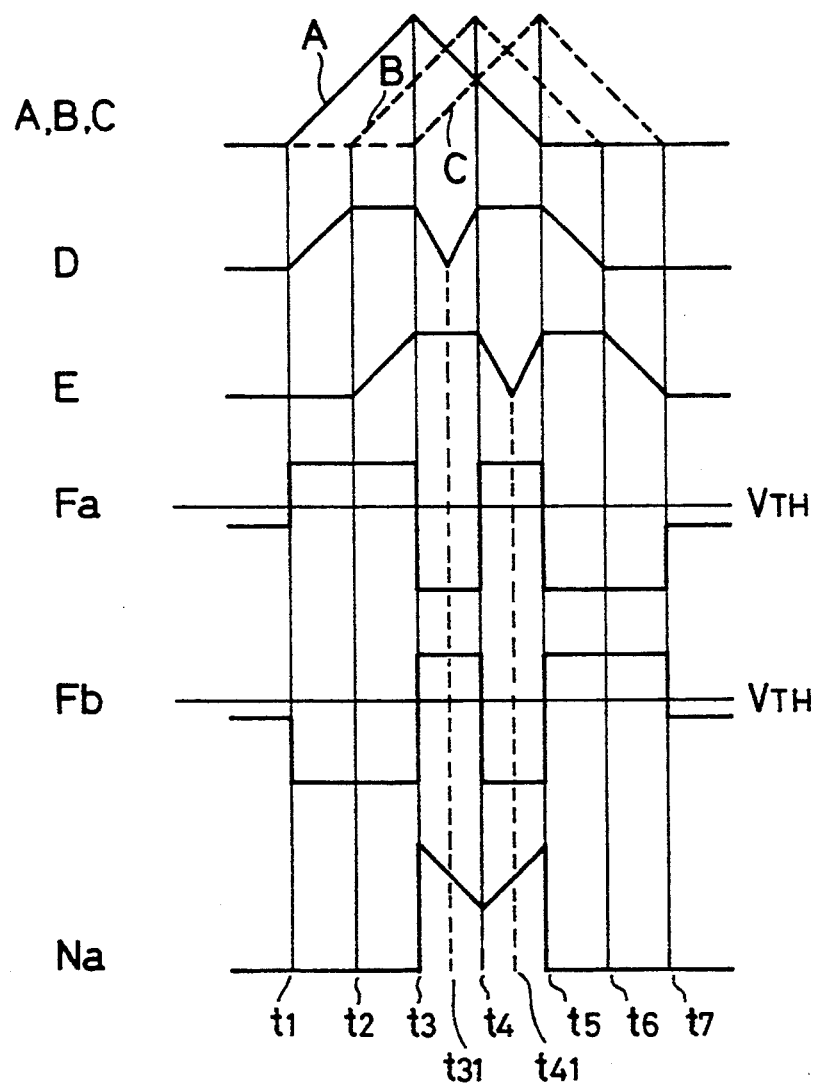
FIG. 67 is a waveform chart showing the prior art technology.

FIG. 20 shows the case where a sensitivity of the control circuit 13 is enhanced so that the output signal N may assume a sharper rising close to the time $t_3$ and a sharper falling close to the time $t_5$. In this case, also, the periods $T_{11}$ and $T_{12}$ for which the original correction signal Vb is to be output as the quasi-correction signal L, and the periods $T_{21}$ and $T_{22}$ for which the original correction signal Va is to be output as the quasi-correction signal L simply expand, and since essentially the original correction signals Va and Vb take the value "0" close to the extreme value of the signal B (close to the time $t_4$), no unrequited signal processing as shown in FIG. 67 is performed. For aiding comprehension, waveforms of the original correction signal Vb and signals based upon it are shown by broken lines.

(A-3) Example of the Control Circuit 13

Figure 21:
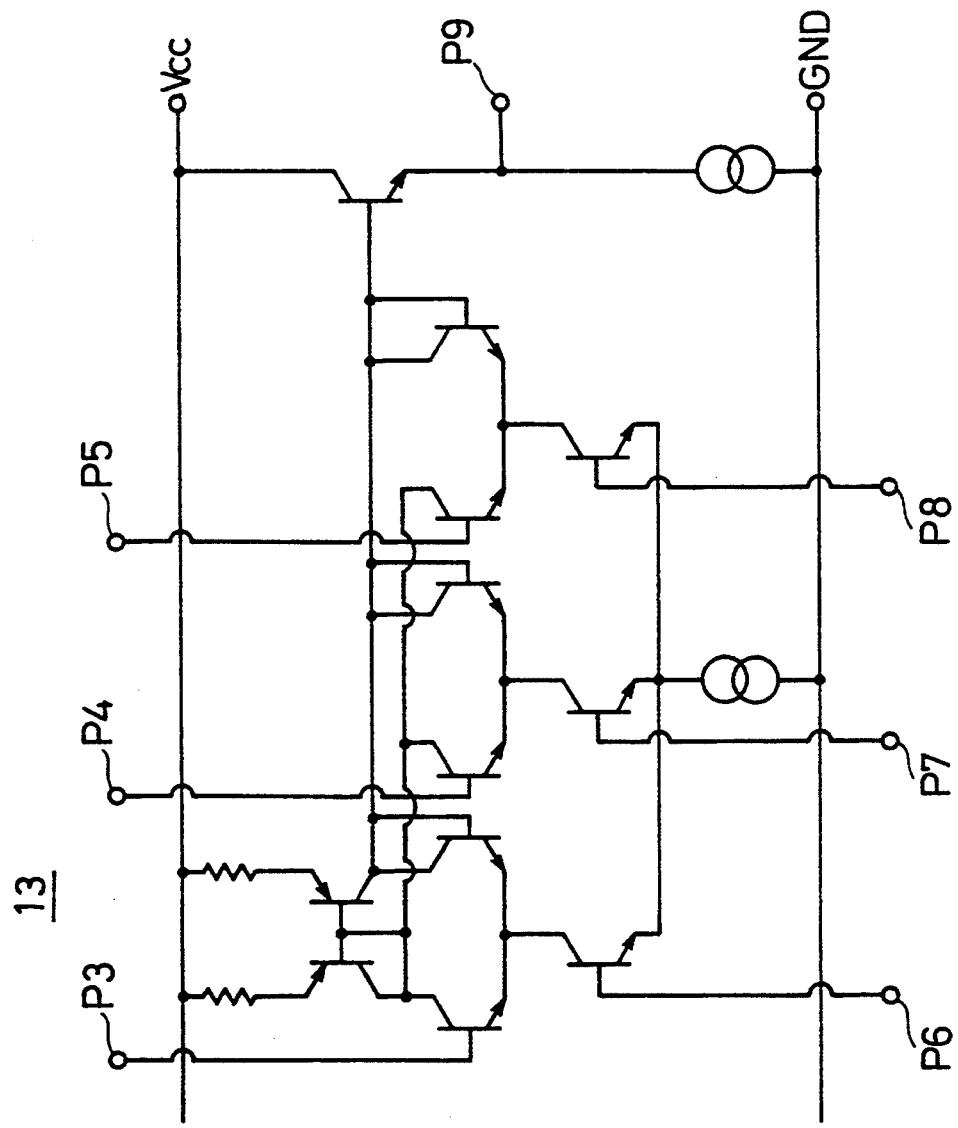
FIG. 21 is a circuit diagram showing a transistor circuit for implementing a control circuit 13.
Figure 22:
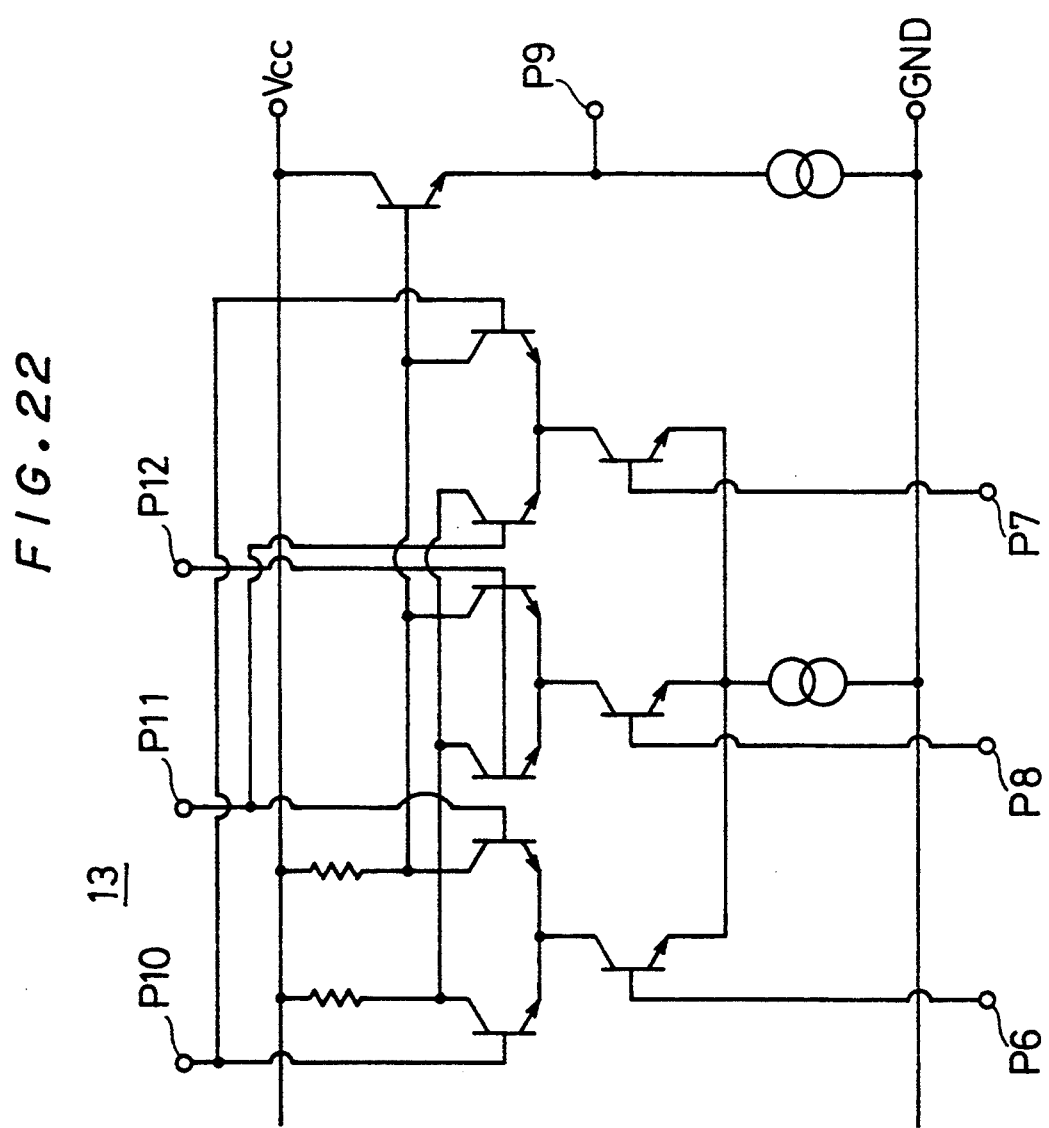
FIG. 22 is a circuit diagram showing a transistor circuit for implementing the control circuit 13.
Figure 23:
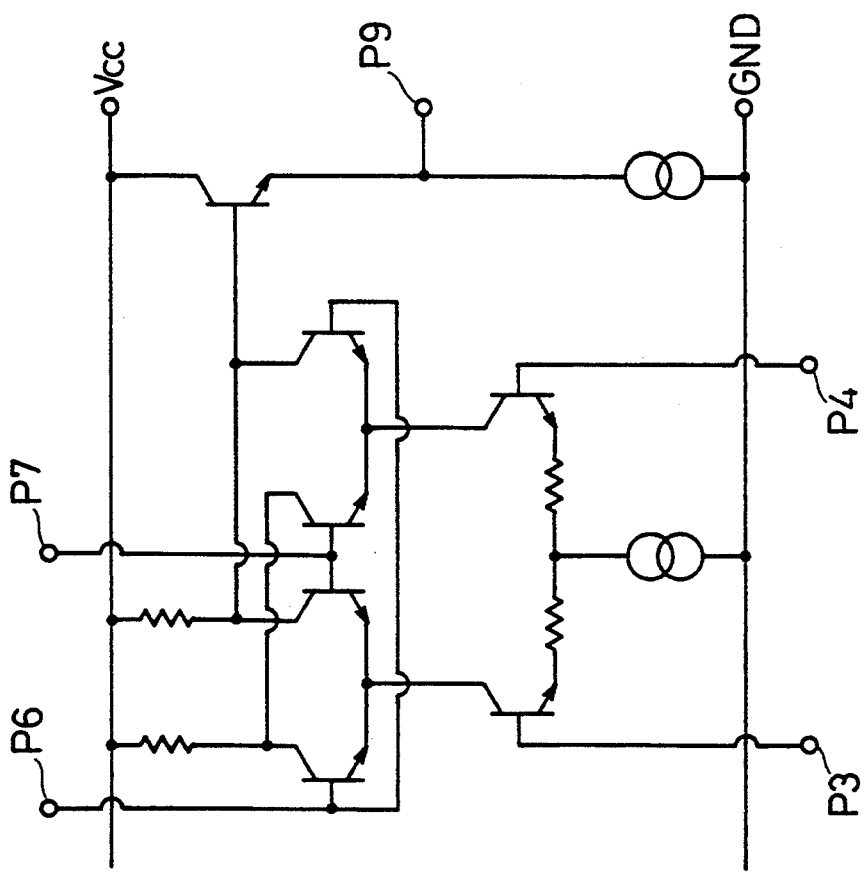
FIG. 23 is a circuit diagram showing a transistor circuit for implementing the control circuit 13.

The control circuit 13 shown in FIGS. 3 and 12 can be implemented with each of circuits shown in FIGS. 21 through 23.

FIG. 21 shows a transistor circuit having input terminals P3 through P8 and an output terminal P9. Explanation following the first preferred embodiment is that original correction signals Ka and Kb are input respectively to the input terminals P3 and P4, control signals Ha and Hb are input respectively to the input terminals P6 and P7, and a center potential (DC) and threshold voltage $V_{TH}$ of the original correction signals Ka and Kb are input respectively to the input terminals P5 and P8. The transistor circuit shown in FIG. 21 outputs a quasi-correction signal L to the output terminal P9.

FIG. 22 shows a transistor circuit having input terminals P6 through P8, input terminals P10 to P12, and an output terminal P9, respectively. To explain the first preferred embodiment is that signals obtained by logarithmically compressing original correction signals Ka and Kb are input respectively to the input terminals P10 and P11, control signals Ha and Hb are input respectively to the input terminals P6 and P7, and a center potential (DC) of signals and threshold voltage $V_{TH}$ obtained by logarithmically compressing the original correction signals Ka and Kb are input respectively to the input terminals P12 and P8. The transistor circuit shown in FIG. 22 outputs a quasi-correction signal L to the output terminal P9.

FIG. 23 shows a transistor circuit having input terminals P3, P4, P6 and P7 and an output terminal P9. Explanation following the first preferred embodiment is that original correction signals Ka and Kb are input respectively to the input terminals P3 and P4, and control signals Ha and Hb are input respectively to the input terminals P6 and P7. The transistor circuit shown in FIG. 23 outputs a quasi-correction signal L to the output terminal P9, which corresponds to the case in which the threshold voltage $V_{TH}$ is zero, as explained in FIG. 11.

Certainly, the circuits shown in FIGS. 21 through 23 function as the control circuit 13 in the second preferred embodiment. In FIG. 21, the original correction signals Va and Vb are input respectively to the input terminals P3 and P4, the control signals Qa and Qb are input respectively to the input terminals P6 and P7, and the center potential (DC) and the threshold voltage $V_{TH}$ of the original correction signals Va and Vb are input respectively to the input terminals P5 and P8. In FIG. 22, the signals obtained by logarithmically compressing the original correction signals Va and Vb are input respectively to the input terminals P10 and P11, the control signals Qa and Qb are input respectively to the input terminals P6 and P7, and the center potential (DC) and the threshold voltage $V_{TH}$ of the signals obtained by logarithmically compressing the original correction signals Va and Vb are input respectively to the input terminals P12 and P8. In FIG. 23, the original correction signals Va and Vb are input respectively to the input terminals P3 and P4, and the control signals Qa and Qb are input respectively to the input terminals P6 and P7.

In the second preferred embodiment, any of the circuits shown in FIGS. 21 through 23 outputs the quasi-correction signal L to the output terminal P9; however, since the coefficient multiplier 14 merely multiplies the quasi-correction signal L by 1, substantially it can be recognized that the correction signal M is output to the output terminal P9. Tables 1 through 3 show signals applied to the respective terminals regarding the circuits shown in FIGS. 21 through 23, respectively.

TABLE 1

| Terminals | Exemplary Input Signals to Terminals | |
|---|---|---|
| | 1st Embodiment | 2nd Embodiment |
| P3 | Ka | Va |
| P4 | Kb | Vb |
| P5 | Center DC Potential of Ka and Kb | Center DC Potential of Va and Vb |
| P6 | Ha | Qa |
| P7 | Hb | Qb |
| P8 | $V_{TH}$ | $V_{TH}$ |
| P9 | L | L |

TABLE 2

| Terminals | Exemplary Input Signals to Terminals | |
|---|---|---|
| | 1st Embodiment | 2nd Embodiment |
| P10 | Signal of Logarithmically Compressed Ka | Signal of Logarithmically Compressed Va |
| P11 | Signal of Logarithmically Compressed Kb | Signal of Logarithmically Compressed Vb |
| P12 | Center DC Potential of Signals of Logarithmically compressed Ka & Kb | Center DC Potential of Signals of Logarithmically Compressed Va & Vb |
| P6 | Ha | Qa |
| P7 | Hb | Qb |
| P8 | $V_{TH}$ | $V_{TH}$ |
| P9 | L | L |

TABLE 3

| Terminals | Exemplary Input Signals to Terminals | |
|---|---|---|
| | 1st Embodiment | 2nd Embodiment |
| P3 | Ka | Va |
| P4 | Kb | Vb |
| P6 | Ha | Qa |
| P7 | Hb | Qb |
| P9 | L | L |

B. Application for Demodulation of Chrominance Signal (B-1) First Application

Figure 24:
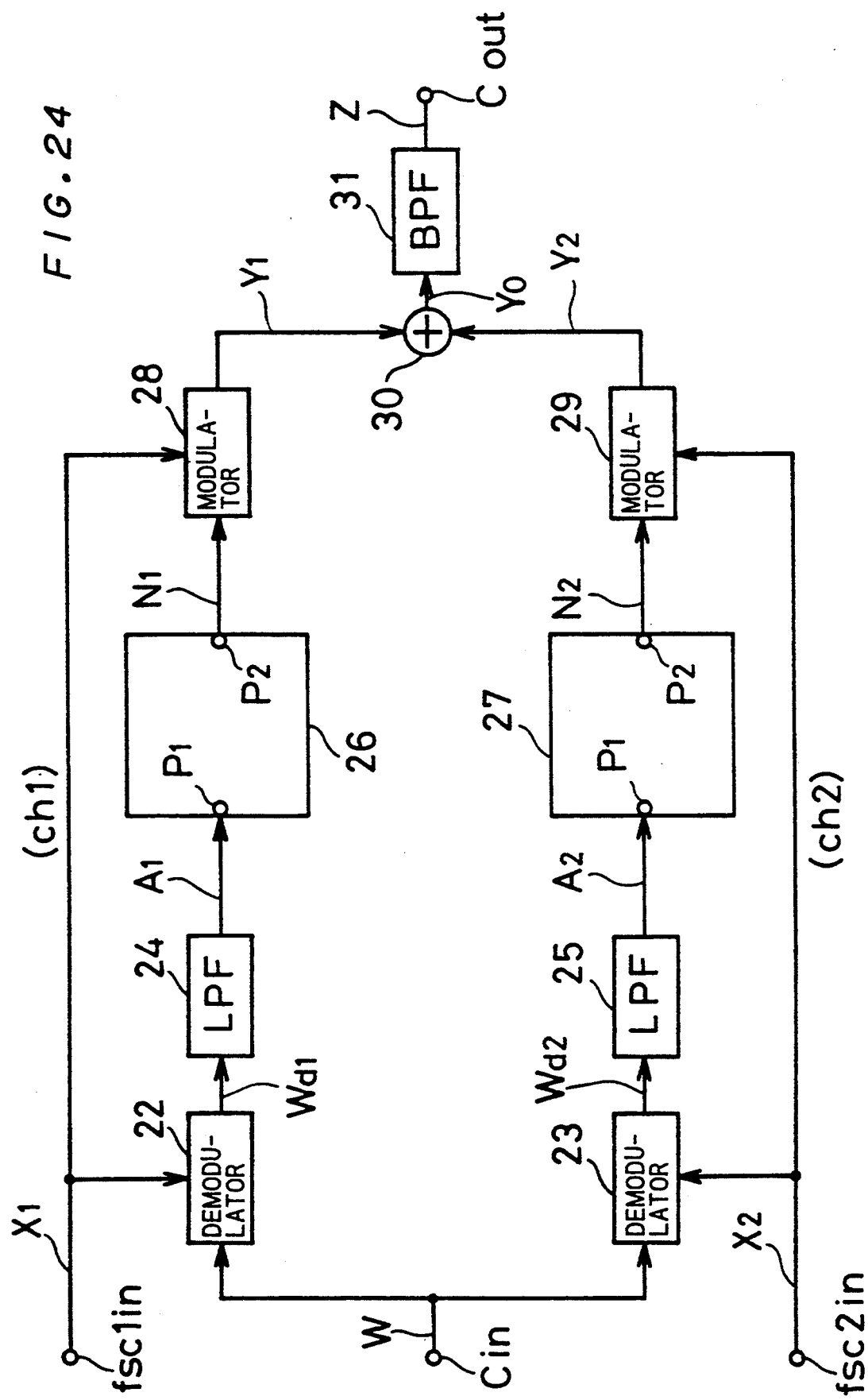
FIG. 24 is a block diagram showing a first application of the present invention.

The waveform shaping apparatus according to the present invention can be applied for demodulation of a carrier chrominance signal. FIG. 24 shows a block diagram of an apparatus for correcting a contour of a chrominance signal.

A demodulator 22 is connected to a chrominance sub-carrier input terminal $f_{SC1}$ while a demodulator 23 is connected to a chrominance sub-carrier input terminal $f_{SC2}$, and both of them are connected commonly to a chrominance signal input terminal $C_{in}$. Modulators 28 and 29 are also connected to the chrominance sub-carrier input terminals $f_{SC1}$ and $f_{SC2}$, respectively. A low-pass filter 24 and a waveform shaping apparatus 26 are connected in series between the demodulator 22 and the modulator 28, and a low-pass filter 25 and a waveform shaping apparatus 27 are connected in series between the demodulator 23 and the modulator 29, respectively. An adder 30 is connected to both of the modulators 28 and 29, and a band-pass filter 31 is connected between the adder 30 and an output terminal $C_{out}$.

Figure 25:
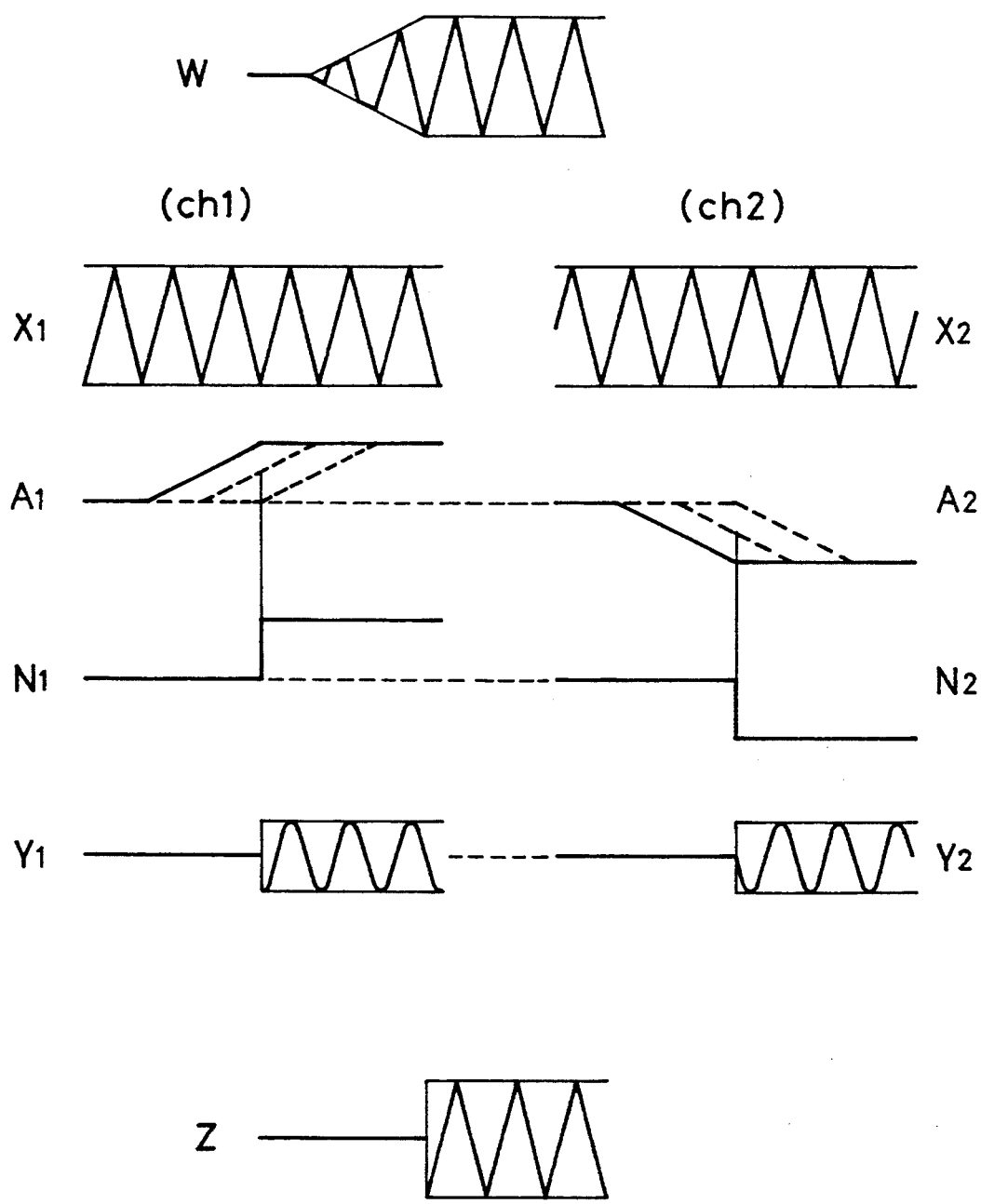
FIG. 25 is a waveform chart showing an operation of the first application.

Then, an operation of the apparatus for correcting a contour of a chrominance signal will be described. Signal waveforms in various points of FIG. 24 are shown in FIG. 25.

A carrier chrominance signal W to be improved in shape and has been modulated in quadrature two-phase is input to a chrominance signal input terminal $C_{in}$ and demodulated into base band chrominance signals $W_{d1}$, $W_{d2}$ by chrominance sub-carriers X1 and X2 which are out of phase by 90 deg. to each other. After that, a double component of a carrier developed in demodulation is eliminated by the low-pass filters 24 and 25, and consequently, base band chrominance signals A1 (a first channel ch1) and A2 (a second channel ch2) are obtained. The base band chrominance signals A1 and A2 are shaped in waveform by the waveform shaping apparatuses 26 and 27, and consequently, correction chrominance signals N1 and N2 are modulated again by the chrominance sub-carriers X1 and X2 in the modulators 28 and 29, and consequently, signals Y1 and Y2 are obtained. The signals Y1 and Y2 are added by the adder 30. The band pass filter 31 eliminates extra side bands from the sum of the signals Y1 and Y2, and consequently, a waveform-shaped carrier chrominance signal Z.

The waveform shaping apparatuses 26 and 27 have their respective terminals P1 and P2, and both of them can be provided in either the first or second preferred embodiment.

In the apparatus for correcting a contour of a chrominance signal shown in FIG. 24, the two waveform shaping apparatuses 26 and 27 operate in accordance with the independent control signals Ha and Hb (or Qa and Qb), and therefore, an amount of correction in proportion to an amount of variation in a contour, that is, the amount of correction without threshold value is required. If the waveform shaping apparatuses 26 and 27 have their respective control circuits 13 which require the threshold voltage $V_{TH}$, the two waveform shaping apparatuses do not necessarily operate simultaneously with each other. This is because correcting the contour of one channel alone causes the part to vary in hue.

Thus, the control circuits 13 in the waveform shaping apparatuses 26 and 27 are desirably the transistor circuit shown in FIG. 23 which has not the threshold voltage $V_{TH}$ and linearly operates.

(B-2) Second Application

Even if the control circuits 13 of the two waveform shaping apparatuses 26 and 27 require the threshold voltage $V_{TH}$, synchronous operation of them do not cause a contour of one channel alone to be corrected and do not cause hue of the contour to vary.

Figure 26:
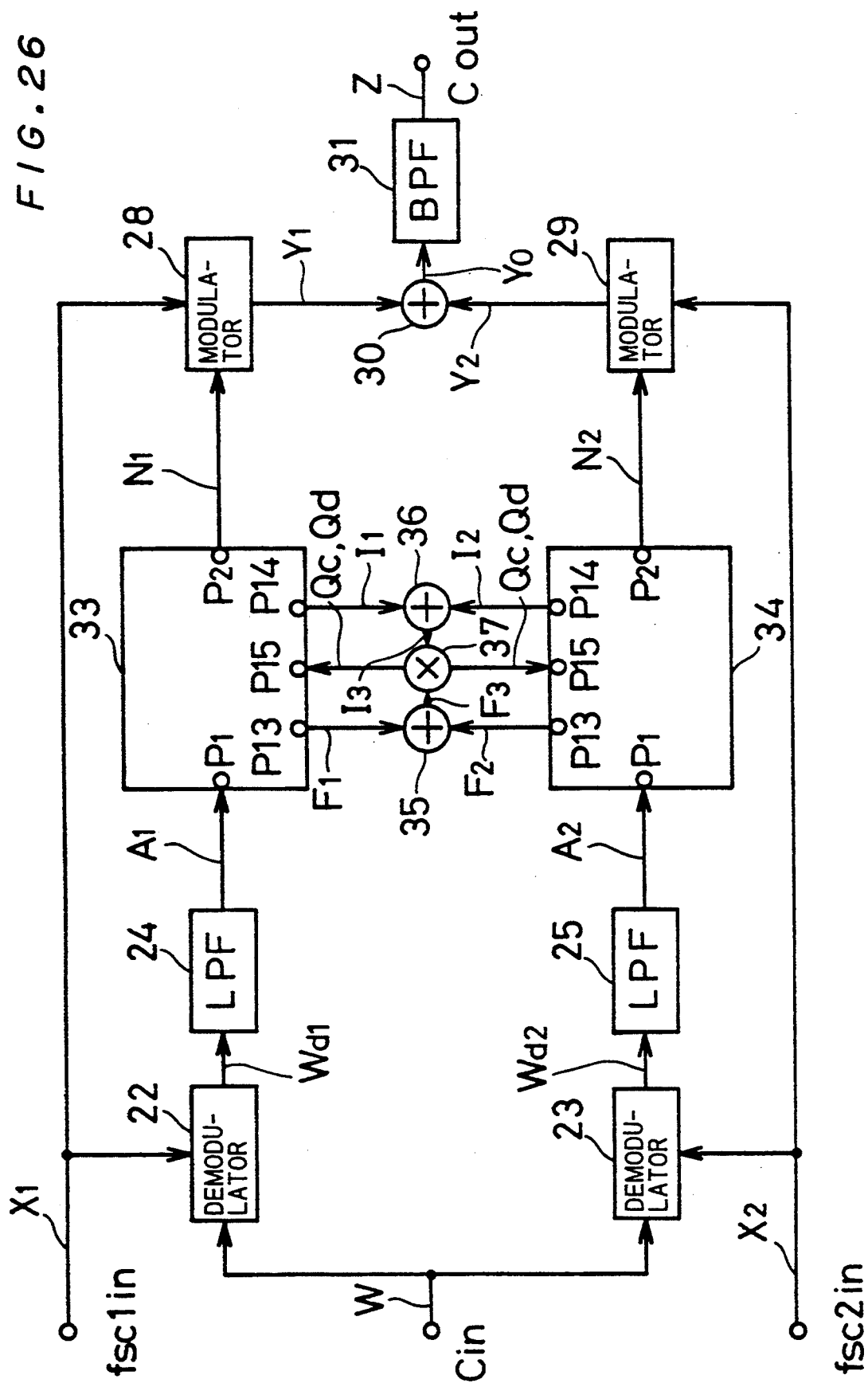
FIG. 26 is a block diagram showing a second application of the present invention.

A block diagram of the second application is shown in FIG. 26. Instead of the waveform shaping apparatuses 26 and 27 in the first application, waveform shaping apparatuses 33 and 34 are provided between the low-pass filter 24 and the modulator 28, and between the low-pass filter 25 and the modulator 29, respectively. Between the waveform shaping apparatuses 33 and 34, adders 35 and 36, and a multiplier 37 are provided.

Figure 27:
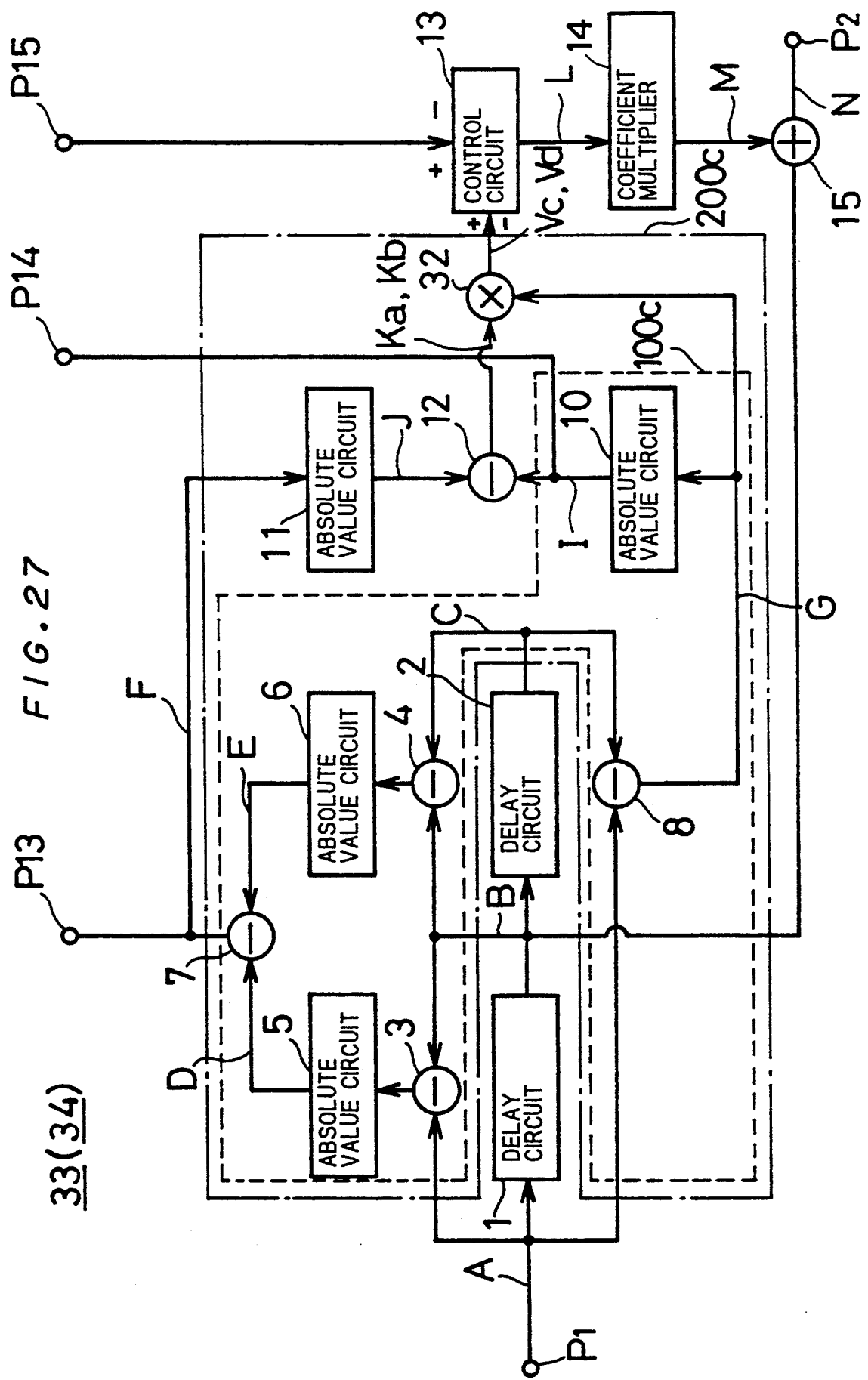
FIG. 27 is a block diagram showing an exemplary configuration of a waveform shaping apparatus 33 (34)
Figure 28:
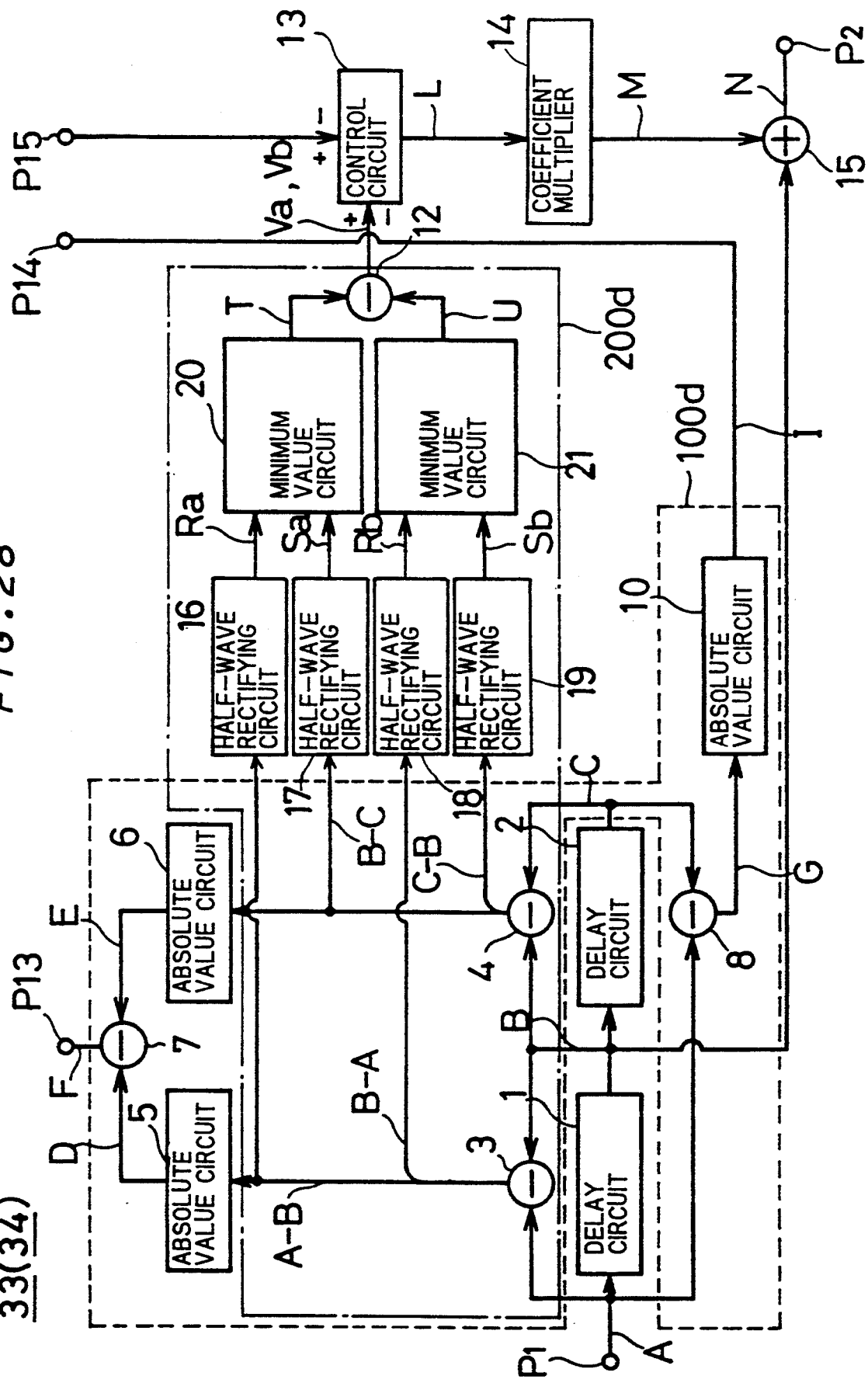
FIG. 28 is a block diagram showing an exemplary configuration of the waveform shaping apparatus 33 (34)

The waveform shaping apparatuses 33 and 34 are configured as shown in FIG. 27 or FIG. 28. To attain a good correction, it is desirable that both the waveform shaping apparatuses 33 and 34 have the same configuration. The configuration shown in FIG. 27 corresponds to the first preferred embodiment while the configuration shown in FIG. 28 corresponds to the second preferred embodiment. The latter includes absolute value circuits 5, 6 and 10 comparing with the second preferred embodiment.

In any configuration, a first original control signal F which is an absolute value of the difference between the signal (A−B) and the signal (B−C), and a second original control signal I which is an absolute value of the signal G are output to the terminals P13 and P14, respectively. Either of the first and second original control signals F and I are the basis of the control signals. In each of FIGS. 27 and 28, blocks 100c and 100d are original control signal generating means for generating the first and second original control signals F and I.

The first and second original control signals F and I output from the waveform shaping apparatus 33 are identified with signals F1 and I1, respectively, while the first and second original control signals F and I output from the waveform shaping apparatus 34 are identified with signals F2 and I2, respectively.

Neither of the configurations shown in FIGS. 27 and 28 has the multiplier 9. This means the signal F is not multiplied by the signal G (or the signal O). Instead, the signals F1 and I1 are input through adders 35 and 36, respectively, to a multiplier 37. Similarly, the signals F2 and I2 are input through the adders 35 and 36, respectively, to the multiplier 37. In other words, the signals F1 and F2, and the signals I1 and I2 are added to each other by the adders 35 and 36, respectively, to be signals F3 and I3, respectively. The signals F3 and I3 are multiplied in the multiplier 37, and consequently, control signals Qd (=F3×I3; however, partically saturated) and Qc (=−Qd) are obtained, both of which are transmitted to the terminals P15 of the waveform shaping apparatuses 33 and 34.

Figure 31:
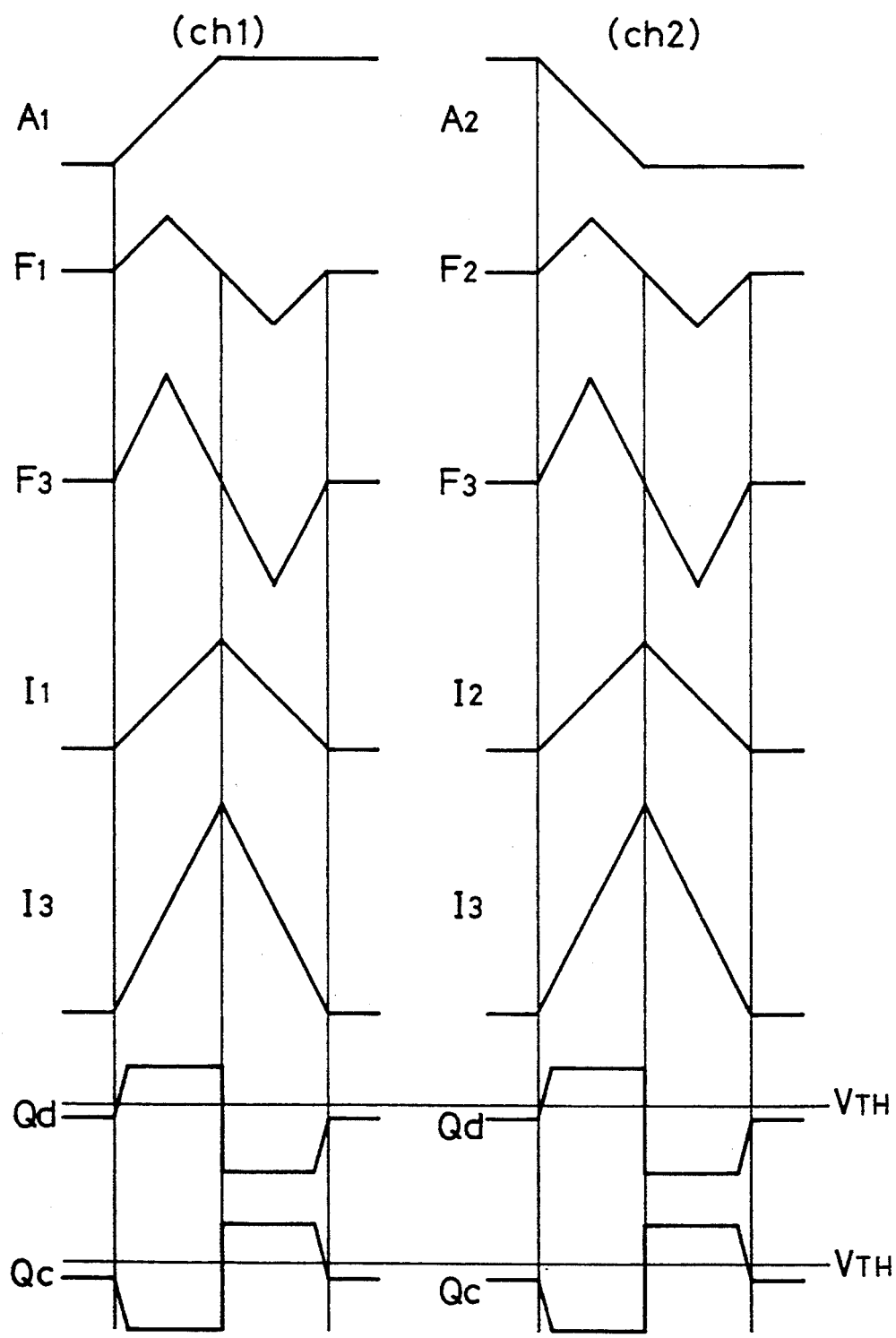
FIG. 31 is a waveform chart showing the operation of the second application.

The control signals Qc and Qd are produced as mentioned above, and polarities of the first and second original control signals F and I do not depend upon whether variation in the signal to be shaped in waveform is rising or falling, as explained in the first preferred embodiment, and hence, polarities of the control signals Qc and Qd do not depend upon whether the variation in the signal to be shaped in waveform is rising or falling. FIG. 31 shows waveforms of the signals F1, I1, F2, I2, F3, I3, Qc, and Qd along with the base band chrominance signals A1 and A2.

For the above-mentioned reason, the original correction signals, which are controlled by the control signals Qc and Qd as to whether or not they are to be output as the quasi-correction signal through the control circuit 13, have their respective polarities which must be inverted depending upon whether the variation of the signal to be shaped in waveform is rising or falling.

Figure 29:
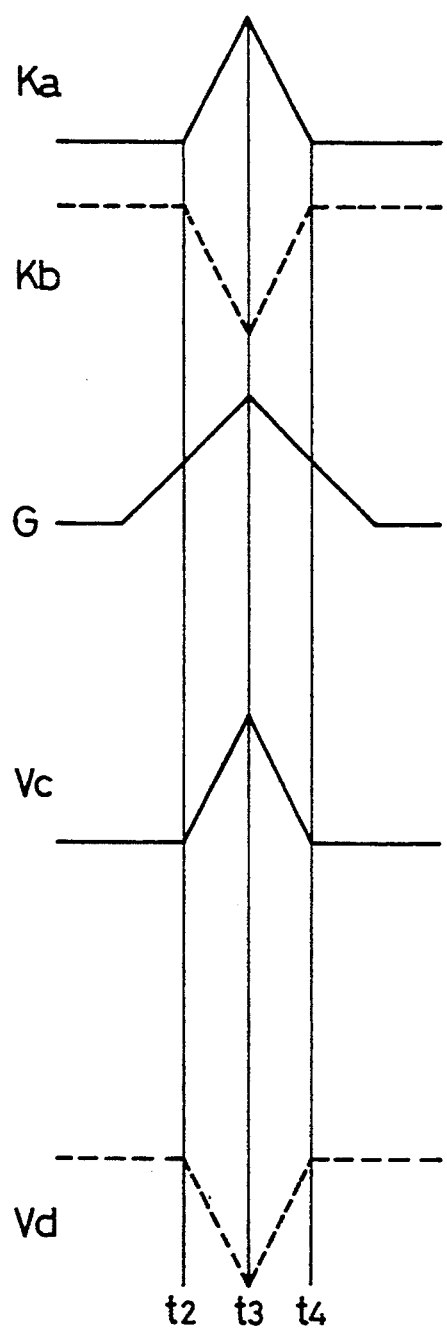
FIG. 29 is a waveform chart showing an operation of the second application.
Figure 30:
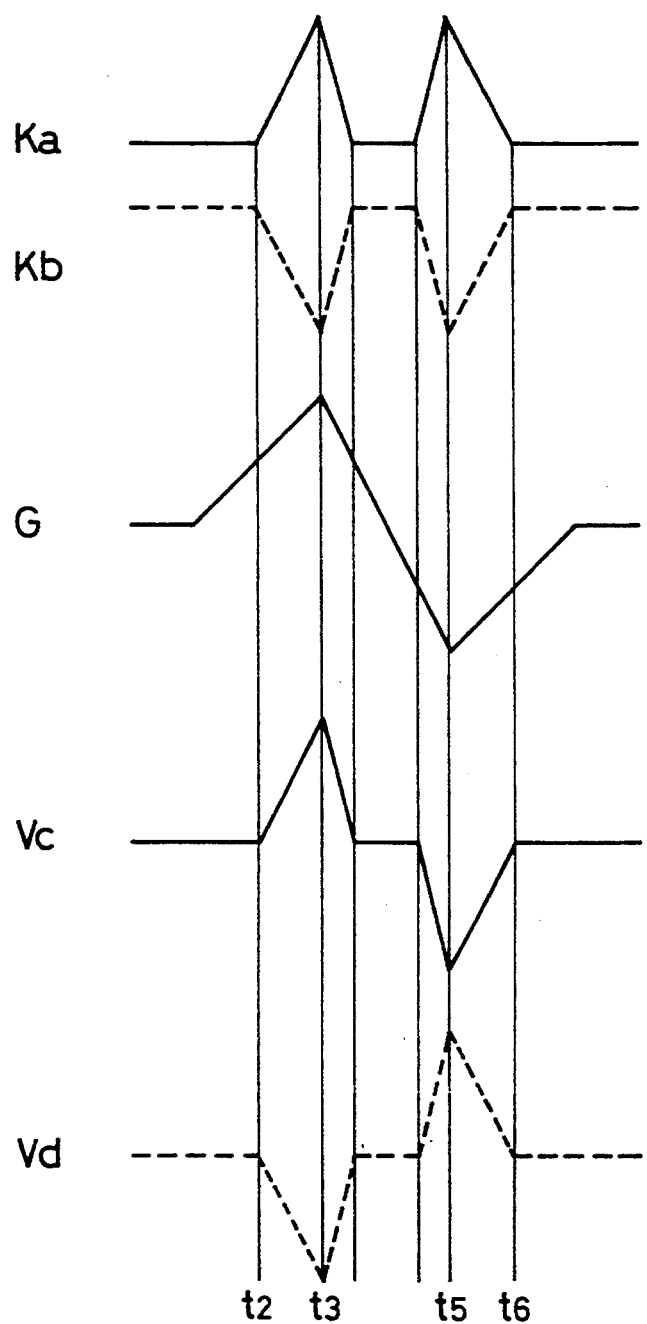
FIG. 30 is a waveform chart showing the operation of the second application.

Thus, in the configuration of FIG. 27 corresponding to the first preferred embodiment, a multiplier 32 is provided, where the signals Ka and Kb which are the original correction signals in the first preferred embodiment are further multiplied by the signal G to produce the original correction signals Vc and Vd, respectively. Waveforms of them are shown in FIG. 29 as the case corresponding to FIG. 8 and in FIG. 30 as the case corresponding to FIG. 10, respectively. Waveforms shown by broken lines indicate the same as what is in FIG. 8 and the like.

In the configuration of FIG. 28 corresponding to the second preferred embodiment, polarities of the signals Va and Vb are inverted depending upon whether variation in a signal to be shaped in waveform is rising or falling, and hence, these signals can be employed as the original correction signals.

In each of FIGS. 27 and 28, blocks 200c and 200d are original correction signal generating means for generating the original correction signals Vc and Vd, and the original correction signals Va and Vb, respectively.

Then, an operation of the configuration will be described. In FIG. 31, signal waveforms regarding the control signals Qc and Qd are shown. Base band chrominance signals A1 (a first channel ch1) and A2 (a second channel ch2) which have been demodulated by the demodulators 22 and 23 are applied to the waveform shaping apparatuses 33 and 34, respectively. The control signals Qc and Qd applied to the terminals P15 of the waveform shaping apparatuses 33 and 34, respectively, are utilized to shape the signals A1 and A2 in waveform in the same way as in the second preferred embodiment. A signal processing for signals other than the control signals are the same as in the first application.

In the second application, the signals Qc and Qd are produced based upon the signals F3 and I3, which are the sum of the signals F1 and F2, and the sum of the signals I1 and I2, respectively. Thus, the signals Qc and Qd become easily more than the threshold voltage $V_{TH}$ in the control circuits 13 of the waveform shaping apparatuses 33 and 34.

Moreover, since the signals Qc and Qd are common to the control circuits 13 in the waveform shaping appratuses 33 and 34, no harmful influence, such as a change in hue because of correcting a contour of one channel alone, arises even with a configuration where the control circuits 13 have the threshold voltage $V_{TH}$ and/or any of transistor circuits as shown in FIGS. 21 and 22 is used, so far as the same threshold voltage $V_{TH}$ is held equally in both the waveform shaping apparatuses 33 and 34.

(B-3) Third Application

The control circuits 13 of the waveform shaping apparatuses 33 and 34 in the second application can be controlled in accordance with a chrominance contour signal and a luminance contour signal. A third application configured in this way is shown in a block diagram of FIG. 32. In addition to the components of the second application, a contour signal generator 39, limiters 38 and 40, and an adder 41 are provided, and the signal F3 is not input directly to the multiplier 37 but input through the limiters 38 and adder 41 to the multiplier 37.

(B-3-1) First Exemplary Configuration

Figure 33:
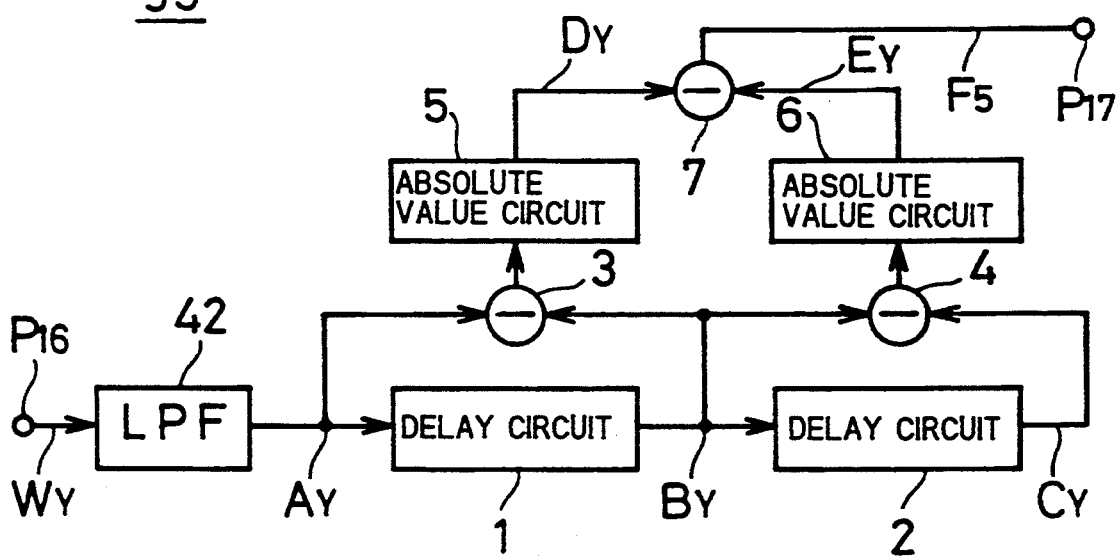
FIG. 33 is a block diagram showing a first exemplary configuration of the third application.

A configuration of the contour signal generator 39 is shown in a block diagram of FIG. 33 while signal waveforms at various points therein are shown in FIG. 34. The contour signal generator 39 are configured similar to part of the waveform shaping apparatuses (FIGS. 27 and 28) except that it has a low-pass filter 42, an input terminal P16, and an output terminal P17.

A luminance signal $W_Y$ is input through a luminance signal input terminal $Y_{in}$ to the input terminal P16, and it is turned to a signal $A_Y$ of which band width is limited by the low pass filter 42 so as to be applied to both the delay circuit 1 and the subtractor 3. At the following stages, delay signals $B_Y$ and $C_Y$, signals $D_Y$ and $E_Y$ which are outputs from the absolute value circuits 5 and 6, and a signal F5 which is the difference between the signals $D_Y$ and $E_Y$ can be obtained through the same signal processing as in the first preferred embodiment. The signal F5 is used as a luminance contour signal. The luminance contour signal F5 is processed almost the same as the chrominance contour signal F3, and therefore, there is no need of adjusting a time delay due to the delay circuit.

Figure 35:
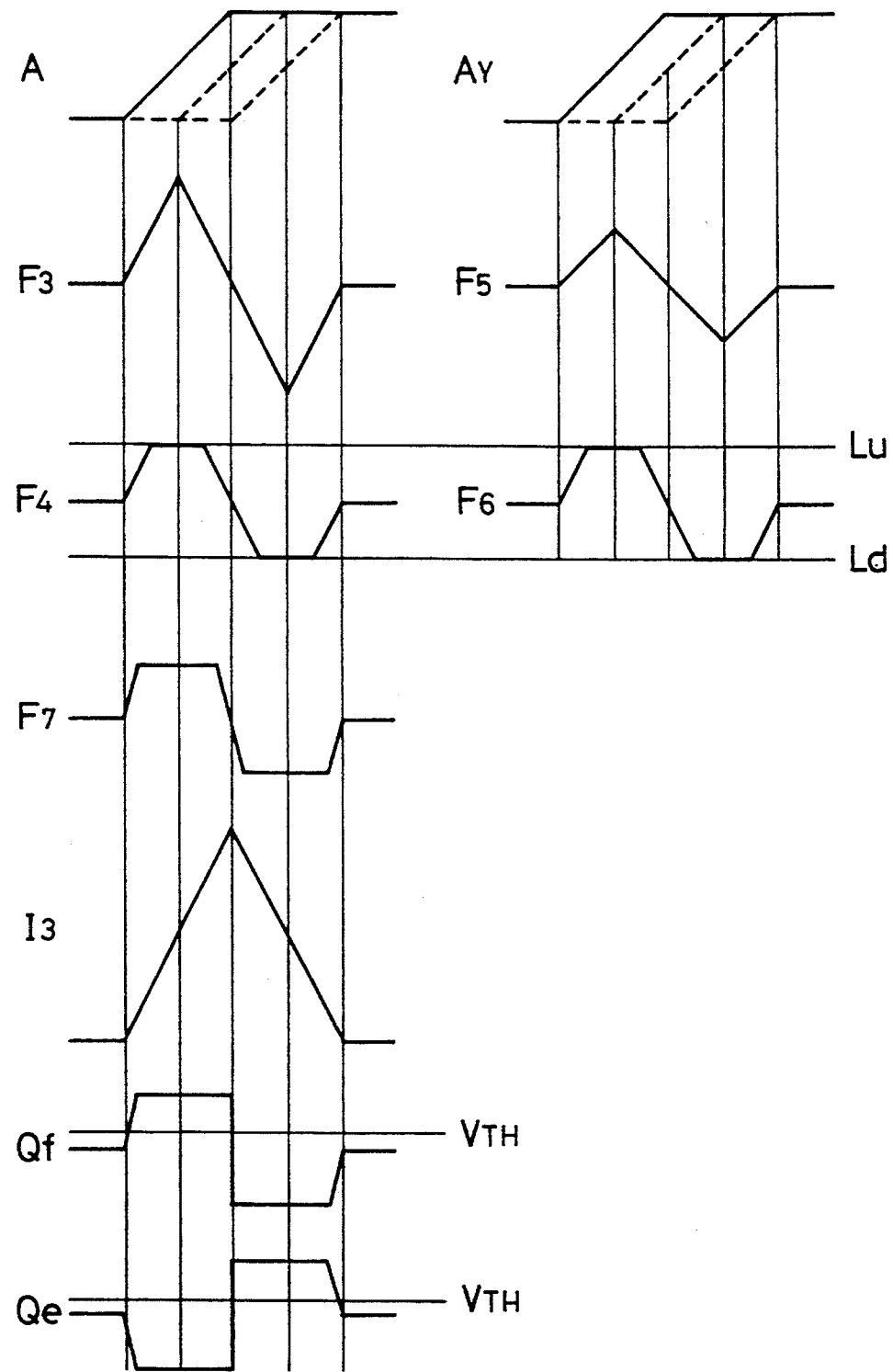
FIG. 35 is a waveform chart showing the operation of the first exemplary configuration of the third application.

As previously mentioned, the luminance contour signal F5 is obtained based upon the luminance signal $W_Y$ by the contour signal generator 39. Those two contour signals F3 and F5 are amplified with an appropriate gain by the limiters 38 and 40, and signals F4 and F6 which exhibit waveforms where upper and lower sections are sliced at an upper limit Lu and a lower limit Ld. FIG. 35 shows waveforms of the signals F3, F4, F5 and F6.

The signals F4 and F6 are added by the adder 41, and an output signal F7 is applied to the multiplier 37. On the other hand, a signal I3 is applied to the multiplier 37 similar to the second application. The multiplier 37 multiplies the signal F7 by the signal I3, and the product is output as control signals Qf ($=F7 \times I3$; however, partially saturated) and Qe ($=-Qf$) to the control circuits 13 of the waveform shaping apparatuses 33 and 34. Waveforms of the signals FT, I3, Qe and Qf are shown in FIG. 35.

Thus, the control signals Qe and Qf are produced, adjusting to the luminance contour chrominance signal F5 which is added to the chrominance contour signal F3 in the adder 41. For the reason, a chrominance signal can be shaped in waveform without deviating from a contour of a luminance signal. In reverse, appropriately applying the threshold voltage $V_{TH}$ of the control circuit 13, waveform shaping of a luminance contour of the luminance signal other than a chrominance contour can be avoided. Especially, in a reproduction signal of VTR, a luminance signal is better at signal to noise ratio compared with a chrominance signal, and therefore, corrected chrominance variation points are stabilized.

(B-3-2) Second Exemplary Configuration

Figure 36:
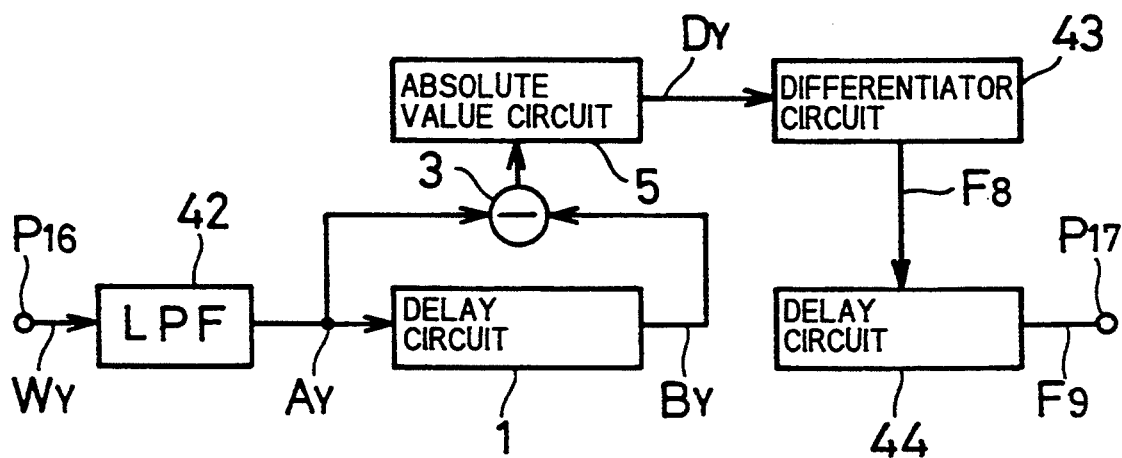
FIG. 36 is a block diagram showing a second exemplary configuration of the third application.
Figure 37:
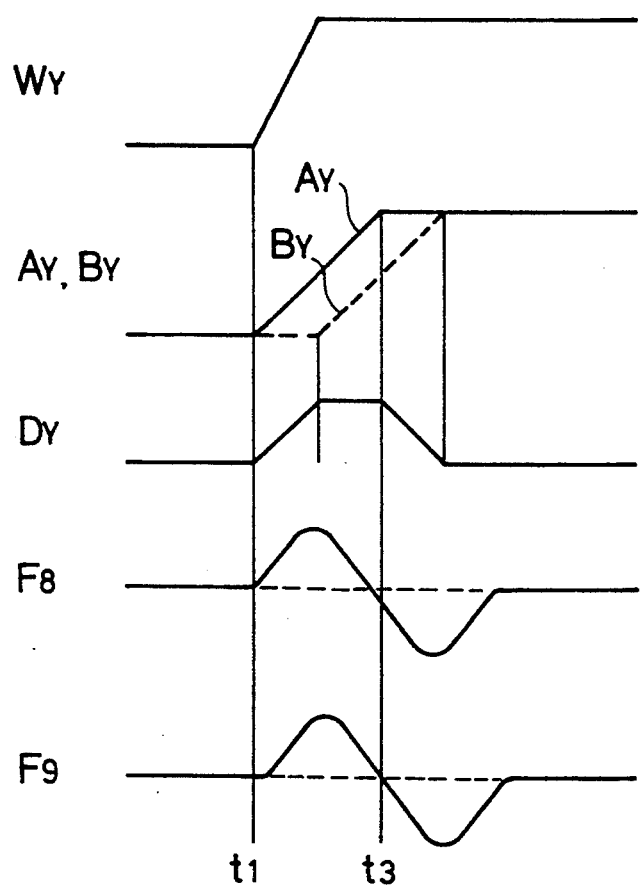
FIG. 37 is a waveform chart showing an operation of the second exemplary configuration of the third application.

Beside the configuration of the contour signal generator 39 (FIG. 33) explained in the first exemplary configuration, that which is shown in FIG. 36 may be used. In FIG. 37, signal waveforms at various points shown in FIG. 36 are shown.

Compared with the configuration shown in FIG. 33, that which is shown in FIG. 36 is simple. An input terminal P16 is connected through the low-pass filter 42 to the delay circuit 1. A luminance signal $W_Y$ is input through a luminance signal input terminal $Y_{in}$ to the input terminal P16, and it becomes a signal $A_Y$ which is restricted in bandwidth by the low-pass filter 42 to be applied to both of the delay circuit 1 and subtractor 3. The subtractor 3 finds the difference between the signal $A_Y$ and a signal $B_Y$ obtained by delaying the signal $A_Y$ in the delay circuit 1. An absolute value circuit 5 finds an absolute value of the difference to produce a signal $D_Y$, which, in turn, a differentiator circuit 43 processes to produce a signal F8.

The signal F8 obtained in this way is converted by a delay circuit 44 into a signal F9 which is delayed so as to take a reference value close to the middle of variation in the signal $B_Y$ (close to time $t_3$). A polarity of the signal F9 does not depend upon whether the variation in the signal $B_Y$ is rising or falling, similar to the chrominance contour signal F3 and the luminance contour signal F5, and hence, the signal F9 can be used as a luminance contour signal.

(B-3-3) Third Exemplary Configuration

Figure 38:
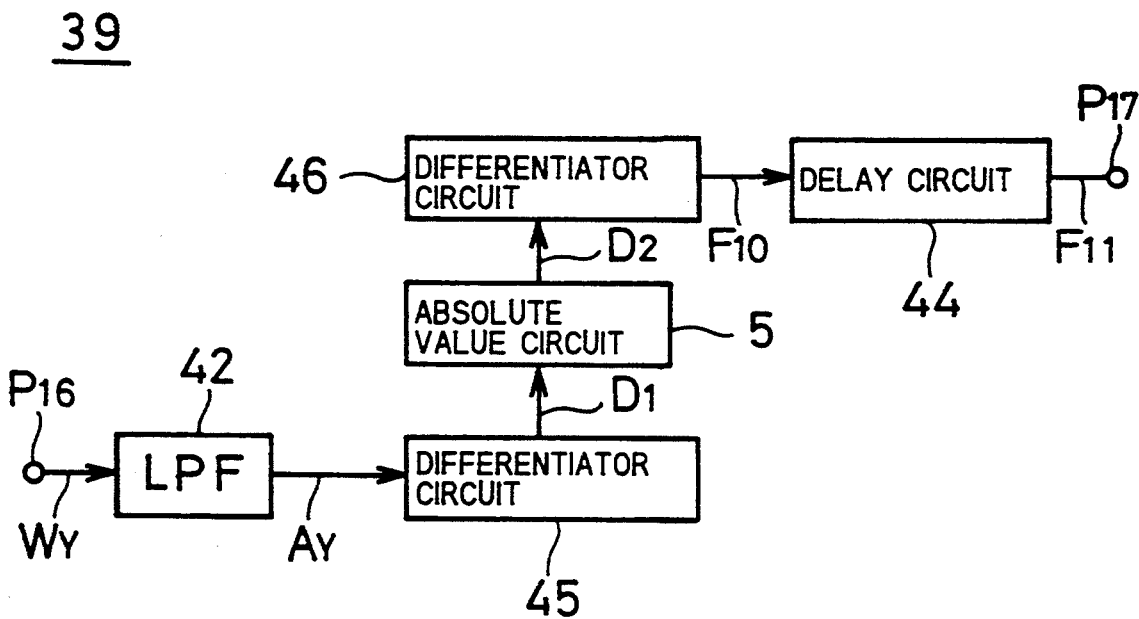
FIG. 38 is a block diagram showing a third exemplary configuration of the third application.
Figure 39:
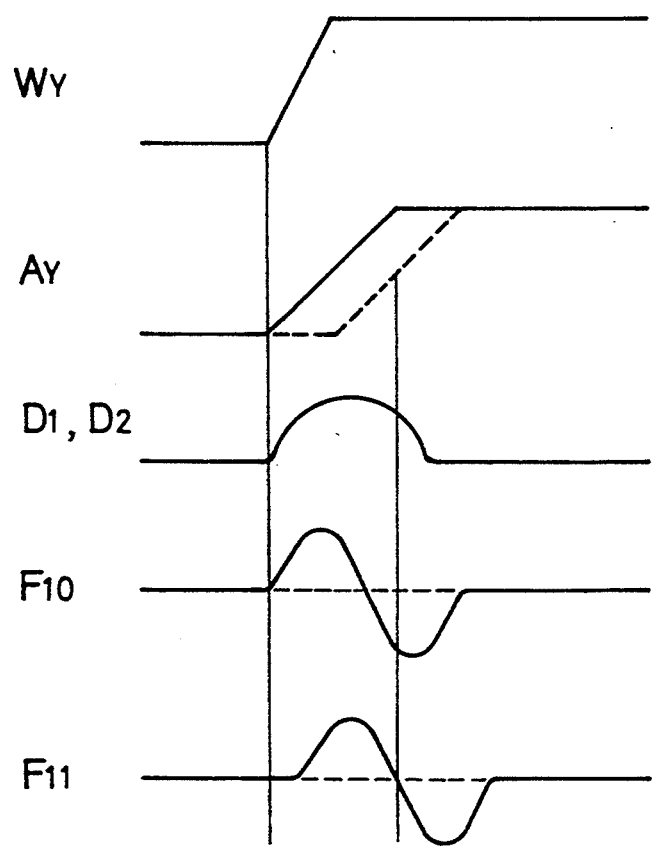
FIG. 39 is a waveform chart showing an operation of the third exemplary configuration of the third application.

As the contour signal generator 39, that which shown in FIG. 38 may be used. FIG. 39 shows signal waveforms at various points in FIG. 38.

A polarity of a luminance contour signal to be applied to an output terminal P17 does not depend upon whether variation in the signal $A_Y$ is rising or falling, and the same effect as in the fourth application can be obtained if the same as a polarity of the chrominance contour signal F3. For the purpose, after the signal $A_Y$ is once differentiated by a differentiator circuit 45 to convert into a signal D1, an absolute value of the signal D1 is found in an absolute value circuit 5 to produce a signal D2. In this way, taking the absolute value of the signal D1, a luminance contour signal having a polarity which does not depend upon whether the variation in the signal $A_Y$ is rising or falling can be obtained.

The signal D2 is further differentiated by the differentiator circuit 46 to produce a signal F10. In this way, performing a differentiating operation twice, a luminance contour signal having the same polarity as the chrominance contour signal F3 can be obtained.

Similar to the fourth application, the signal F10 is delayed so as to have a reference value close to the middle of variation in the signal $B_Y$ (close to time $t_3$) in the delay circuit 44, and consequently, a luminance contour signal F11 can be obtained.

Compared with the configuration shown in FIG. 33, the configuration shown in FIG. 38 has only one delay circuit and is more simple than the configuration shown in the fourth application (FIG. 36). Hence, it can be configured at a low price, but it is necessary to adjust a delay time correlated to the chrominance contour signal F3 in the delay circuit 44.

(B-4) Fourth Application

As previously mentioned, in correcting a contour of a chrominance signal, the carrier chrominance signal W is once demodulated again with the chrominance sub-carriers X1 and X2 in the demodulators 22 and 23. Hence, although correction of a contour itself can be relatively simply attained, (i) sometimes linearity of the demodulators 22 and 23, low-pass filters 24 and 25, waveform shaping apparatuses 26 and 27, and modulators 28 and 29 are insufficient; and/or (ii) there arises the difference between gains in processing systems in the first and second channels. Then, in the above-mentioned second and third applications, it is designed to improve them by correlating the waveform shaping apparatuses 33 and 34 with each other.

However, without necessarily correlating waveform shaping apparatuses with each other, the above-mentioned improvement can be attained. In the fourth application explained herein, waveform shaping process and following demodulation process are not performed to the carrier chrominance signal W itself. The demodulating process is performed to produce a chrominance contour correction signal for correcting the carrier chrominance signal W.

The carrier chrominance signal W is delayed by a specified period of time and added to outputs of the demodulators 28 and 29. Now, the delay time is specified as a time required for processing the carrier chrominance signal W to produce the outputs of the modulators 28 and 29.

(B-4-1) First Exemplary Configuration

Figure 40:
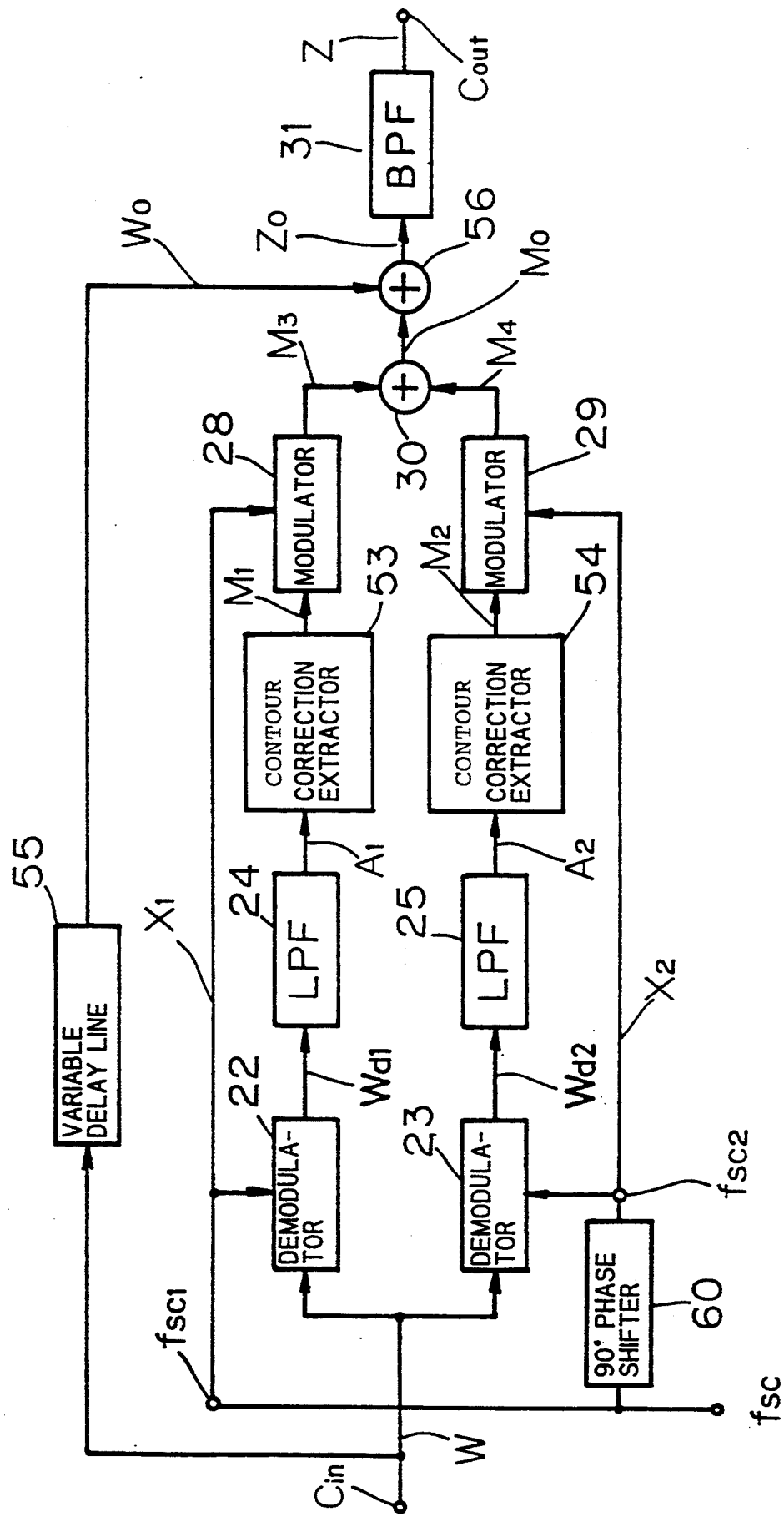
FIG. 40 is a block diagram showing a first exemplary configuration of a fourth application of the present invention.

A first exemplary configuration of the fourth application shown in FIG. 40 includes an apparatus for correcting a contour of a chrominance signal related to the first application shown in FIG. 24 to which a variable delay line 55 and an adder 56 are newly added, and the configuration includes contour correction extractors 53 and 54 instead of the waveform shaping apparatuses 26 and 27. In FIG. 40, a 90° phase shifter 60 to be connected to chrominance sub-carrier input terminals $f_{SC1}$ and $f_{SC2}$ is also shown.

Base band chrominance signal A1 and A2 are applied to the contour correction extractors 53 and 54, respectively, from which, in turn, correction signals M1 and M2 are output.

Figure 41:
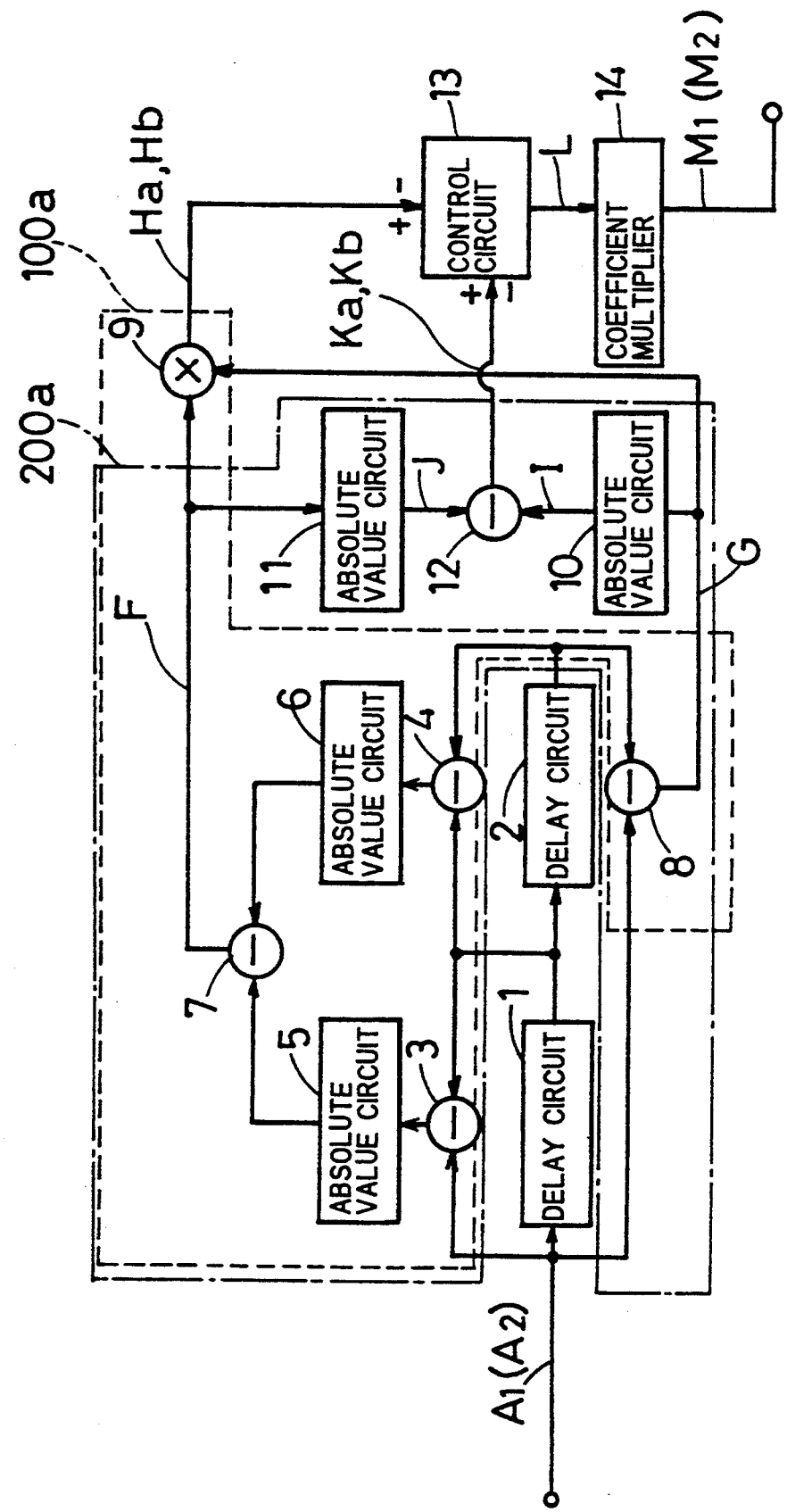
FIG. 41 is a block diagram showing an exemplary configuration of a contour correction extractor 53 (54)
Figure 42:
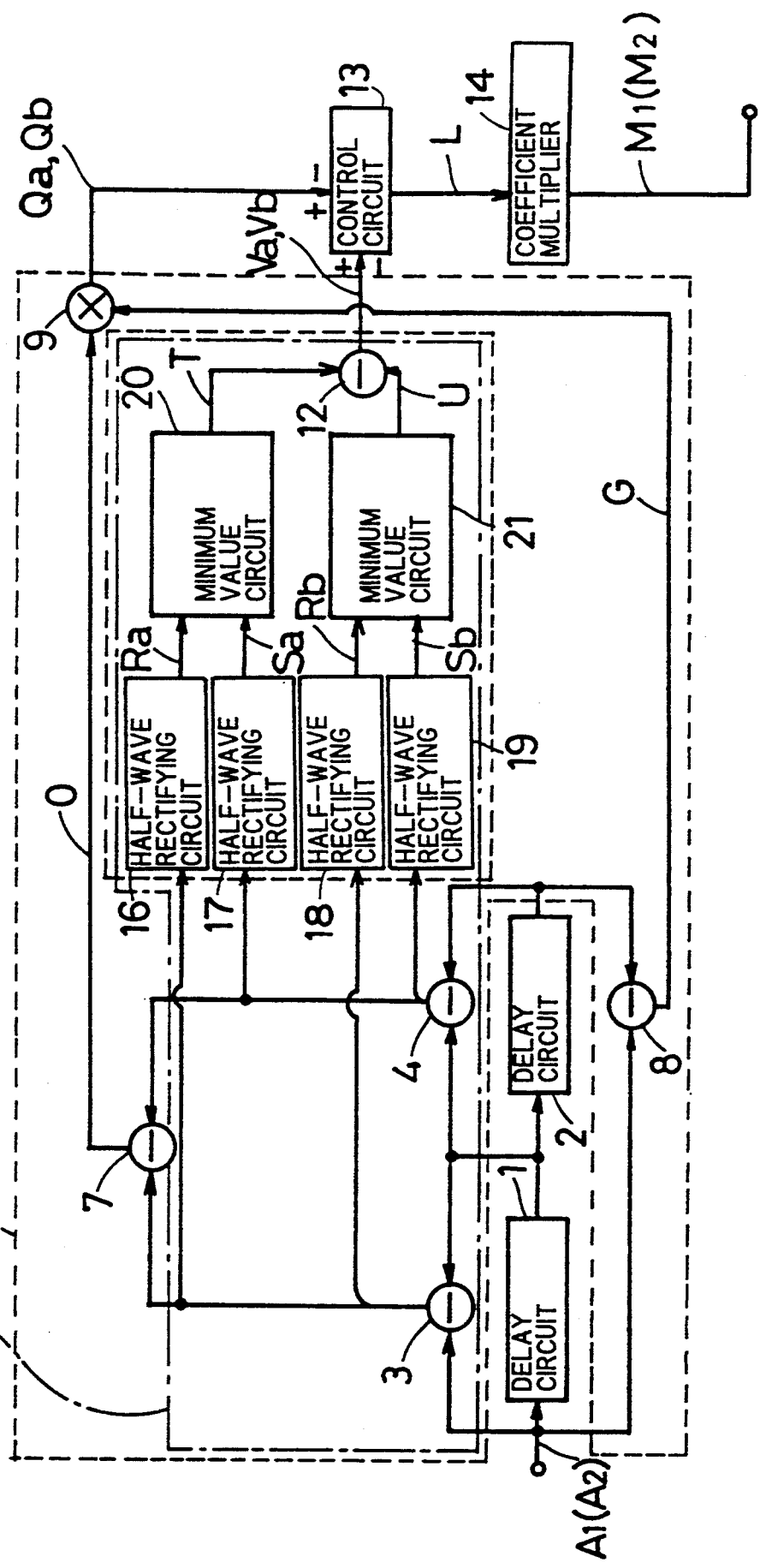
FIG. 42 is a block diagram showing an exemplary configuration of the contour correction extractor 53 (54)

Exemplary configurations of the contour correction extractors 53 and 54 are shown in FIGS. 41 and 42. The contour correction extractors 53 and 54 are configured similar to the waveform shaping apparatuses 26 and 27.

The configurations shown in FIGS. 41 and 42 are that which the adder 15 is removed from the configurations of the first and second embodiments shown in FIGS. 3 and 12, respectively. This is because the adder 15 is useless since the signal required in the fourth application is a correction signal.

The adder 56 is provided between an adder 30 and a band pass filter 31, while the variable delay line 55 is provided between the adder 56 and the chrominance signal input terminal $C_{in}$.

Figure 43:
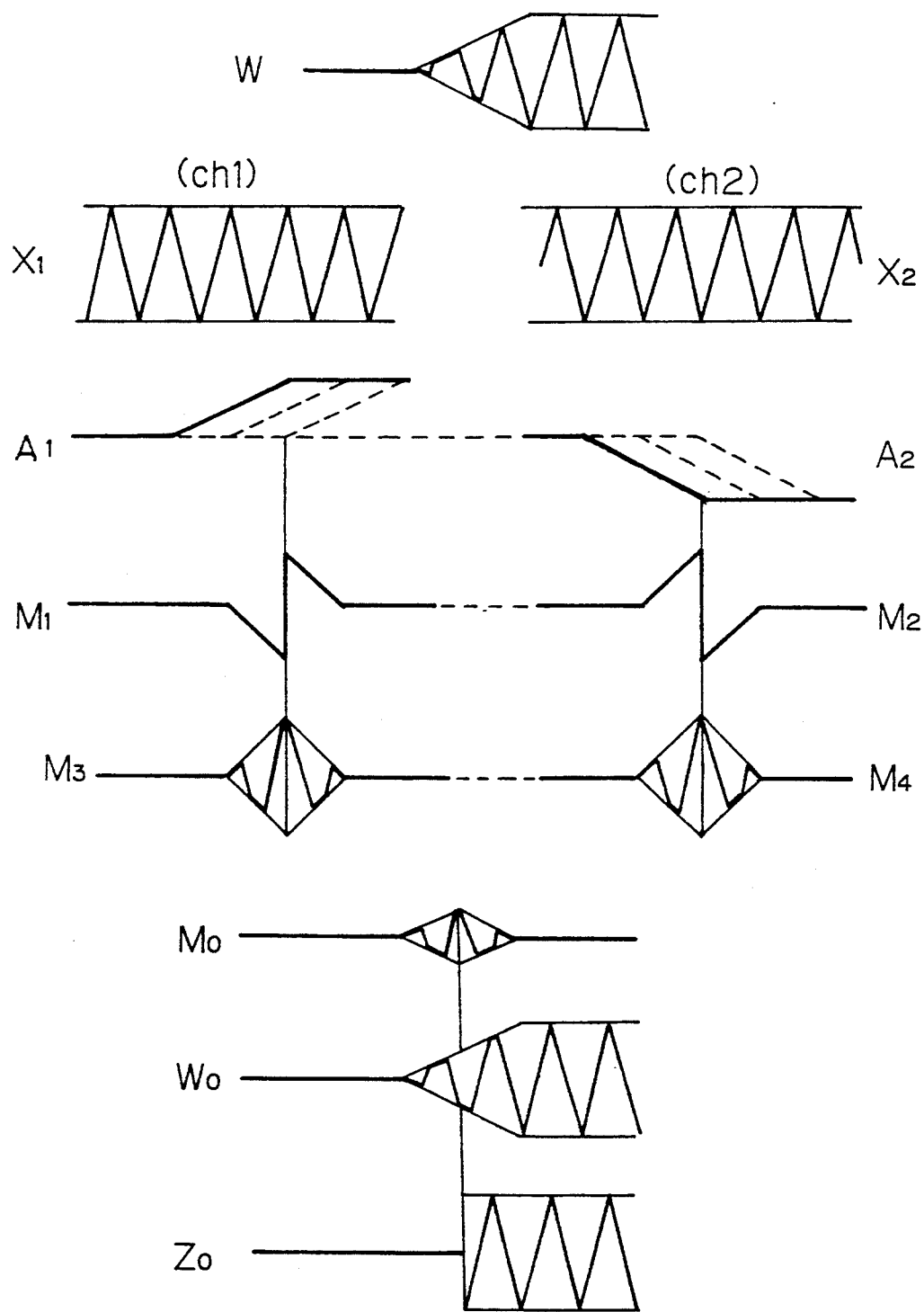
FIG. 43 is a waveform chart showing an operation of the first exemplary configuration of the fourth application.

A way till a signal Z0 is produced is shown in FIG. 43. FIG. 43 corresponds to FIG. 25 explained in conjunction with the first application. A carrier chrominance signal W which is to be improved and has been modulated in quadrature two-phase is input to the chrominance signal input terminal $C_{in}$ and demodulated into base band chrominance signals $W_{d1}$, $W_{d2}$ by chrominance sub-carriers X1 and X2 which are out of phase by 90 deg. to each other. After that, a double component of a carrier developed in demodulation is eliminated by the low-pass filter 24 and 25 to produce base band chrominance signals A1 (a first channel ch1) and A2 (a second channel ch2). The contour correction extractors 53 and 54 produce correction signals M1 and M2 based upon the base band chrominance signals A1 and A2 input thereto.

As previously mentioned, the correction signals M1 and M2 are produced base upon the base band chrominance signals A1 and A2 applied to the contour correction extractors 53 and 54, respectively. A way of producing those signals is almost similar to that of producing the signal M shown in FIGS. 8 and 17. However, the control circuits 13 of the contour correction extractors 53 and 54 have no threshold voltage $V_{TH}$, and times $t_{21}$, $t_3$ and $t_{31}$ correspond to each other. Hence, the correction signals M1 and M2 exhibit waveforms as shown in FIG. 43.

The correction signals M1 and M2 are modulated by the chrominance sub-carriers X1 and X2 in the modulators 28 and 29 to produce correction demodulated signals M3 and M4. These are added to each other in the adder 30 to produce a signal M0. Furthermore, the carrier chrominance signal W is delayed by a time required for producing the correction demodulated signals M3 and M4 by the variable delay line 55, and the resultant signal W0 is added to the signal M0 in the adder 56 to produce the signal Z0. The relationship of the correction demodulated signals M3, M4 to the signal W0 are similar to the relationship of the correction signal M to the shaping base signal B in the waveform shaping apparatuses of the first and second preferred embodiments.

After that, extra side bands are eliminated through the band pass filter 31 to produce a waveform-shaped carrier chrominance signal Z.

Figure 44:
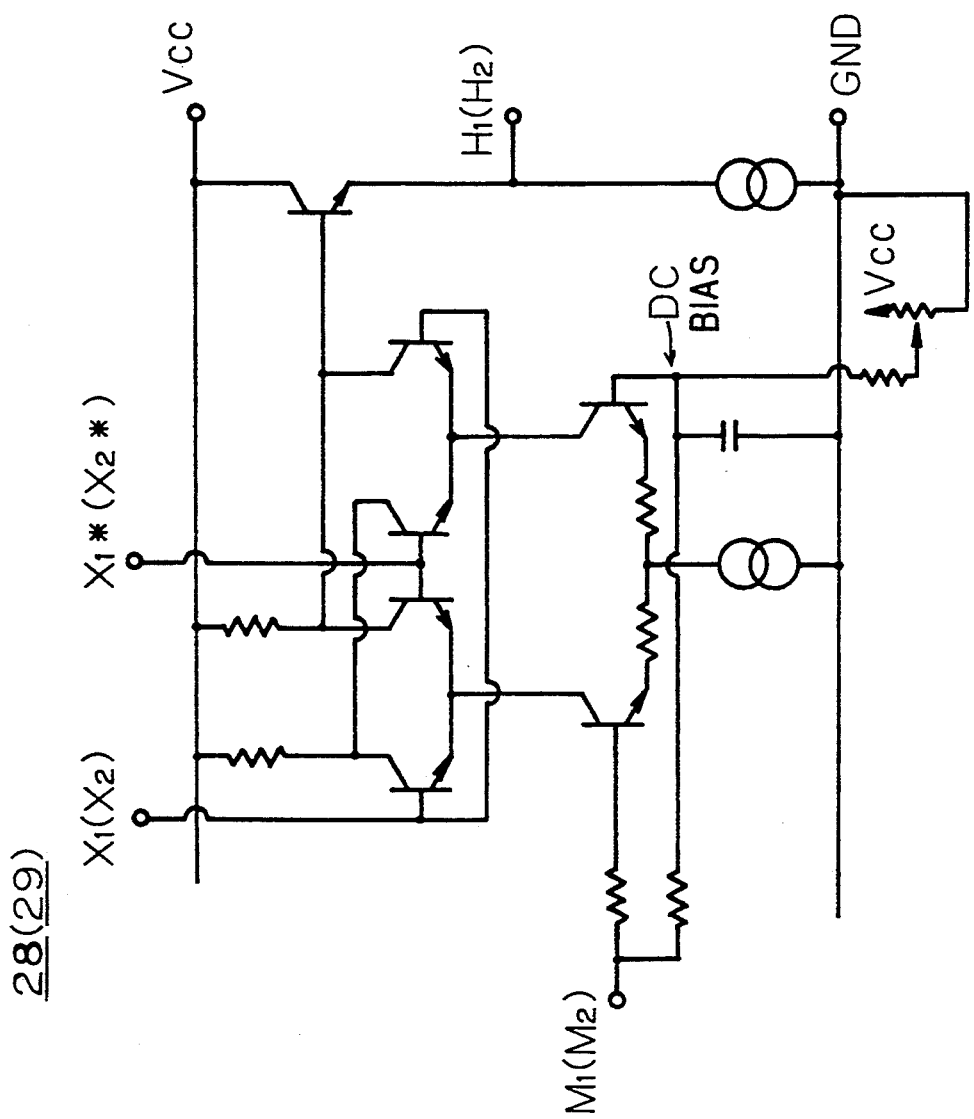
FIG. 44 is a circuit diagram showing an exemplary configuration of a modulator 28 (29)

It is desirable to suppress carrier leak in the modulators 28 and 29. Thus, as shown in FIG. 44, it is desirable that the apparatus is designed to adjust a potential of DC bias. Since the correction signals M1 and M2 are signals which exhibit amplitude vertically almost symmetrical, there is no need of performing DC clamp, and they can be input through capacity coupling. In FIG. 44, a signal X1* denotes an inversion signal of a signal X1. Instead of inputting the signal X1*, DC bias which is the center of the amplitude of the signal X1 may be input.

The configuration shown in FIG. 44 can certainly be applied to the modulators 28 and 29 explained in the first through third applications.

(B-4-2) Second Exemplary Configuration

Figure 45:
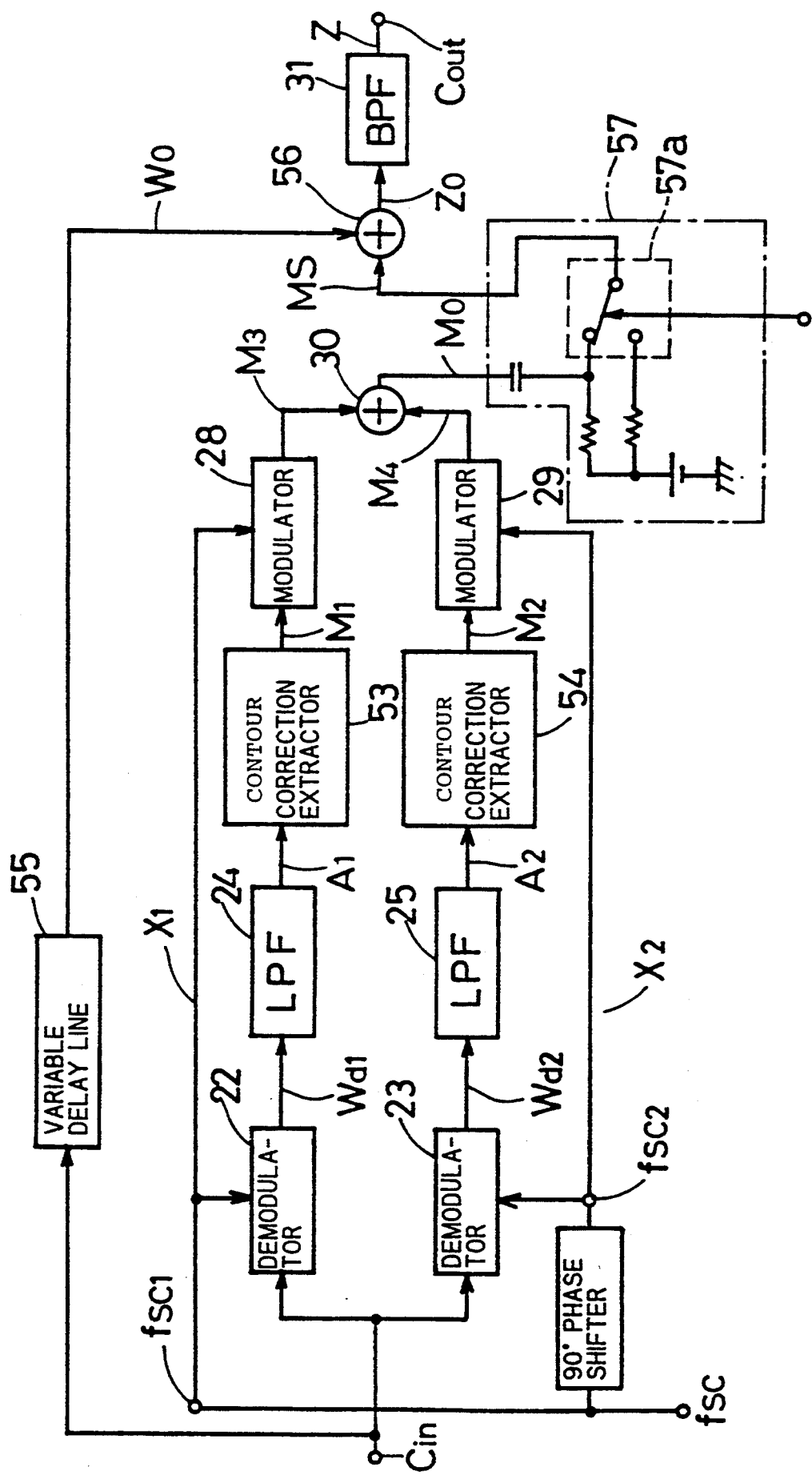
FIG. 45 is a block diagram showing a second exemplary configuration of the fourth application.

A second exemplary configuration of the fourth application shown in FIG. 45 is that which a switch circuit 57 is added to the apparatus for correcting a contour of a chrominance signal related to the first exemplary configuration shown in FIG. 40.

Figure 46:
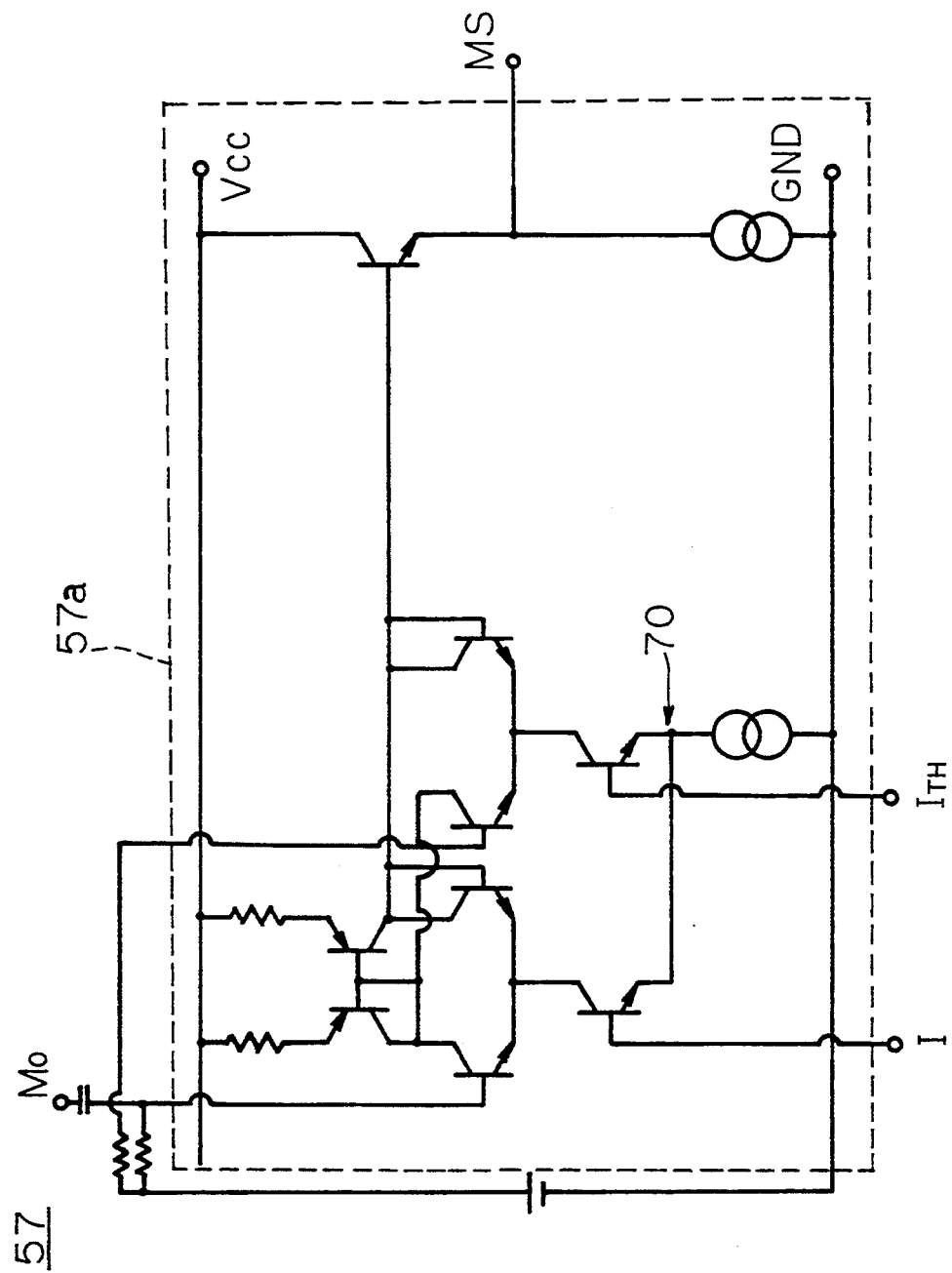
FIG. 46 is a circuit diagram showing the second exemplary configuration of the fourth application.

FIG. 46 shows an exemplary circuit of an internal configuration of the switch circuit 57. When the contour correction extractors 53 and 54 are configured as shown in FIG. 41, extracting a second original control signal I from the contour correction extractors 53 and 54 and gating the signal M0, noise can be reduced.

Figure 47:
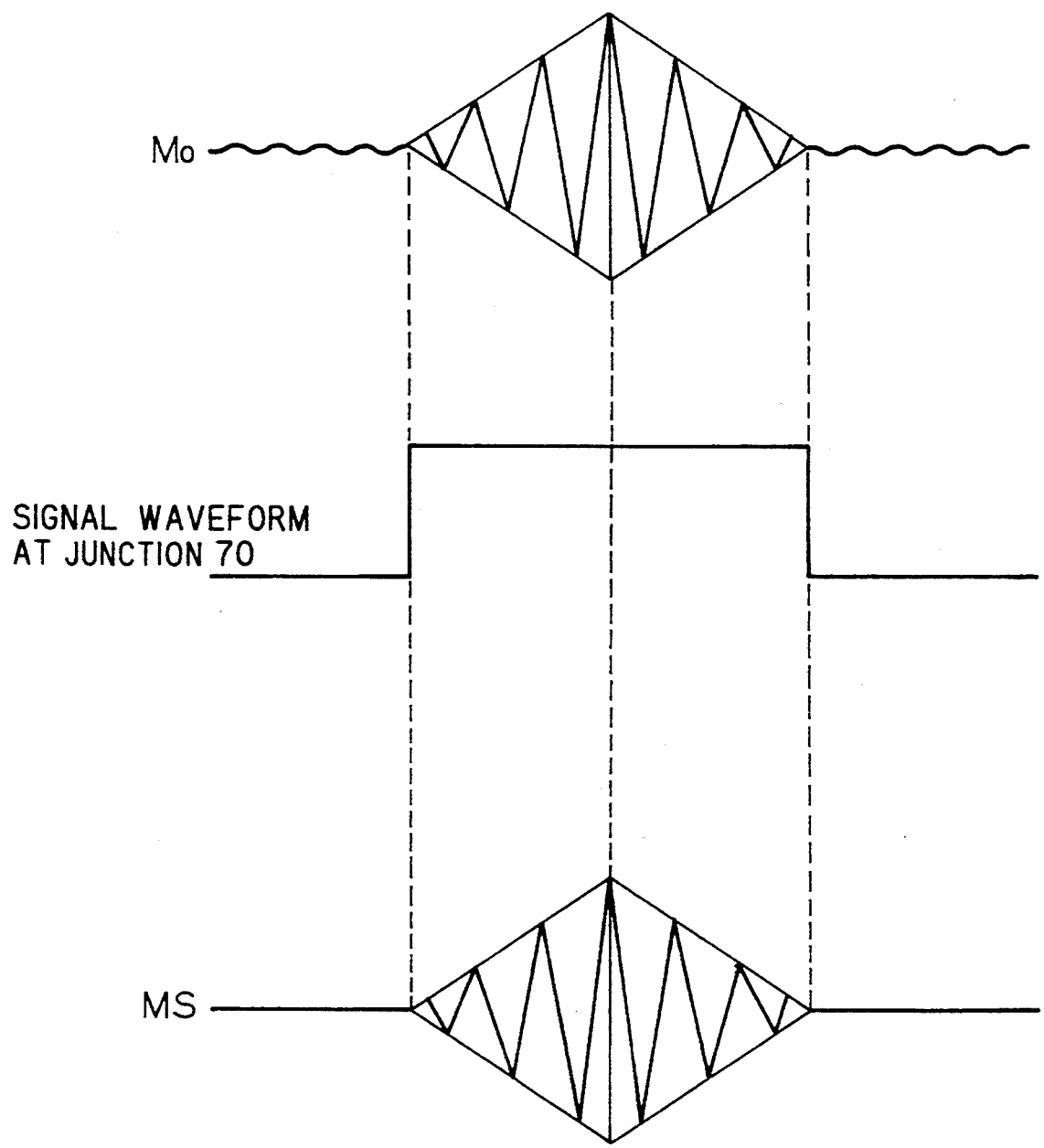
FIG. 47 is a waveform chart showing an operation of the second exemplary configuration of the fourth application.

FIG. 47 shows a way of removing noise from a waveform of the signal M0. Referring to FIG. 7, if the second original control signal I is shaped in a waveform with a threshold value of a middle value between its reference value and a peak, it is transformed to a signal which rises at the beginning of rising of the signal B and falls at the end of falling thereof. If the threshold value is input as a signal $I_{TH}$ together with the signal I to the switch circuit 57 shown in FIG. 46, the signal waveform at a junction 70 is transformed as shown in FIG. 45, and thus, a signal which has a pulse width identical to a width of the waveform of the signal M0 can be obtained. A signal MS output from the switch circuit 57 turns to that which has noise at about the reference value of the signal M0 reduced.

(B-4-3) Third Exemplary Configuration

Figure 48:
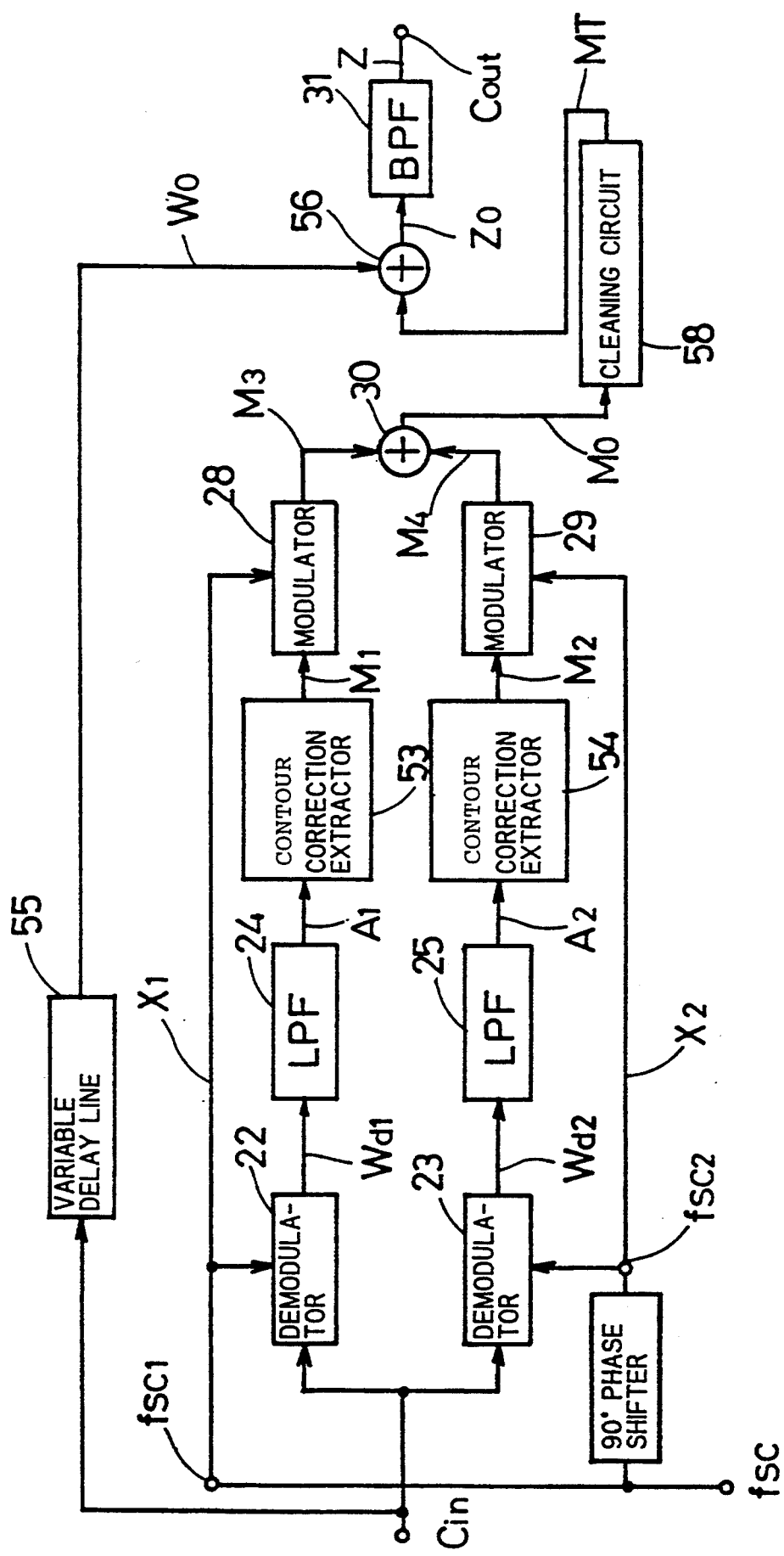
FIG. 48 is a block diagram showing a third exemplary configuration of the fourth application.

A third exemplary configuration of the fourth application shown in FIG. 48 includes the apparatus for correcting a contour of a chrominance signal related to the first exemplary configuration shown in FIG. 40 to which a cleaning circuit 58 is added.

The cleaning circuit 58 operates so as to remove carrier leak and a noise component contained in the signal M0, and consequently, it can prevent an unrequired component from being added to the signal W0. Thus, a contour correction which is excellent in color reproducibility can be attained.

Figure 49:
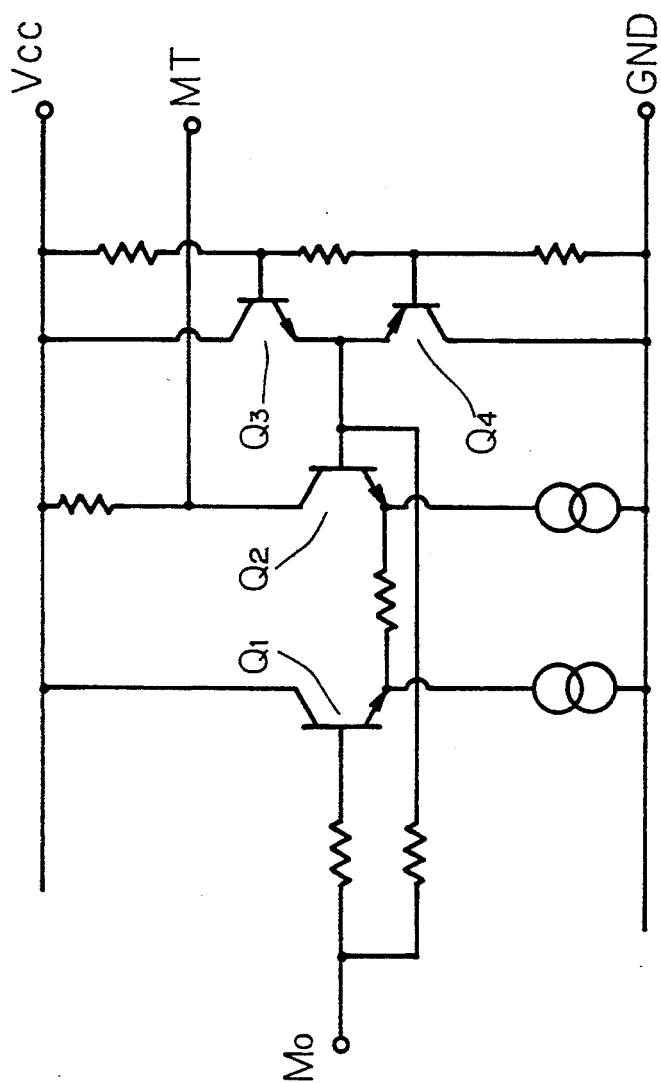
FIG. 49 is a circuit diagram showing the third exemplary configuration of the fourth application.

FIG. 49 shows an exemplary configuration of the cleaning circuit 58. Although the signal M0 is applied to bases of transistors Q1 and Q2, a signal which is applied to the base of the transistor Q2 so as to activate transistors Q3 and Q4 exhibits a waveform where upper and lower sections of the signal M0 are clipped. Thus, a differential multiplier consisting of the transistors Q1 and Q2 exerts an effect of common-mode rejection, so that a signal MT exhibiting a waveform where a component close to the center of the amplitude of (i.e. reference value) the signal M0 is eliminated can be obtained.

Figure 50:
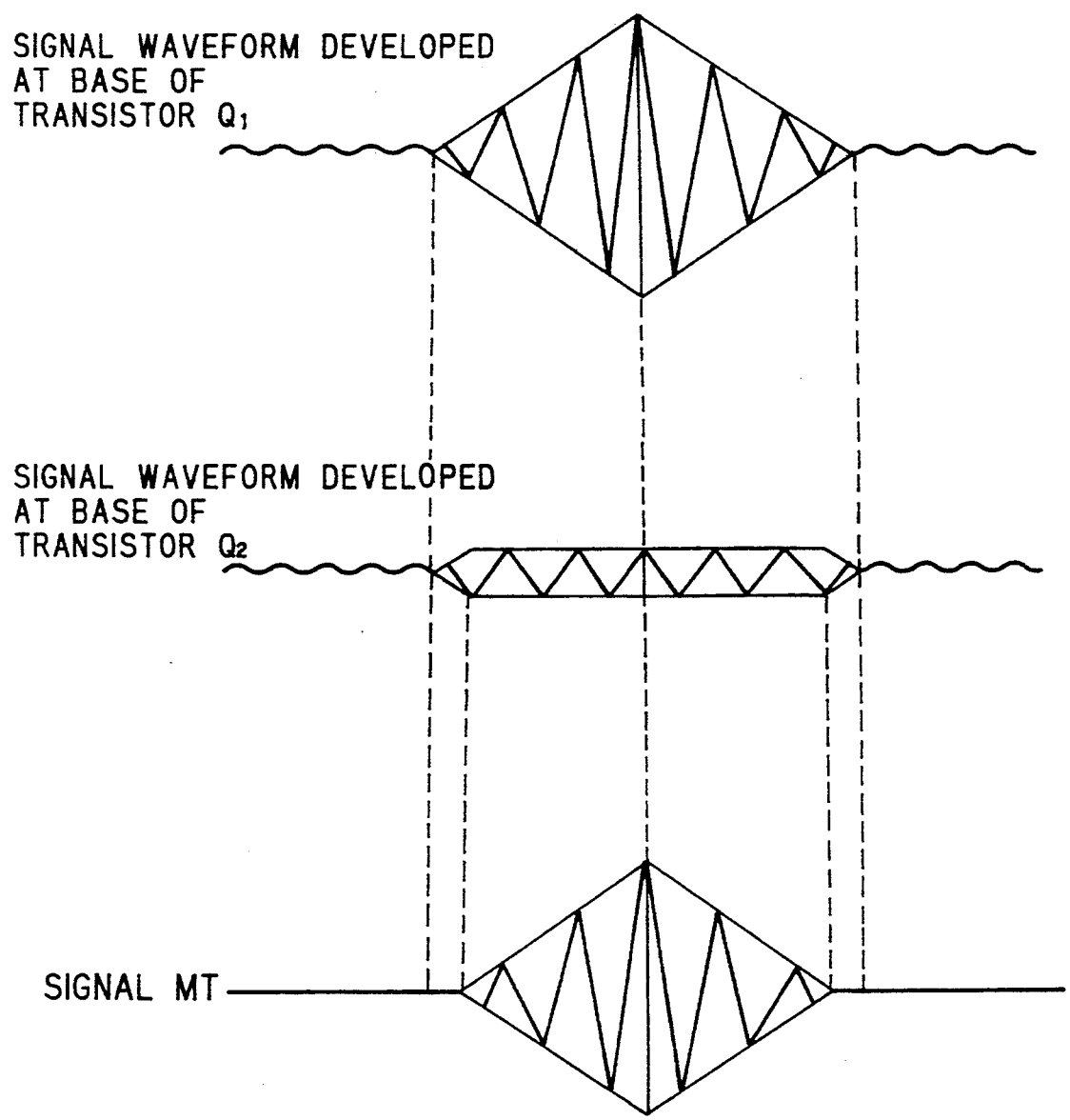
FIG. 50 is a waveform chart showing an operation of the third exemplary configuration of the fourth application.

FIG. 50 shows the relationship of signal waveforms developed in the bases of the transistors Q1 and Q2 with the signal MT. It will be found that signals produced in the bases of the transistors Q1 and Q2 are cleaned to remove noise contained therein from the signal MT.

The signal which has been cleaned has its amplitude slightly reduced but can easily recover by amplification.

(B-4-4) Fourth Exemplary Configuration

Figure 51:
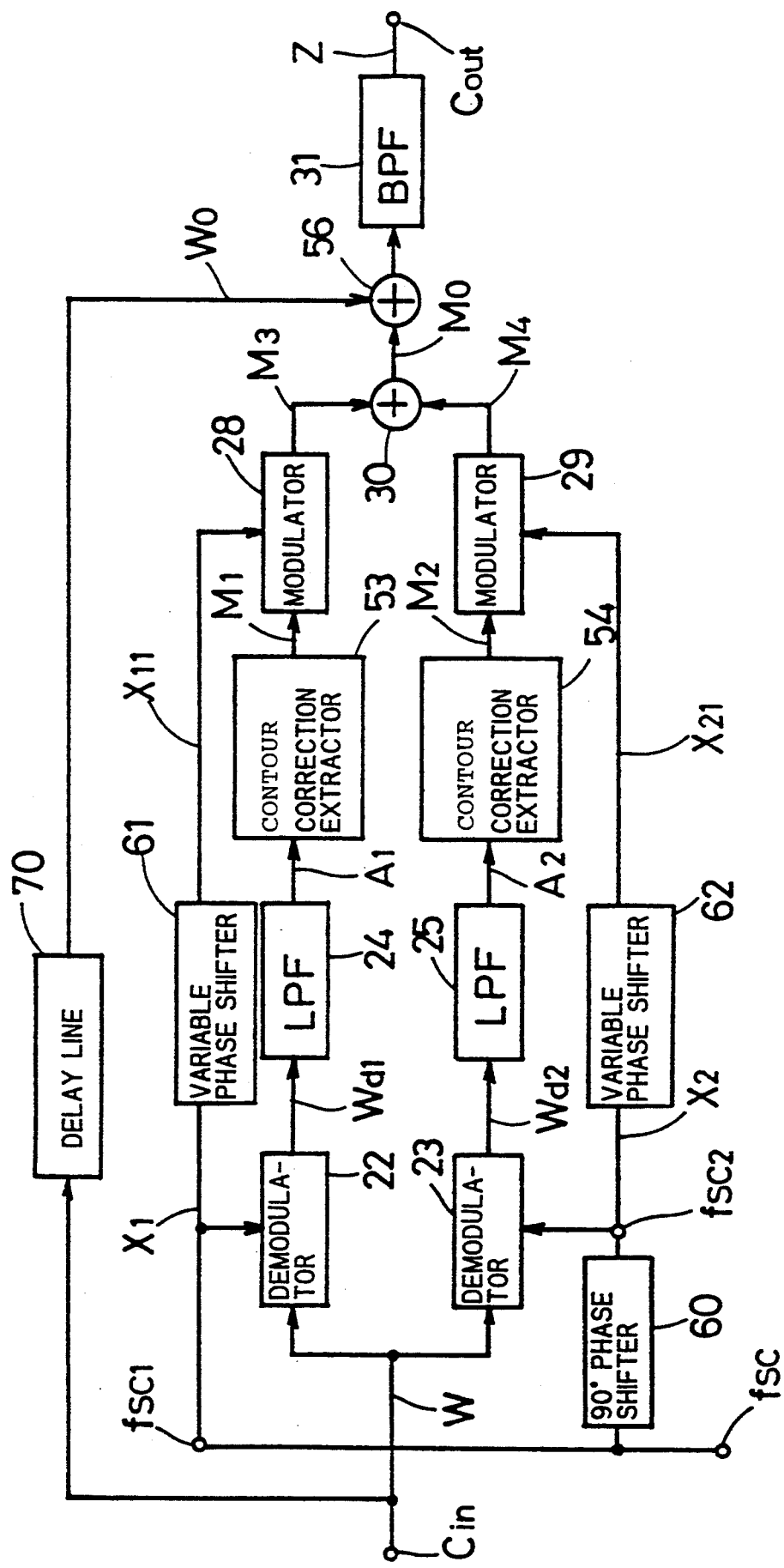
FIG. 51 is a block diagram showing a fourth exemplary configuration of the fourth application.

A fourth exemplary configuration of the fourth application shown in FIG. 51 includes the apparatus for correcting a contour of a chrominance signal related to the first exemplary configuration shown in FIG. 40 to which a variable phase shifter 61 between the chrominance sub-carrier input terminal $f_{SC1}$ and the modulator 28, and a variable phase shifter 62 between the chrominance sub-carrier input terminal $f_{SC2}$ and the modulator 29 are further added. A delay line 70 is provided instead of the variable delay line 55.

The variable phase shifters 61 and 62 cooperate with each other keeping an amount of phase shift identical to each other in order to adjust phases of the chrominance sub-carriers X1 and X2, and therefore, the timing registration of the signal M0 to the signal W0 can be attained even if a delay time of the delay line for obtaining the signal W0 is not variable.

(B-5) Fifth Application

Many of the images used for practical telecast are light-colored. In particular, the images recorded with video cameras are light-colored. This results from a low degree of saturation of the carrier chrominance signal W.

In general, circuits such as the demodulators 22, 23 and low-pass filters 24, 25 are designed to sufficiently pass the maximum level of inputted signals. When the carrier chrominance signal W and the base band chrominance signals $W_{d1}$ and $W_{d2}$ have small levels as in the case of the light-colored images, the output is not sufficient for operation of the succeeding circuits, and a disadvantageous S/N ratio is provided.

In the fifth application, a gain controllable amplifier amplifies the carrier chrominance signal W. Otherwise, intense contour correction is made on the base band chrominance signals A1, A2 to provide the correction chrominance signals N1, N2. The gain and the degree of contour correction are controlled in accordance with the degree of saturation (amplitude) of these signals which is constantly monitored. Thus, the degree of saturation of the carrier chrominance signal W to be inputted to the demodulators 22, 23 and the base band chrominance signals $W_{d1}$, $W_{d2}$ to be inputted to the low-pass filters 24, 25 should be always maintained constant, or the degree of contour correction should be controlled in accordance with the degree of saturation, whereby provided is an apparatus for correcting the contour of the chrominance signal for the light-colored images.

(B-5-1) First Exemplary Configuration

Figure 52:
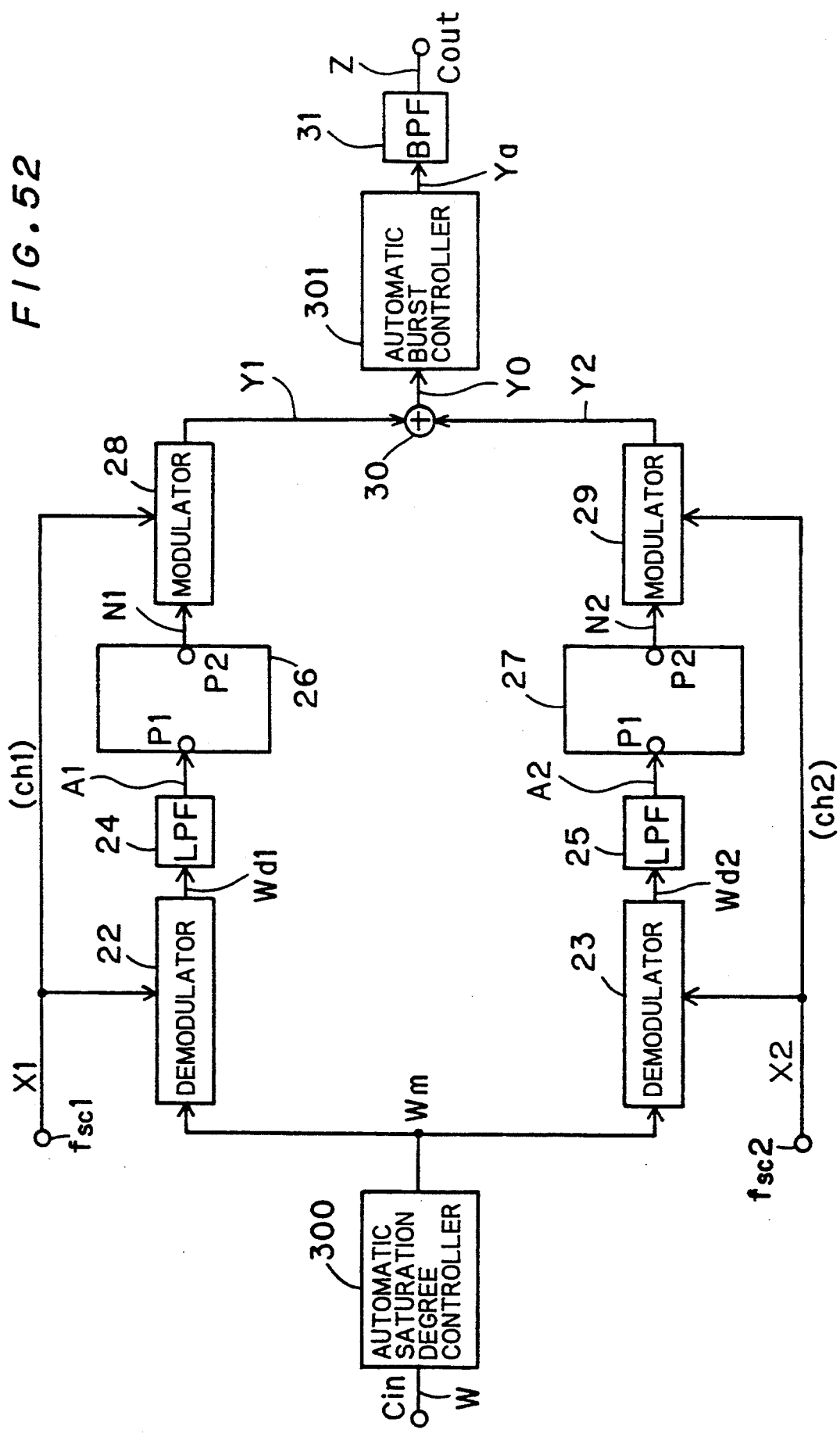
FIG. 52 is a block diagram showing a first exemplary configuration of a fifth application.

The apparatus of a first exemplary configuration of the fifth application shown in FIG. 52 comprises an automatic saturation degree controller 300 and an automatic burst controller 301 in addition to the apparatus of the first application of FIG. 24.

The automatic saturation degree controller 300 is connected between the chrominance signal input terminal $C_{in}$ and the inputs of the demodulators 22, 23. The carrier chrominance signal W inputted from the chrominance signal input terminal $C_{in}$ is amplified by the automatic saturation degree controller 300 under the control to be described later. This provides a carrier chrominance signal $W_m$ having a constantly maintained amplitude.

The same signal processing as in the first application is carried out in the steps of inputting the carrier chrominance signal $W_m$ to the demodulators 22, 23 to outputting a signal Y0 from the adder 30.

The automatic burst controller 301 is connected between the adder 30 and the band-pass filter 31, and amplifies the signal Y0 under the control to be described later to provide a signal Ya aligned with the amplitude of the carrier chrominance signal W. Then the band-pass filter 31 eliminates extra side bands of the signal Ya to provide the carrier chrominance signal Z which has been shaped in waveform.

Figure 53:
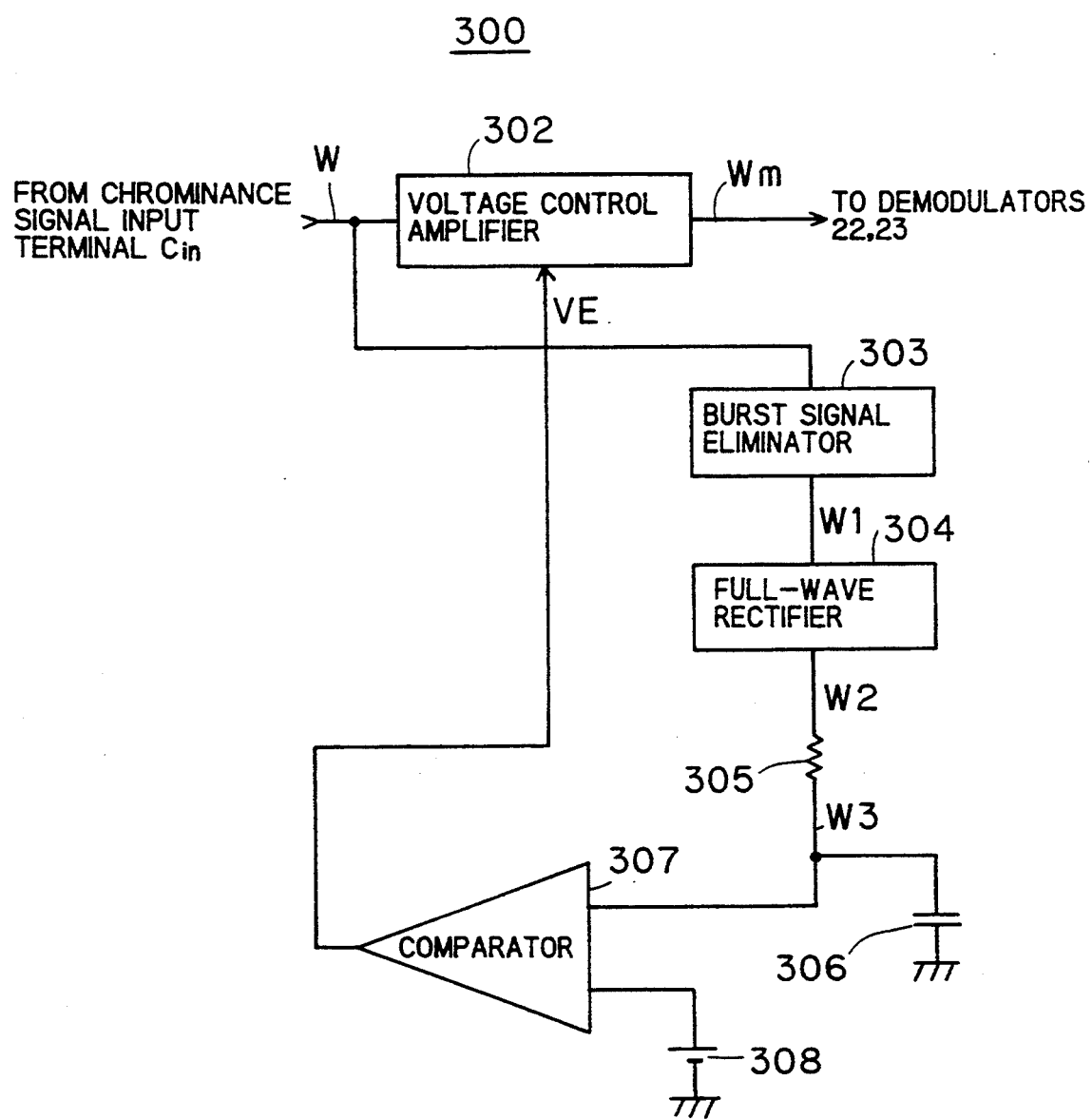
FIG. 53 is a circuit diagram showing the first exemplary configuration of the fifth application.
Figure 54:
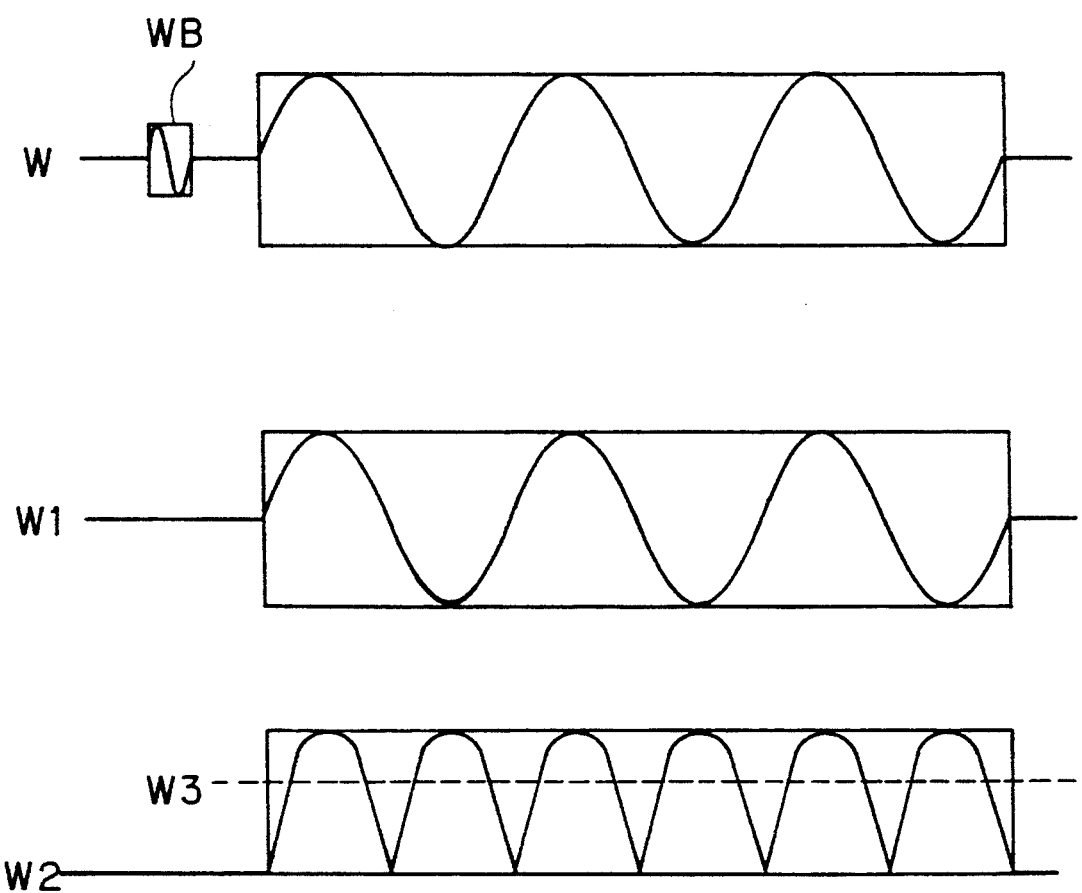
FIG. 54 is a waveform chart showing an operation of the first exemplary configuration of the fifth application.

FIG. 53 is a circuit diagram of the automatic saturation degree controller 300, and FIG. 54 illustrates waveforms at various points of the automatic saturation degree controller 300. A voltage control amplifier 302 receives the carrier chrominance signal W at its input connected to the chrominance signal input terminal $C_{in}$ to output the carrier chrominance signal $W_m$ at its output connected to the demodulators 22, 23. The voltage control amplifier 302 further includes a control end connected to the output of a comparator 307.

A burst signal eliminator 303 receives the carrier chrominance signal W at its input connected to the chrominance signal input terminal $C_{in}$, and eliminates a burst signal $W_B$ of the carrier chrominance signal W therefrom to output a signal W1 at its output. A full-wave rectifier 304 receives and full-wave rectifies the signal W1 to apply a signal W2 to one end of a resistor 305.

The resistor 305 and a capacitor 306 are connected in series between the full-wave rectifier 304 and the ground. A first input of the comparator 307 is connected to the connection of the resistor 305 and the capacitor 306, so that a signal W3 provided by the integration of the signal W2 is applied to the first input of the comparator 307. The signal W3 is a DC voltage signal and is indicative of the amplitude value of the signal W2.

A reference potential is applied to a second input of the comparator 307 from a reference voltage source 308. The comparator 307 compares the signal W3 with the reference potential, and a difference therebetween is applied as an error voltage $V_E$ to the control end of the voltage control amplifier 302. The error voltage $V_E$ controls the gain of the voltage control amplifier 302. The voltage control amplifier 302 is controlled to increase its gain when the signal W3 has a small amplitude. Thus, the carrier chrominance signal $W_m$ having an amplitude in constant relation with the reference potential is provided. The amplitude of the carrier chrominance signal $W_m$ is maintained constant by maintaining the reference potential constant.

Figure 55:
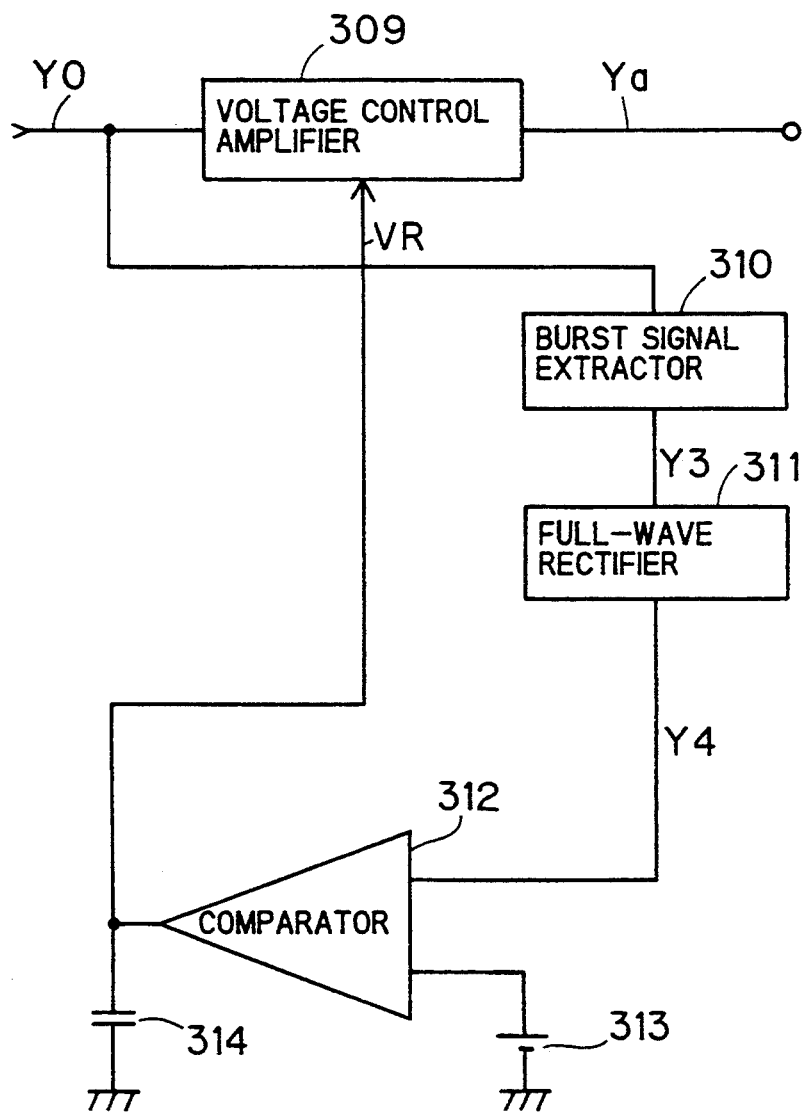
FIG. 55 is a circuit diagram showing the first exemplary configuration of the fifth application.
Figure 56:
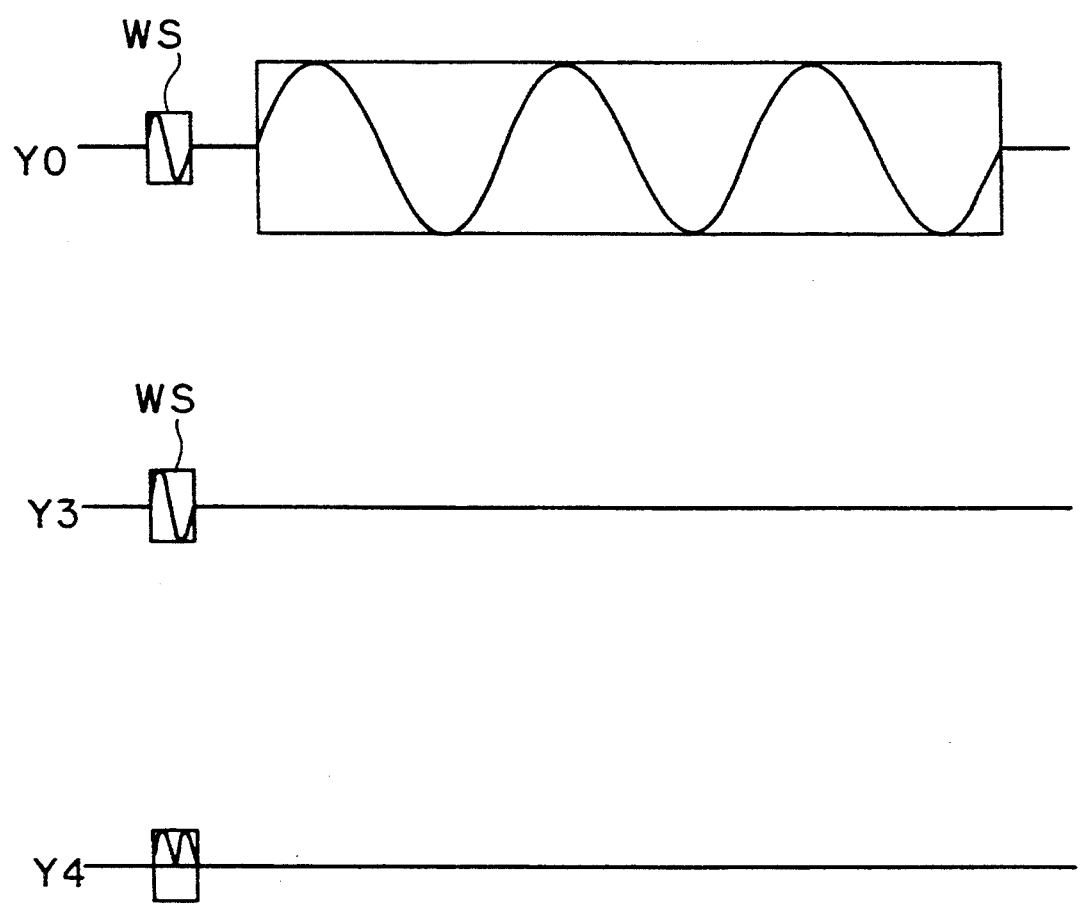
FIG. 56 is a waveform chart showing the operation of the first exemplary configuration of the fifth application.

FIG. 55 is a circuit diagram of the automatic burst controller 301, and FIG. 56 illustrates waveforms at various points of the automatic burst controller 301. A voltage control amplifier 309 receives the signal Y0 at its input connected to the adder 30 to output the signal Ya at its output connected to the band-pass filter 31. The voltage control amplifier 309 further includes a control end connected to the output of a comparator 312.

A burst signal extractor 310 receives the signal Y0 at its input connected to the adder 30, and extracts a burst signal $W_S$ of the signal Y0 therefrom to output a signal Y3 at its output. A full-wave rectifier 311 receives and full-wave rectifies the signal Y3 to apply a signal Y4 to a first input of the comparator 312.

A reference potential is applied to a second input of the comparator 312 from a reference voltage source 313. The output of the comparator 312 is grounded through a hold capacitor 314. The comparator 312 compares the peak value of the signal Y4 with the reference potential, and the output of the comparator 312 charges the hold capacitor 314. A potential $V_R$ of the hold capacitor 314 obtained in this manner is applied to the control end of the voltage control amplifier 309. Since the potential $V_R$ controls the gain of the voltage control amplifier 302, the amplitude of the burst signal $W_B$ of the signal Ya is maintained constant by maintaining constant the reference potential given from the reference voltage source 313.

As above described, the amplitude of the signal which provides the signal Y0 through the demodulation and the succeeding signal processing is adapted to be a large constant value to improve the S/N ratio. On the other hand, the amplitude of the burst signal $W_S$ of the signal Ya is controlled to be a constant value into corresponding relation to the amplitude of the burst signal $W_B$ of the carrier chrominance signal W. This facilitates the extraction of contour information and secures the contour correction, with the magnitude of the waveform-shaped carrier chrominance signal Z corresponding to the carrier chrominance signal W.

The automatic burst controller 301, which functions to control the amplitude of the inputted signals, may be provided between the band-pass filter 31 and the output terminal $C_{out}$.

(B-5-2) Second Exemplary Configuration

Figure 57:
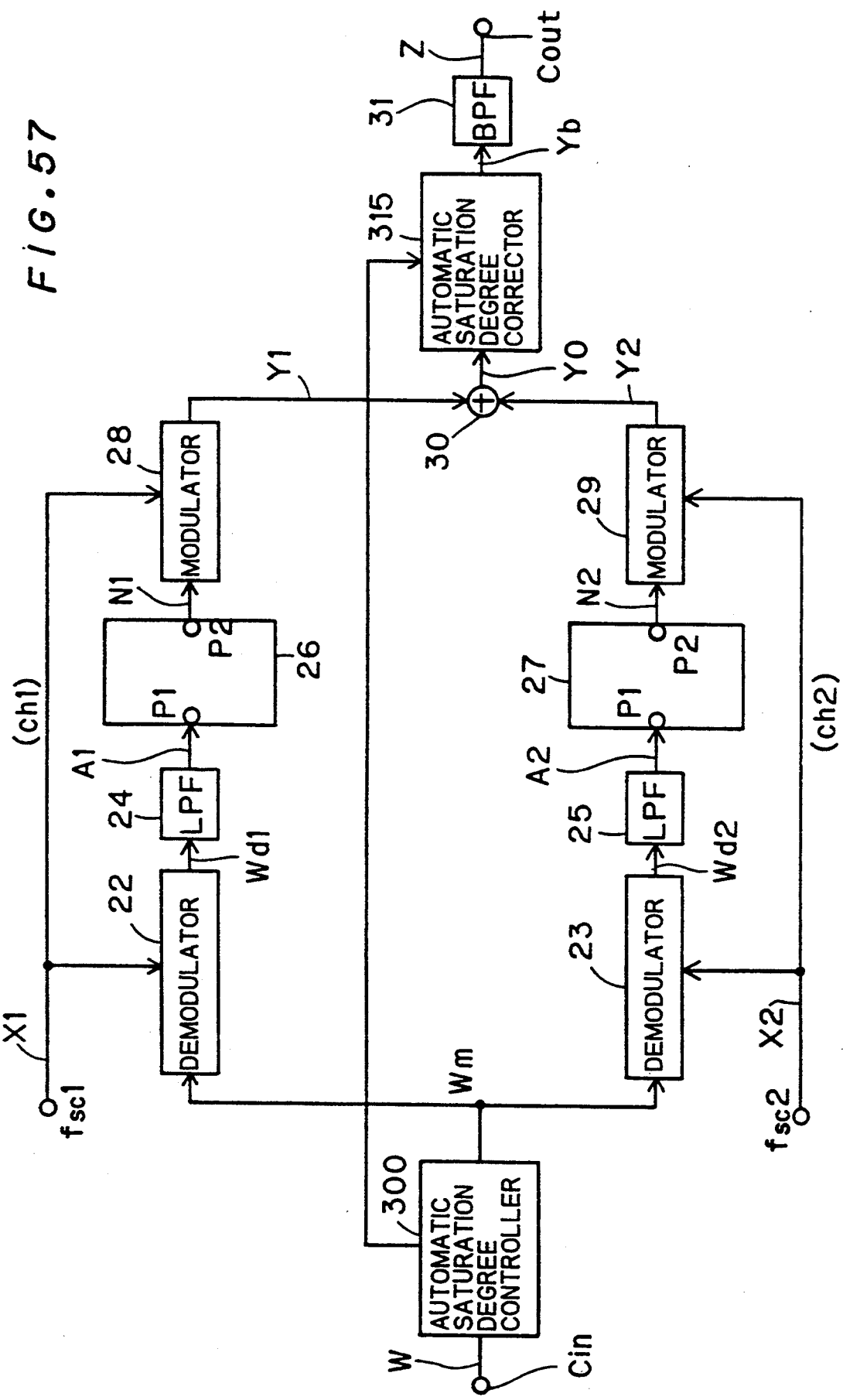
FIG. 57 is a block diagram showing a second exemplary configuration of the fifth application.

FIG. 57 is a block diagram of the apparatus for correcting the contour of chrominance signals which comprises an automatic saturation degree corrector 315 in place of the automatic burst controller 301 of FIG. 52.

The automatic saturation degree corrector 315 functions to restore the amplitude of the carrier chrominance signal $W_m$ which has been varied by the automatic saturation degree controller 300 to the amplitude of the original magnitude. It is assumed, for example, that the carrier chrominance signal W having a low degree of saturation is amplified by the automatic saturation degree controller 300 with a gain of 3 dB so that the carrier chrominance signal $W_m$ is provided. When the signal Y0 is provided through the signal processing using the carrier chrominance signal $W_m$, the automatic saturation degree corrector 315 amplifies the carrier chrominance signal $W_m$ with a gain of $-3$ dB. For this purpose, information about the gain is applied to the automatic saturation degree corrector 315 from the automatic saturation degree controller 300.

The above-mentioned function enables to prevent the magnitude of the amplitude of the signal from being damaged through a series of processings of demodulation, contour correction and modulation, with the contour correction securely made, when the carrier chrominance signal $W_m$ has a low degree of saturation.

Figure 58:
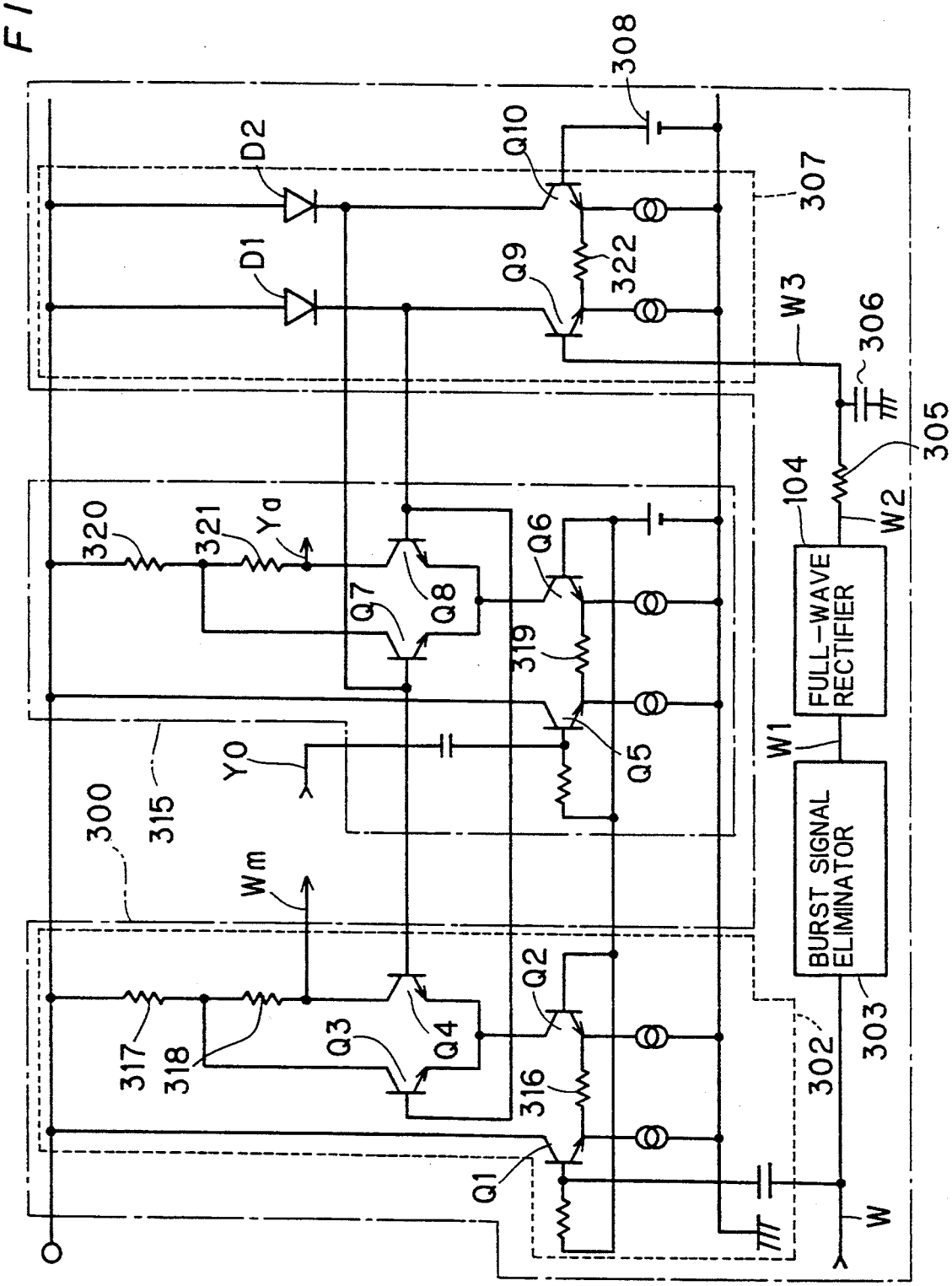
FIG. 58 is a circuit diagram showing the second exemplary configuration of the fifth application.

FIG. 58 is a circuit diagram of the automatic saturation degree controller 300 and the automatic saturation degree corrector 315. Transistors Q1 to Q4 and resistors 316 to 318 form an amplifier in corresponding relation to the voltage control amplifier 302 of FIG. 53. The voltage control amplifier 302 receives the carrier chrominance signal W to voltage-to-current convert the carrier chrominance signal W by means of the transistors Q1, Q2 and the resistor 316. The resultant current is separated by the transistors Q3, Q4, and the separated currents are converted into voltage by the resistors 317, 318, so that the carrier chrominance signal $W_m$ is outputted from the connection of the transistor Q4 and the resistor 318. The resistor 316 has a resistance $R_e$, and the resistors 317, 318 have a resistance $R_L$.

The maximum gain provided from the voltage control amplifier 302, which is about $2R_L/R_e$, is provided when the whole current does not flow into the transistor Q3 but into the transistor Q4. The minimum gain, which is about $R_L/R_e$, is provided when the whole current does not flow into the transistor Q4 but into the transistor Q3.

The automatic saturation degree corrector 315 comprises an amplifier including transistors Q5 to Q8 and resistors 319 to 321. The automatic saturation degree corrector 315 receives the signal Y0 inputted from the adder 30 to voltage-to-current convert the signal Y0 by means of the transistors Q5, Q6 and the resistor 319. The resultant current is separated by the transistors Q7 and Q8, and the separated currents are converted into voltage by the resistors 320, 321, so that the carrier chrominance signal Ya is outputted from the connection of the transistor Q8 and the resistor 321. The resistor 319 has a resistance $R_e$, and the resistors 320 and 321 have a resistance $(\frac{1}{2})R_L$.

The maximum gain provided from the automatic saturation degree corrector 315, which is about $R_L/R_e$, is provided when the whole current does not flow into the transistor Q7 but into the transistor Q8. The minimum gain, which is about $(\frac{1}{2})R_L/R_e$, is provided when the whole current does not flow into the transistor Q8 but into the transistor QT.

The carrier chrominance signal W is also inputted to the burst signal eliminator 303 in the automatic saturation degree controller 300. As above described in "(B-5-1) First Exemplary Configuration", the full-wave rectifier 304 full-wave rectifies the signal W1 provided by the elimination of the burst signal in the burst signal eliminator 303 to provide the signal W2. The resistor 305 and the capacitor 306 integrate the signal W2 to provide the DC voltage signal W3. Then an amplifier corresponding to the comparator 307 described with reference to FIG. 53 which includes transistors Q9, Q10, diodes D1, D2 and a resistor 322 having a resistance $R_e$ compares the signal W3 with the reference voltage. The comparison result is applied to the voltage control amplifier 302 and the automatic saturation degree corrector 315 as a potential difference between the connection of the transistor Q9 and the diode D1 and the connection of the transistor Q10 and the diode D2 or the error voltage $V_E$ described with reference to FIG. 53.

Since the polarity of the error voltage $V_E$ applied to the voltage control amplifier 302 is reverse to the polarity of the error voltage $V_E$ applied to the automatic saturation degree corrector 315, the automatic saturation degree corrector 315 has the minimum or maximum gain when the voltage control amplifier 302 has the maximum or minimum gain. This relation is indicated in Equation (1):

$$\frac{2R_L}{R_e} \times \frac{(1/2)R_L}{R_e} = \frac{R_L^2}{R_e^2} \quad (1)$$

$$\frac{R_L}{R_e} \times \frac{R_L}{R_e} = \frac{R_L^2}{R_e^2}$$

where $2R_L/R_e$ is the maximum gain of the amplifier for the automatic saturation controller; $(\frac{1}{2})R_L/R_e$ is the minimum gain of the amplifier for the automatic saturation degree corrector; $R_L/R_e$ of the first term is the minimum gain of the amplifier for the automatic saturation degree controller; $R_L/R_e$ of the second term is the maximum gain of the amplifier for the automatic saturation degree corrector; and $R_L^2/R_e^2$ is the total gain.

The amplitude of the signal Yb corresponds to the amplitude of the carrier chrominance signal $W_m$, so that the magnitude of the amplitude of the waveform-shaped carrier chrominance signal Z is substantially the same as the amplitude unchanged in degree of saturation. However, when a series of signal processings of demodulation, contour correction and modulation are carried out, the degree of saturation of the signal to be processed is increased. Therefore the contour correction is securely made if the carrier chrominance signal $W_m$ has a low degree of saturation.

(B-5-3) Third Exemplary Configuration

The degree of saturation of the carrier chrominance signal W is improved in the first and second exemplary configurations of the fifth application. In a third exemplary configuration, the waveform shaping apparatuses 26, 27 control a coefficient by which the coefficient multiplier 14 multiplies the signal L in accordance with the degree of saturation.

In general, colors having a high degree of saturation are conspicuous on a monitor so that a little improvement permits the effects thereof to be recognized, whereas colors having a low degree of saturation are inconspicuous. Then the amount of contour correction for the colors having the low degree of saturation is increased to enhance the effects.

Figure 59:
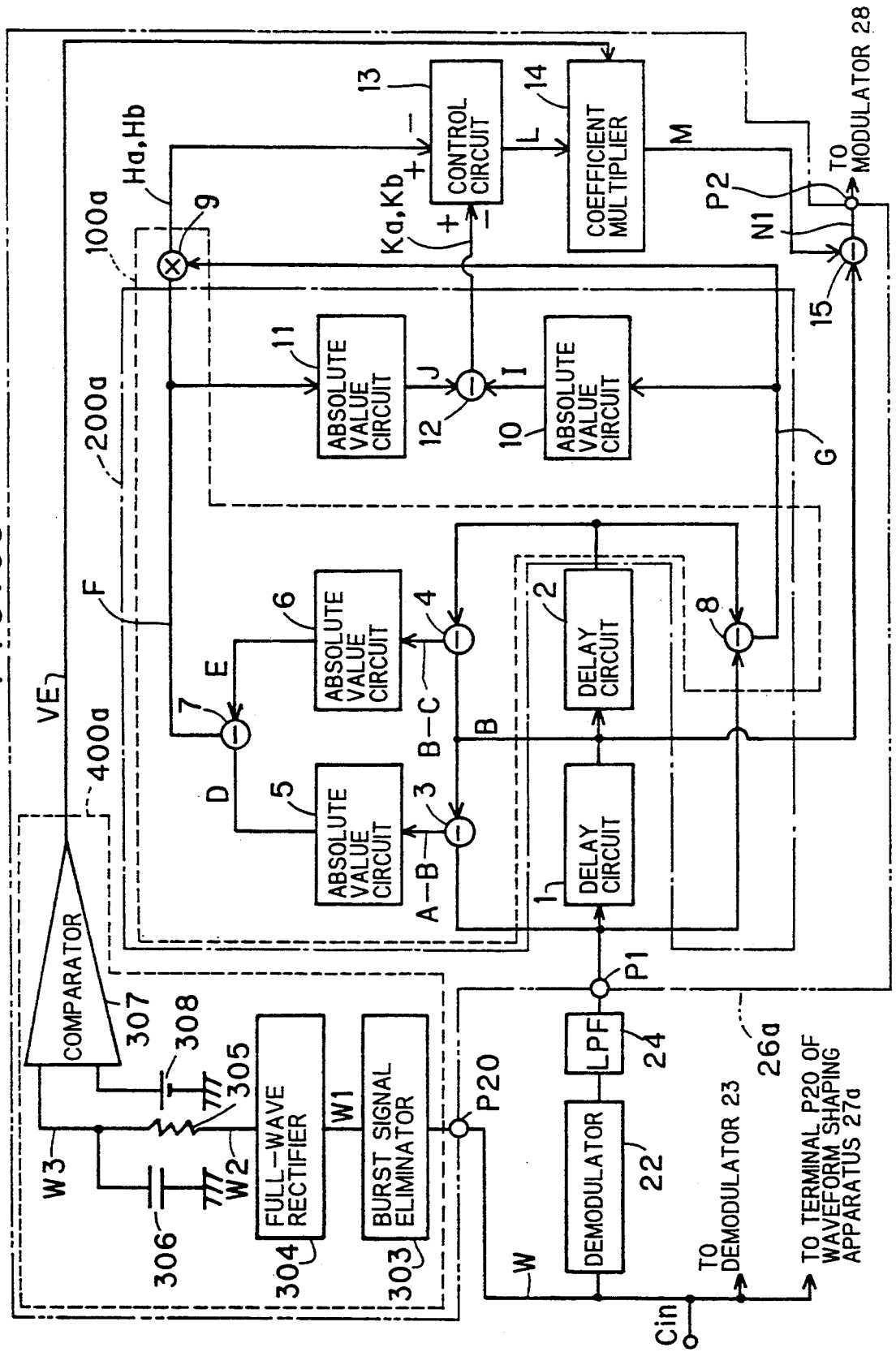
FIG. 59 is a block diagram showing a third exemplary configuration of the fifth application.

FIG. 59 is a partial block diagram of the apparatus for correcting the contour of the chrominance signals of the third exemplary configuration. The apparatus of the third exemplary configuration comprises waveform shaping apparatuses 26a, 27a in place of the waveform shaping apparatuses 26, 27 of the apparatus of the first application shown in FIG. 24. For the purpose of simplification, there is illustrated in FIG. 59 only the structure on the side of the first channel ch1, yet partially. The structure on the side of the second channel ch2 is identical with that on the side of the first channel ch1.

The waveform shaping apparatus 26a has the same structure as the waveform shaping apparatus 26, and includes the structure of FIG. 3 in the third exemplary configuration. The waveform shaping apparatus 26a comprises a coefficient multiplier controller 400a in addition to the components of the waveform shaping apparatus 26. The waveform shaping apparatus 26a has a terminal P20 through which the carrier chrominance signal W is applied to the coefficient multiplier controller 400a. The coefficient by which the coefficient multiplier 14 multiplies the signal L is controlled by the output of the coefficient multiplier controller 400a. The structural relation between the waveform shaping apparatuses 27a and 27 is identical with that between the waveform shaping apparatuses 26a and 26, and the description thereof will be omitted herein.

The coefficient multiplier controller 400a comprises components identical with those of the automatic saturation degree controller 300 except that the voltage control amplifier is not provided therein. The burst signal eliminator 303 is connected to the terminal P20, and eliminates the burst signal $W_B$ of the carrier chrominance signal W inputted to the terminal P20 to output the signal W1. The full-wave rectifier 304 receives and full-wave rectifies the signal W1 to output the signal W2. The resistor 305 and the capacitor 306 integrate the signal W2 to provide the DC voltage signal W3. The comparator 307 compares the signal W3 with the reference potential from the reference voltage source 308 to output a difference therebetween as the error voltage $V_E$. The coefficient multiplier 14 is controlled by the error voltage $V_E$. The higher the error voltage $V_E$ is, i.e., the lower the degree of saturation of the carrier chrominance signal W is, the larger the signal M is made.

Figure 60:
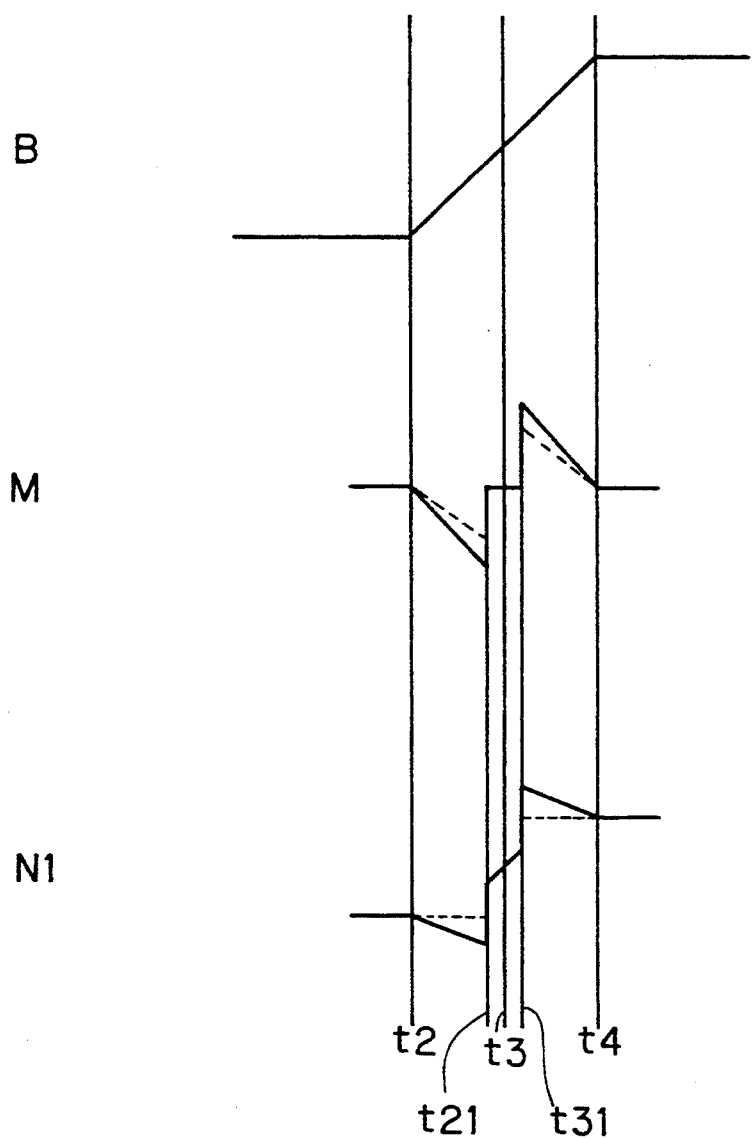
FIG. 60 is a waveform chart showing an operation of the third exemplary configuration of the fifth application.

FIG. 60 is a graph showing the correction chrominance signal N1 where the correction signal M to be added to the shaping basic signal B grows larger in corresponding relation to FIGS. 7 and 8. The waveforms shown in FIGS. 7 and 8 are also shown in dotted lines in FIG. 60, and it will be appreciated that the waveforms of the third exemplary configuration indicate greater emphasis on the contour correction than those of FIGS. 7 and 8.

As described hereinabove, the problem of the colors having the low degree of saturation may be solved by increasing the amount of contour correction.

C. Application to Digital Signal Processing

In "A. Basic Embodiment" and "B. Application for Demodulation of Chrominance Signal", applications of the present invention to timewise sequential signals, that is, applications of the present invention to analog signal waveforms has been described. However, the present invention may be applied to discrete signals, that is, it may be applied to digital signal waveforms to attain the similar effects.

Figure 61:
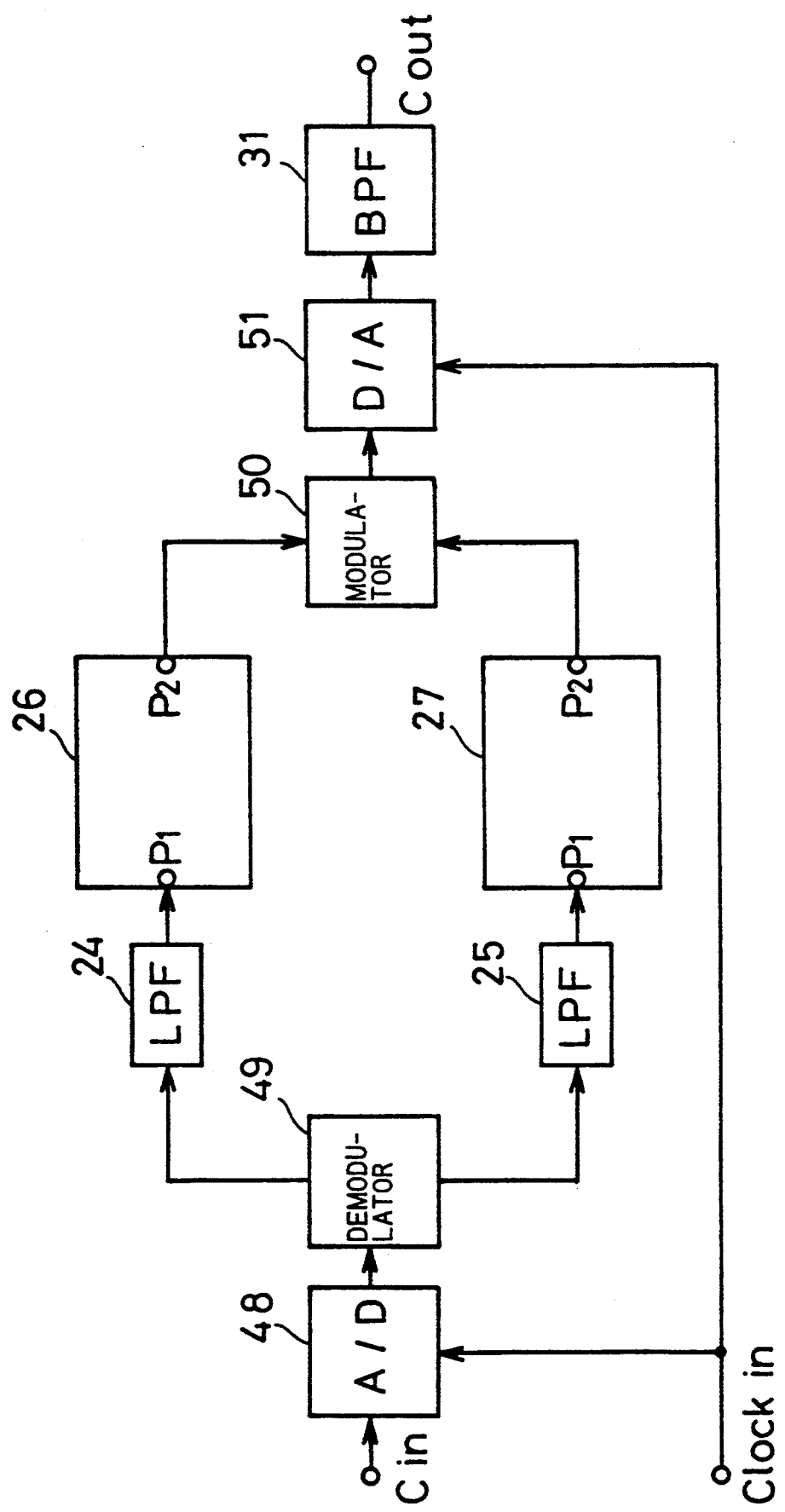
FIG. 61 is a block diagram showing a variation of the present invention.
Figure 62:
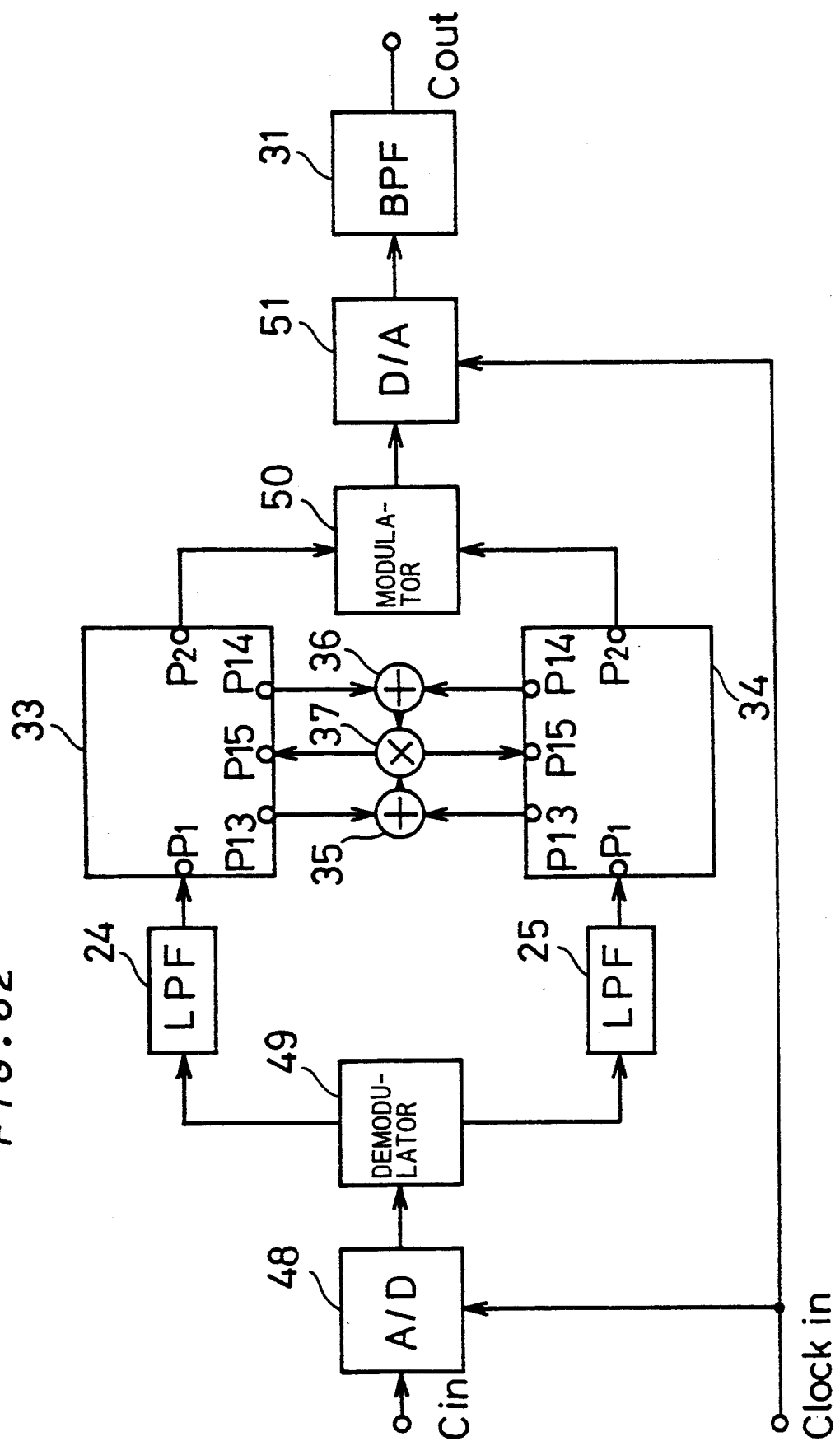
FIG. 62 is a block diagram showing a variation of the present invention.
Figure 63:
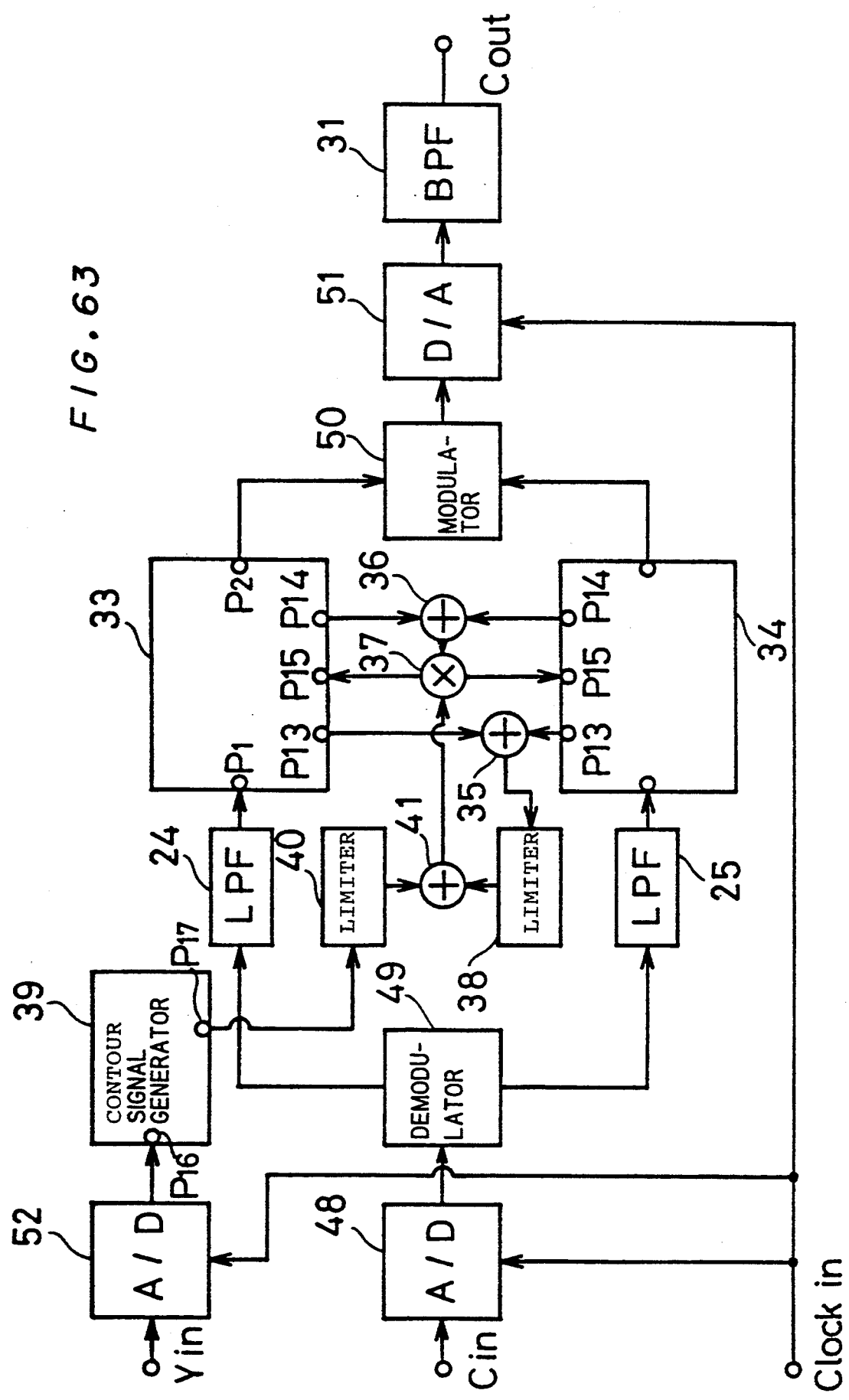
FIG. 63 is a block diagram showing a variation of the present invention.
Figure 64:
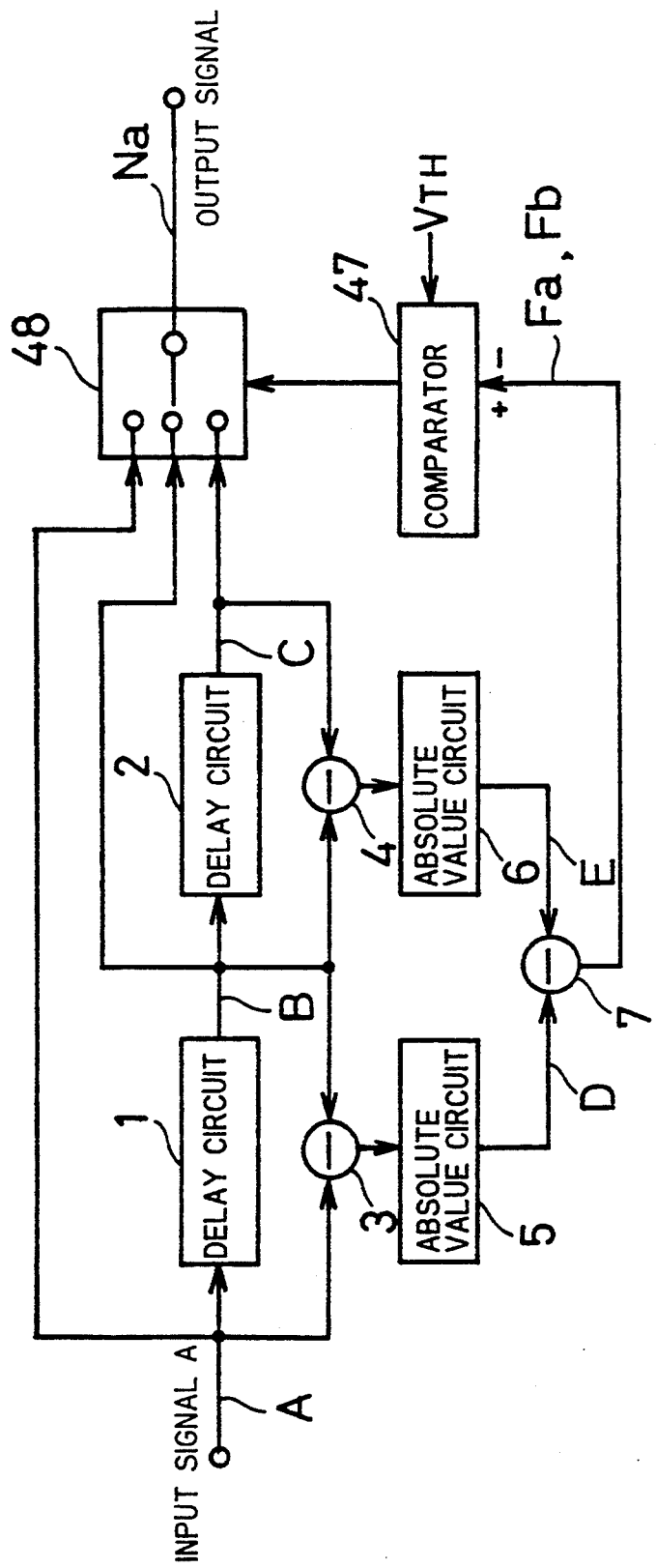
FIG. 64 is a block diagram showing a prior art technology.

FIGS. 61 through 63 show variations of the present invention which correspond to digital signals.

FIG. 61 corresponds to circuitry shown in FIG. 24. A chrominance signal input terminal $C_{in}$ is connected through an analog-digital converter circuit 48 to a demodulator 49. A low-pass filter 24 and a waveform shaping apparatus 26 are connected in series between the demodulator 49 and a modulator 50. A low-pass filter 25 and a waveform shaping apparatus 27 are also connected in series between the demodulator 49 and the modulator 50. A digital-analog converter circuit 51 and a band pass filter 31 are connected in series between the modulator 50 and an output terminal $C_{out}$. The analog-digital converter circuit 48 and the digital-analog converter circuit 51 are controlled in accordance with clock signals input to a clock terminal Clock.

With such a configuration, the waveform shaping apparatuses 26 and 27 function similar to the above-mentioned first application, and the similar effects of the present invention can be obtained.

FIG. 62 corresponds to circuitry shown in FIG. 26; specifically, instead of the waveform shaping apparatuses 26 and 27 in the configuration shown in FIG. 61, waveform shaping apparatuses 33 and 34 are provided, and adders 35, 36 and a multiplier 37 are provided between them.

With such a configuration, the waveform shaping apparatuses 33 and 34 function similar to the above-mentioned second application, and the similar effect of the present invention can be obtained.

Figure 32:
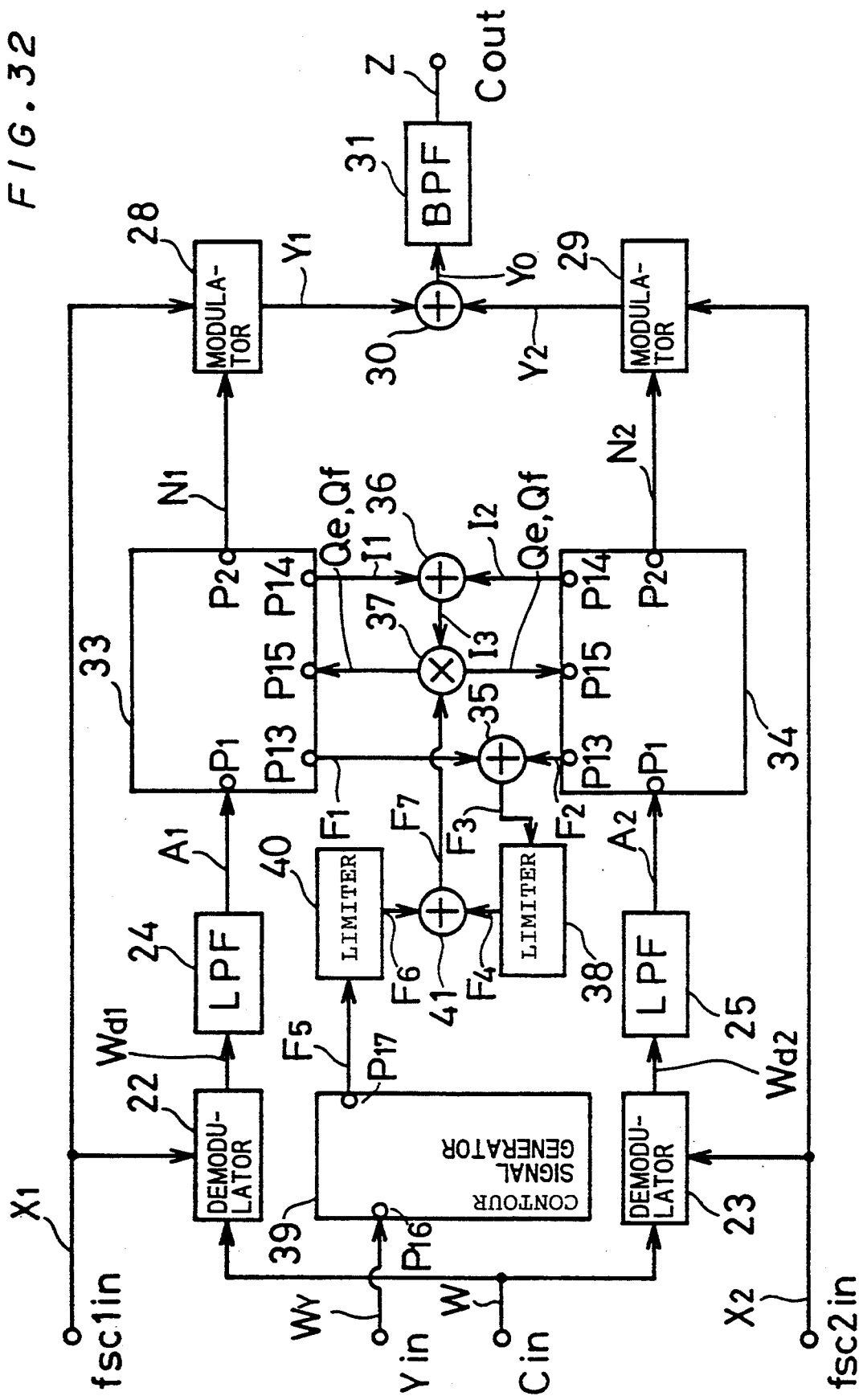
FIG. 32 is a block diagram showing a third application of the present invention.

FIG. 63 corresponds to circuitry shown in FIG. 32. A chrominance signal input terminal $C_{in}$ is connected through an analog-digital converter circuit 48 to a demodulator 49. A low-pass filter 24 and a waveform shaping apparatus 33 are connected in series between the demodulator 49 and a modulator 50. A low-pass filter 25 and a waveform shaping apparatus 34 are also connected in series between the demodulator 49 and the modulator 50. Adders 35, 36 and a multiplier 37 are provided between the waveform shaping apparatuses 33 and 34.

A luminance input terminal $Y_{in}$ is connected through an analog-digital converter circuit 52 to a contour signal generator 39. The contour signal generator 39 and the adder 35 are connected through limiters 38 and 40, respectively, to an adder 41. A digital-analog converter circuit 51 and a band pass filter 31 are connected in series between the modulator 50 and an output terminal $C_{out}$. The analog-digital converter circuits 48 and 52 and the digital-analog converter circuit 51 are controlled in accordance with clock signals input to a clock terminal Clock.

With such a configuration, the waveform shaping appratuses 33 and 34 function similar to the above-mentioned third application, and the similar effect of the present invention can be obtained.

While the invention has been shown and described in detail, the foregoing description is in all aspects illustrative and not restrictive. It is therefore understood that numerous modifications and variations can be devised without departing from the scope of the invention.

We claim:

1. A method of shaping waveform comprising the steps of:
    (a) inputting a signal to be shaped in waveform;
    (b) delaying said signal to be shaped by a first delay time to produce a shaping base signal;
    (c) delaying said shaping base signal by a second delay time to produce a delay base signal;
    (d) processing said signal to be shaped, said shaping base signal, and said delay base signal for producing a pair of control signals which are identical in reference value to each other, and which are symmetrical in relation to said reference value thereof;
    (e) processing said signal to be shaped, said shaping base signal, and said delay base signal for producing a pair of original correction signals which vary for only a period when said shaping base signal varies, which are identical in reference value to each other, and which are symmetrical in relation to said reference value thereof;
    (f) selecting said reference value of said pair of original correction signals or either of said pair of original correction signals in accordance with values of said pair of control signals to produce a quasi-correction signal;
    (g) multiplying said quasi-correction signal by a specified coefficient to produce a correction signal; and
    (h) operating said correction signal along with said shaping base signal to produce an output signal.

2. A method according to claim 1, wherein said first delay time is a half of a period spent from beginning of variation in said signal to be shaped till end of said variation therein.

3. A method according to claim 2, wherein said second delay time is a half of said period spent from beginning of said variation in said signal to be shaped till end of said variation therein.

4. A method according to claim 3, wherein said step (f) includes the steps of:
    (f-1) selecting a first one of said pair of original correction signals when a first one of said pair of control signals is more than a specified threshold value;
    (f-2) selecting a second one of said pair of original correction signals when a second one of said pair of control signals is more than said specified threshold value; and (f-3) selecting said reference value of said pair of original correction signals when neither of said pair of control signals is more than said specified threshold value.

5. A method according to claim 4, wherein said specified threshold value is equal to said reference value of said pair of control signals.

6. A method according to claim 5, wherein said pair of original correction signals have their respective polarities remaining the same despite of a polarity of variation in said shaping base signal.

7. A method according to claim 6, wherein said pair of control signals have their respective polarities depending upon said polarity of said variation in said shaping base signal.

8. A method according to claim 7, wherein said step (e) includes the steps of:
(e-1) finding an absolute value of a difference between said signal to be shaped and said shaping base signal to produce a first differential signal;
(e-2) finding an absolute value of a difference between said shaping base signal and said delay base signal to produce a second differential signal;
(e-3) subtracting said second differential signal from said i first differential signal to find a third differential signal;
(e-4) subtracting said delay base signal from said signal to be shaped to find a fourth differential signal; and
(e-5) finding a difference between absolute values of said third and fourth differential signals to produce said pair of original correction signals.

9. A method according to claim 8, wherein said step (d) includes the step of (d-1) multiplying said third differential signal by said fourth differential signal to produce said pair of control signals.

10. A method according to claim 9, wherein said specified coefficient is $\frac{1}{2}$.

11. A method according to claim 5, wherein said pair of original correction signals have their respective polarities depending upon a polarity of said variation in said shaping base signal.

12. A method according to claim 11, wherein said pair of control signals have their respective polarities remaining the same despite of said polarity of said variation in said shaping base signal.

13. A method according to claim 12, wherein said step (e) includes the steps of:
(e-1) subtracting said shaping base signal from said signal to be shaped to produce a first differential signal;
(e-2) subtracting said delay base signal from said shaping base signal to produce a second differential signal;
(e-3) subtracting said second differential signal from said first differential signal to produce a third differential signal;
(e-4) subtracting said delay base signal from said signal to be shaped to produce a fourth differential signal;
(e-5) subtracting said signal to be shaped from said shaping base signal to produce a fifth differential signal;
(e-6) subtracting said shaping base signal from said delay base signal to produce a sixth differential signal;
(e-7) half-wave rectifying said first and second differential signals to produce seventh and eighth differential signals, respectively;
(e-8) half-wave rectifying said fifth and sixth differential signals to produce ninth and tenth differential signals, respectively;
(e-9) finding smaller one of said seventh and eighth differential signals to produce an eleventh differential signal;
(e-10) finding smaller one of said ninth and tenth differential signals to produce a twelfth differential signal; and
(e-11) finding the difference between said eleventh and twelfth differential signals to produce said pair of original correction signals.

14. A method according to claim 13, wherein said step (d) includes the step of (d-1) multiplying said third differential signal by said fourth differential signal to produce said pair of control signals.

15. A method according to claim 14, wherein said specified coefficient is 1.

16. A waveform shaping apparatus comprising:
an input terminal for receiving a signal to be shaped in waveform;
first delay means for delaying said signal to be shaped by a first delay time to produce a shaping base signal;
second delay means for delaying said shaping base signal by a second delay time to produce a delay base signal;
control signal generating means for processing said signal to be shaped, said shaping base signal, and said delay base signal to produce a pair of control signals which vary for only a period when said shaping base signal varies, which are identical in reference value to each other, and which are symmetrical in relation to said reference value thereof;
original correction signal generating means for processing ,said signal to be shaped, said shaping base signal, and said delay base signal to produce a pair of original correction signals which vary for only a period when said shaping base signal varies, which are identical in reference value to each other, and which are symmetrical in relation to said reference value thereof;
a control circuit for selecting said reference value of said pair of original correction signals or either one of said pair of original correction signals in accordance with values of said pair of control signals to produce a quasi-correction signal;
a coefficient multiplier for multiplying said quasi-correction signal by a specified coefficient to produce a correction signal; and
an adder for adding said correction signal to said shaping base signal to produce an output signal.

17. An apparatus according to claim 16, wherein said first delay time is a half of a period spent from beginning of variation in said signal to be shaped till end of said variation therein.

18. An apparatus according to claim 17, wherein said second delay time is a half of said period spent from beginning of variation in said signal to be shaped till end of said variation therein.

19. An apparatus according to claim 18, wherein said control circuit selects a first one of said pair of original correction signals when a first one of said pair of control signals is more than a specified threshold value, selects a second one of said pair of original correction signals when a second one of said pair of control signals is more than said specified threshold value, and selects said reference value of said pair of original correction signals when neither of said pair of control signals is more than said specified threshold value.

20. An apparatus according to claim 19, wherein said specified threshold value is equal to said reference value of said pair of control signals.

21. An apparatus according to claim 19, wherein said pair of original correction signals have their respective polarities remaining the same despite of a polarity of variation in said shaping base signal.

22. An apparatus according to claim 21, wherein said pair of control signals have their respective polarities depending upon said polarity of said variation in said shaping base signal.

23. An apparatus according to claim 22, wherein each of said original correction signal generating means and said control signal generating means includes first operating means for finding an absolute value of a difference between said signal to be shaped and said shaping base signal to produce a first differential signal,
second operating means for finding an absolute value of a difference between said shaping base signal and said delay base signal to produce a second differential signal,
third operating means for subtracting said second differential signal from said first differential signal to find a third differential signal, and
fourth operating means for subtracting said delay base signal from said signal to be shaped to find a fourth differential signal; and
said original correction signal generating means includes fifth operating means for finding a difference between absolute values of said third and fourth differential signals to produce said pair of original correction signals.

24. An apparatus according to claim 23, wherein said control signal generating means further includes sixth operating means for multiplying said third differential signal by said fourth differential signal to produce said pair of control signals.

25. An apparatus according to claim 24, wherein said original correction signal generating means and said control signal generating means share said first through fourth operating means.

26. An apparatus according to claim 24, wherein said specified coefficient is ½.

27. An apparatus according to claim 20, wherein said pair of original correction signals have their respective polarities depending upon a polarity of variation in said shaping base signal.

28. An apparatus according to claim 27, wherein said pair of control signals have their respective polarities remaining the same despite of said polarity of variation in said shaping base signal.

29. An apparatus according to claim 28, wherein each of said original correction signal generating means and said control signal generating means includes;
first operating means for subtracting said shaping base signal from said signal to be shaped to produce a first differential signal,
second operating means for subtracting said delay base signal from said shaping base signal to produce a second differential signal,
third operating means for subtracting said second differential signal from said first differential signal to produce a third differential signal, and
fourth operating means for subtracting said delay base signal from said signal to be shaped to produce a fourth differential signal; and wherein
in said original correction signal generating means,
said first operating means subtracts said signal to be shaped from said shaping base signal to further produce a fifth differential signal;
said second operating means subtracts said shaping base signal from said delay base signal to further produce a sixth differential signal; and wherein
said original correction signal generating means further includes;
a first half-wave rectifier circuit for half-wave rectifying said first and second differential signals to produce seventh and eighth differential signals,
a second half-wave rectifier circuit for half-wave rectifying said fifth and sixth differential signals to produce ninth and tenth differential signals,
fifth operating means for finding smaller one of said seventh and eighth differential signals to produce an eleventh differential signal,
sixth operating means for finding smaller one of said ninth and tenth differential signals to produce a twelfth differential signal, and
seventh operating means for finding the difference between said eleventh and twelfth differential signals to produce said pair of original correction signals.

30. An apparatus according to claim 29, wherein said control signal generating means further includes eighth operating means for multiplying said third differential signal by said fourth differential signal to produce said pair of control signals.

31. An apparatus according to claim 30, wherein said original correction signal generating means and said control signal generating means share said first through fourth operating means.

32. An apparatus according to claim 30, wherein said specified coefficient is 1.

33. An apparatus for correcting a contour of a carrier chrominance signal comprising:
first and second sub-carrier input terminals for receiving first and second chrominance sub-carriers,
a chrominance signal input terminal for receiving a carrier chrominance signal to be corrected in contour,
first and second demodulators for demodulating said carrier chrominance signal with said first and second chrominance sub-carriers to output first and second demodulated chrominance signals, respectively,
first and second waveform shaping apparatuses connected to said first and second demodulators, respectively,
first and second modulators connected to said first and second waveform shaping apparatuses, respectively, and
synthesizing means for synthesizing outputs from said first and second modulators to produce a correction chrominance signal; wherein
each of said first and second waveform shaping apparatuses includes
first delay means for delaying a signal to be shaped in waveform by a first delay time to produce a shaping base signal, second delay means for delaying said shaping base signal by a second delay time to produce a delay base signal, original correction signal generating means for processing said signal to be shaped, said shaping base signal, and said delay base signal to produce a pair of original correction signals which vary for only a period when said shaping base signal varies, which are identical in reference value to each other, and which are symmetrical in relation to said reference value thereof, a control circuit receiving a pair of control signals which vary for only a period when said shaping base signal varies, which are identical in reference value to each other, and which are symmetrical in relation to said reference value thereof, and selecting said reference value of said pair of original correction signals or either of said pair of original correction signals in accordance with values of said pair of control signals to produce a quasi-correction signal, a coefficient multiplier for multiplying said quasi-correction signal by a specified coefficient, and an adder for adding said correction signal to said shaping base signal to produce an output signal; and wherein in respective said first and second waveform shaping apparatuses, said signal to be shaped corresponds to said first and second demodulated chrominance signals.

34. An apparatus according to claim 33, wherein each of said first and second waveform shaping apparatuses further includes control signal generating means for processing said signal to be shaped, said shaping base signal, and said delay base signal to produce said pair of control signals; and wherein in each of said first and second waveform shaping apparatuses, said control circuit selects a first one of said pair of original correction signals when a first one of said pair of control signals is more than a specified threshold value, selects a second one of said pair of original correction signals when a second one of said pair of control signals is more than said specified threshold value, and selects a reference value of said pair of original correction signals when neither of said pair of control signals is more than said specified threshold value.

35. An apparatus according to claim 34, wherein said specified threshold value is equal to said reference value of said pair of control signals.

36. An apparatus according to claim 33, wherein said first and second waveform shaping apparatuses are connected to said chrominance signal input terminal;

each of said first and second waveform shaping apparatuses further includes a coefficient multiplier control apparatus;

said coefficient multiplier control apparatus detects the degree of saturation of said carrier chrominance signal to apply a saturation degree detection signal to said coefficient multiplier; and said specified coefficient is in negative correlation with said saturation degree detection signal.

37. An apparatus according to claim 36, wherein said coefficient multiplier control apparatus includes:

saturation degree control signal producing means for eliminating a burst signal of said carrier chrominance signal applied to said chrominance signal input terminal to produce a saturation degree control signal; and saturation degree detecting means for detecting the degree of saturation of said saturation degree control signal to output said saturation degree detection signal.

38. An apparatus according to claim 37, wherein said saturation degree detecting means includes:

a power supply for supplying a reference potential;

rectifying means for rectifying said saturation degree control signal; and a comparator for comparing a potential of an output of said rectifying means with said reference potential to output a comparison result, and wherein said comparison result is equivalent to said saturation degree detection signal.

39. An apparatus according to claim 38, wherein said rectifying means includes an integrating circuit.

40. An apparatus according to claim 33, wherein each of said first and second waveform shaping apparatuses further includes original control signal generating means for processing said signal to be shaped, said shaping base signal, said delay base signal to find first and second original control signals;

said apparatus for correcting a contour further includes contour signal generating means receiving a luminance signal for generating a luminance contour signal, first synthesizing means for synthesizing said first original control signals obtained in said first and second waveform shaping apparatuses to find a third original control signal, second synthesizing means for synthesizing said second original control signals obtained in said first and second waveform shaping apparatuses to find a fourth original control signal, third synthesizing means for synthesizing said third original control signal and said luminance contour signal to find a fifth original control signal, and fourth synthesizing means for synthesizing said fourth and fifth original control signals to apply said pair of control signals to both of said control circuits in said first and second waveform shaping apparatuses.

41. An apparatus according to claim 40, wherein said third synthesizing means includes a limiter for limiting values of said third original control signal and said luminance contour signal.

42. An apparatus according to claim 41, wherein said contour signal generating means finds an absolute value of differentiated said luminance signal, further differentiates it, and then delays it by a third delay time to find said luminance contour signal.

43. An apparatus according to claim 41, wherein said contour signal generating means includes third delay means for delaying said luminance signal by a third delay time to produce a first delay signal, and said luminance contour signal has polarities remaining the same despite of a polarity of variation in said first delay signal.

44. An apparatus according to claim 43, wherein said contour signal generating means further includes fourth delay means for delaying said luminance signal by a fourth delay time to produce a second delay signal;

first operating means for finding an absolute value of the difference between said luminance signal and said first delay signal;

second operating means for finding an absolute value of the difference between said first delay signal and said second delay signal; and third operating means for subtracting output of said second operating means from output of said first operating means to find said luminance contour signal.

45. An apparatus according to claim 43, wherein said contour signal generating means further includes first operating means for finding an absolute value of the difference between said luminance signal and said first delay signal, and second operating means for differentiating output of said first operating means and delaying it by a fourth delay time to find said luminance contour signal; and wherein said fourth delay time is arranged so that a variation in said luminance contour signal is caused about the center of variation in said first delay signal.

46. An apparatus according to claim 33, wherein each of said first and second waveform shaping apparatuses further includes original control signal generating means for processing said signal to be shaped, said shaping base signal, and said delay base signal to find first and second original control signals; and wherein said apparatus for correcting a contour further includes first synthesizing means for synthesizing said first original control signals obtained in said first and second waveform shaping apparatuses to find a third original control signal, second synthesizing means for synthesizing said second original control signals obtained in said first and second waveform shaping apparatuses to find a fourth original control signal, and third synthesizing means for synthesizing said third and fourth original control signals to apply said pair of control signals to both of said control circuits in said first and second waveform shaping apparatuses.

47. An apparatus according to claim 46, wherein said pair of original correction signals have their respective polarities depending upon a polarity of variation in said shaping base signal, and said pair of control signals have their respective polarities remaining the same despite of said polarity of said variation in said shaping base signal.

48. An apparatus according to claim 46, wherein each of said original correction signal generating means and said original control signal generating means includes first operating means for finding an absolute value of the difference between said signal to be shaped and said shaping base signal to produce a first differential signal, second operating means for finding an absolute value of the difference between said shaping base signal and said delay base signal to find a second differential signal, third operating means for subtracting said second differential signal from said first differential signal to produce a third differential signal, fourth operating means for subtracting said delay base signal from said signal to be shaped to find a fourth differential signal, and an absolute value circuit for finding an absolute value of said fourth differential signal; and wherein said third differential signal corresponds to said first original control signal;

said absolute value of said fourth differential signal corresponds to said second original control signal; and wherein said original correction signal generating means further includes fifth operating means for finding a pair of fifth differential signals which are the differences between absolute values of said third and fourth differential signals, and a multiplier for multiplying said pair of fifth differential signals by said fourth differential signal to find said original correction signal.

49. An apparatus according to claim 48, wherein said original correction signal generating means and said original control signal generating means share said first through fourth operating means and said absolute value circuit.

50. An apparatus according to claim 49, wherein said specified coefficient is $\frac{1}{2}$.

51. An apparatus according to claim 46, wherein each of said original correction signal generating means and said original control signal generating means includes first operating means for subtracting said shaping base signal from said signal to be shaped to produce a first differential signal, and second operating means for subtracting said delay base signal from said shaping base signal to produce a second differential signal; and wherein said original control signal generating means further includes third operating means for finding an absolute value of the difference between said signal to be shaped and said delay base signal to produce said second original control signal, and fourth operating means for subtracting an absolute value of said second differential signal from an absolute value of said first differential signal to find said first original control signal; and wherein in said original correction signal generating means, said first operating means subtracts said signal to be shaped from said shaping base signal to further produce a third differential signal, and said second operating means subtracts said shaping base signal from said delay base signal to further produce a fourth differential signal; and wherein said original correction signal generating means further includes a first half-wave rectifier circuit for half-wave rectifying said first and second differential signals to produce fifth and sixth differential signals, a second half-wave rectifier circuit for half-wave rectifying said third and fourth differential signals to produce seventh and eighth differential signals, fifth operating means for finding a smaller one of said fifth and sixth differential signals to produce a ninth differential signal, sixth operating means for finding a smaller one of said seventh and eighth differential signals to produce a tenth differential signals, and seventh operating means for finding the difference between said ninth and tenth differential signals to produce said pair of original correction signals.

52. An apparatus according to claim 51, wherein said original correction signal generating means and said original control signal generating means share said first and second operating means.

53. An apparatus according to claim 52, wherein said specified coefficient is 1.

54. An apparatus according to claim 33, further comprising:

first saturation degree control means connected between said chrominance signal input terminal and said first and second demodulators for controlling the degree of saturation of said carrier chrominance signal; and second saturation degree control means for controlling the degree of saturation of said correction chrominance signal.

55. An apparatus according to claim 54, wherein said first and second saturation degree control means amplify inputted signals with first and second amplification degrees, respectively, and said second amplification degree is in predetermined relation with said first amplification degree.

56. An apparatus according to claim 55, wherein said first saturation degree control means includes:

first saturation degree control signal producing means for eliminating a burst signal of said carrier chrominance signal applied to said chrominance signal input terminal to produce a first saturation degree control signal; and first amplitude control means for detecting the degree of saturation of said first saturation degree control signal to control the magnitude of the amplitude of said carrier chrominance signal applied to said chrominance signal input terminal.

57. An apparatus according to claim 56, wherein said first amplitude control means includes:

a power supply for supplying a reference potential;

rectifying means for rectifying said first saturation degree control signal;

a comparator for comparing a potential of an output of said rectifying means with said reference potential to output a comparison result; and a voltage control amplifier controlled by said comparison result, and wherein said first amplification degree is in negative correlation with said comparison result.

58. An apparatus according to claim 57, wherein said rectifying means includes an integrating circuit.

59. An apparatus according to claim 56, wherein said second saturation degree control means includes:

second saturation degree control signal producing means for selecting a burst signal of said correction chrominance signal given as an output of said synthesizing means to produce a second saturation degree control signal; and second amplitude control means for detecting the degree of saturation of said second saturation degree control signal to control the magnitude of the amplitude of said correction chrominance signal given as the output of said synthesizing means, and wherein said second saturation degree control means outputs said correction chrominance signal including a burst signal corresponding to the amplitude of a burst signal of said carrier chrominance signal applied to said chrominance signal input terminal.

60. An apparatus according to claim 59, wherein said second amplitude control means includes:

a power supply for supplying a reference potential;

rectifying means for rectifying said second saturation degree control signal;

a comparator for comparing a potential of an output of said rectifying means with said reference potential to output a comparison result; and a voltage control amplifier controlled by said comparison result, and wherein said second amplification degree is in negative correlation with said comparison result.

61. An apparatus according to claim 60, wherein said comparator includes a capacitor for smoothing the output of said comparator.

62. An apparatus according to claim 55, wherein said first saturation degree control means includes:

first saturation degree control signal producing means for eliminating a burst signal of said carrier chrominance signal applied to said chrominance signal input terminal to produce a first saturation degree control signal;

saturation degree detecting means for detecting the degree of saturation of said first saturation degree control signal to output a saturation degree detection signal; and first amplitude control means controlled by said saturation degree detection signal for controlling the magnitude of the amplitude of said carrier chrominance signal applied to said chrominance signal input terminal, and wherein said second saturation degree control means includes:

second amplitude control means controlled by said saturation degree detection signal for outputting said correction chrominance signal including a burst signal corresponding to the amplitude of a burst signal of said carrier chrominance signal applied to said chrominance signal input terminal.

63. An apparatus according to claim 62, wherein said saturation degree detecting means includes:

a power supply for supplying a reference potential;

rectifying means for rectifying said first saturation degree control signal; and a comparator for comparing a potential of an output of said rectifying means with said reference potential to output a comparison result, wherein said first amplitude control means includes a first voltage control amplifier controlled by said comparison result, and wherein said first amplification degree is in negative correlation with said comparison result.

64. An apparatus according to claim 63, wherein said rectifying means includes an integrating circuit.

65. An apparatus according to claim 64, wherein said second amplitude control means includes a second voltage control amplifier controlled by said comparison result, and said first and second voltage control amplifiers operate complementarily to each other.

66. An apparatus according to claim 65, wherein
said second amplification degree is the reciprocal of said first amplification degree.

67. An apparatus according to claim 66,
wherein said first voltage control amplifier includes:
a first voltage-to-current converter for converting an inputted voltage into a current;
a first separator for separating the output of said first voltage-to-current converter into two in accordance with said comparison result to provide a pair of first separated currents; and
a first current-to-voltage converter for converting one of said first separated currents into a voltage to output said voltage, and
wherein said second voltage control amplifier includes:
a second voltage-to-current converter for converting an inputted voltage into a current;
a second separator for separating the output of said second voltage-to-current converter into two in accordance with said comparison result to provide a pair of second separated currents; and
a second current-to-voltage converter for converting one of said second separated currents into a voltage to output said voltage.

68. An apparatus according to claim 67, wherein
said comparison result includes first and second comparison potentials;
said first comparison potential controls said one first separated current and the other second separated current; and
said second comparison potential controls said one second separated current and the other first separated current.

69. An apparatus according to claim 68, wherein
said first voltage-to-current converter includes a first resistance for determining a ratio of conversion to be performed therein;
said second voltage-to-current converter includes a second resistance for determining a ratio of conversion to be performed therein;
said first current-to-voltage converter includes a third resistance for determining a ratio of conversion to be performed therein;
said second current-to-voltage converter includes a fourth resistance for determining a ratio of conversion to be performed therein;
said first amplification degree is determined by the ratio of said first resistance to said third resistance; and
said second amplification degree is determined by the ratio of said second resistance to said fourth resistance.

70. An apparatus for correcting a contour of a carrier chrominance signal comprising:
first and second sub-carrier input terminals for receiving first and second chrominance sub-carriers, respectively,
chrominance signal input terminal for receiving a carrier chrominance signal to be corrected in contour,
first delay means for delaying said carrier chrominance signal by a first delay time to produce a delay chrominance signal,
first and second demodulators for demodulating said carrier chrominance signal with said first and second chrominance sub-carriers to output first and second demodulated chrominance signals, respectively,
first and second contour correction extractors connected to said first and second demodulators, respectively, for outputting first and second chrominance contour correction signals, respectively,
a first modulator utilizing said first chrominance sub-carrier for modulating said first chrominance contour correction signal,
a second modulator utilizing said second chrominance sub-carrier for modulating said second chrominance contour correction signal; and
synthesizing means having a first synthesizing unit for synthesizing outputs from said first and second modulators and a second synthesizing unit for synthesizing output from said first synthesizing unit and said delay chrominance signal to output a correction chrominance signal; and wherein
each of said first and second contour correction extractors includes
second delay means for delaying a signal to be shaped in waveform by a second delay time to produce a shaping base signal,
third delay means for delaying said shaping base signal by a third delay time to produce a delay base signal,
control signal generating means for processing said signal to be shaped, said shaping base signal, and said delay base signal to produce a pair of control signals which vary for only a period when said shaping base signal varies, which are identical in reference value to each other, and which are symmetrical in relation to said reference value thereof,
original correction signal generating means for processing said signal to be shaped, said shaping base signal, and said delay base signal to produce a pair of original correction signals which vary for only said period when said shaping base signal varies, which are identical in reference value to each other, and which are symmetrical in relation to said reference value thereof,
a control circuit receiving said pair of control signals for selecting said reference value of said pair of original correction signals or either of said pair of original correction signals in accordance with values of said pair of control signals to produce a quasi-correction signal, and
a coefficient multiplier for multiplying said quasi-correction signal by a specified coefficient to produce a correction signal; and wherein
said signal to be shaped corresponds to said first and second demodulated chrominance signals in each of said first and second contour correction extractors;
said correction signal corresponds to said first and second chrominance contour correction signals in each of said first and second contour correction extractors; and
said first delay time is equal to a time required for a procedure from input of said carrier chrominance signal to said first and second demodulators till production of output from said first synthesizing unit.

71. An apparatus according to claim 70, wherein said synthesizing means further includes a cleaning circuit interposing between said first and second synthesizing units.

72. An apparatus according to claim 70, wherein said synthesizing means includes a switch for switching between output of said first synthesizing unit and specified direct current voltage in accordance with a specified signal identical in width to a signal component of the output of said first synthesizing unit to apply an output of said switch to said second synthesizing unit.

73. An apparatus according to claim 70, wherein said first and second modulators receive said first and second chrominance sub-carriers through first and second variable phase shifters which cooperate with each other keeping an amount of phase shift identical to each other.

74. An apparatus according to claim 70, further comprising a 90 deg. phase shifter which inputs said first chrominance sub-carrier and outputs said second chrominance sub-carrier.

75. An apparatus according to claim 74, wherein
said first demodulator further receives an inversion signal of said first chrominance sub-carrier,
said second demodulator further receives an inversion signal of said second chrominance sub-carrier, and
said first and second contour correction extractors are variable in DC bias.

76. An apparatus according to claim 75, wherein said second delay time is a half of a period spent from beginning of variation in said signal to be shaped till end of said variation.

77. An apparatus according to claim 76, wherein said third delay time is a half of a period spent from beginning of variation in said signal to be shaped till end of said variation.

78. An apparatus according to claim 77, wherein
each of said first and second waveform shaping appratuses further includes control signal generating means for processing said signal to be shaped, said shaping base signal, and said delay base signal to produce said pair of control signals; and wherein
in each of said first and second waveform shaping appratuses, said control circuit selects a first one of said pair of original correction signals when a first one of said pair of control signals is more than a specified threshold value, selects a second one of said pair of original correction signals when a second one of said pair of control signals is more than said specified threshold value, and selects said reference value of said pair of original correction signals when neither of said control signals is more than said specified threshold value.

79. An apparatus according to claim 78, wherein said specified threshold value is equal to said reference value of said pair of control signals.

80. An apparatus according to claim 79, wherein said pair of original correction signals have their respective polarities depending upon a polarity of variation in said shaping base signal.

81. An apparatus according to claim 80, wherein said pair of control signals have their respective polarities remaining the same despite of said polarity of said variation in said shaping base signal.

82. An apparatus according to claim 81, wherein
each of said original correction signal generating means and said control signal generating means includes
first operating means for subtracting said shaping base signal from said signal to be shaped to produce a first differential signal,
second operating means for subtracting said delay base signal from said shaping base signal to produce a second differential signal,
third operating means for subtracting said second differential signal from said first differential signal to find a third differential signal, and
fourth operating means for subtracting said delay base signal from said signal to be shaped to find a fourth differential signal; and wherein
in said original correction signal generating means,
said first operating means subtracts said signal to be shaped from said shaping base signal to further produce a fifth differential signal, and
said second operating means subtracts said shaping base signal from said delay base signal to further produce a sixth differential signal; and wherein
said original correction signal generating means further includes
a first half-wave rectifier circuit for half-wave rectifying said first and second differential signals to produce seventh and eighth differential signals,
a second half-wave rectifier circuit for half-wave rectifying said fifth and sixth differential signals to produce ninth and tenth differential signals,
fifth operating means for finding a smaller one of said seventh and eighth differential signals to produce an eleventh differential signal,
sixth operating means for dinding a smaller one of said ninth and tenth differential signals to produce a twelfth differential signal, and
seventh operating means for finding the difference between said eleventh and twelfth differential signals to produce said pair of original correction signals.

83. An apparatus according to claim 82, wherein said control signal generating means further includes eighth operating means for multiplying said third differential signal by said fourth differential signal to produce said pair of control signals.

84. An apparatus according to claim 83, wherein said original correction signal generating means and said control signal generating means shape said first through fourth operating means.

85. An apparatus according to claim 79, wherein said pair of original correction signals have their respective polarities remaining the same despite of a polarity of variation in said shaping base signal.

86. An apparatus according to claim 85, wherein said pair of control signals have their respective polarities depending upon said polarity of said variation in said shaping base signal.

87. An apparatus according to claim 86, wherein
each of said original correction signal generating means and said control signal generating means includes
first operating means for finding an absolute value of the difference between said signal to be shaped and said shaping base signal to produce a fist differential signal,
second operating means for finding an absolute value of the difference between said shaping base signal and said delay base signal to produce a second differential signal,
third operating means for subtracting said second differential signal from said first differential signal to find a third differential signal, and fourth operating means for subtracting said delay base signal from said signal to be shaped to find a fourth differential signal; and wherein said original correction signal generating means further includes fifth operating means for finding the difference between absolute values of said third and fourth differential signals to produce said pair of original correction signals.

88. An apparatus according to claim 87, wherein said control signal generating means further comprises sixth operating means for multiplying said third differential signal by said fourth differential signal to produce said pair of control signals.

89. An apparatus according to claim 88, wherein said original correction signal generating means and said control signal generating means share said first through fourth operating means.

90. An apparatus according to claim 89, wherein said synthesizing means further includes a switch controlled in accordance with an absolute value of said fourth differential signal to apply one of output of said first synthesizing unit and specified direct current voltage to said second synthesizing unit.

* * * * *